(12) United States Patent
Tsubaki et al.

(10) Patent No.: US 11,640,113 B2
(45) Date of Patent: May 2, 2023

(54) ACTINIC RAY-SENSITIVE OR RADIATION-SENSITIVE RESIN COMPOSITION, PATTERN FORMING METHOD, AND METHOD OF MANUFACTURING ELECTRONIC DEVICE

(71) Applicant: FUJIFILM Corporation, Tokyo (JP)

(72) Inventors: Hideaki Tsubaki, Shizuoka (JP); Hajime Furutani, Shizuoka (JP); Akihiro Kaneko, Shizuoka (JP); Wataru Nihashi, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 252 days.

(21) Appl. No.: 16/368,522

(22) Filed: Mar. 28, 2019

(65) Prior Publication Data
US 2019/0219921 A1    Jul. 18, 2019

Related U.S. Application Data

(63) Continuation of application No. PCT/JP2017/033951, filed on Sep. 20, 2017.

(30) Foreign Application Priority Data

Sep. 29, 2016   (JP) .............................. JP2016-191775

(51) Int. Cl.
| | |
|---|---|
| *G03F 7/039* | (2006.01) |
| *G03F 7/38* | (2006.01) |
| *G03F 7/038* | (2006.01) |
| *C08F 220/18* | (2006.01) |
| *G03F 7/16* | (2006.01) |
| *G03F 7/20* | (2006.01) |
| *G03F 7/32* | (2006.01) |
| *H01L 21/027* | (2006.01) |

(52) U.S. Cl.
CPC ...... *G03F 7/0397* (2013.01); *C08F 220/1806* (2020.02); *G03F 7/038* (2013.01); *G03F 7/039* (2013.01); *G03F 7/0382* (2013.01); *G03F 7/0392* (2013.01); *G03F 7/16* (2013.01); *G03F 7/168* (2013.01); *G03F 7/2004* (2013.01); *G03F 7/325* (2013.01); *G03F 7/327* (2013.01); *G03F 7/38* (2013.01); *H01L 21/0274* (2013.01)

(58) Field of Classification Search
CPC .............................. G03F 7/0397; G03F 7/0392
See application file for complete search history.

(56) References Cited

U.S. PATENT DOCUMENTS

| | | | | |
|---|---|---|---|---|
| 6,475,706 B1 * | 11/2002 | Kishimura | ............ | G03F 7/0382 430/270.1 |
| 2005/0095527 A1 * | 5/2005 | Yokoyama | ............ | G03F 7/0392 430/270.1 |
| 2011/0300485 A1 | 12/2011 | Tsubaki et al. | | |
| 2013/0045445 A1 * | 2/2013 | Takahashi | ............. | G03F 7/0045 430/286.1 |
| 2013/0084438 A1 | 4/2013 | Iwato et al. | | |
| 2014/0030643 A1 * | 1/2014 | Takahashi | ............. | G03F 7/0045 430/296 |
| 2015/0132688 A1 * | 5/2015 | Yokokawa | .............. | C08F 20/28 430/18 |
| 2015/0185610 A1 | 7/2015 | Hirano et al. | | |
| 2018/0267404 A1 | 9/2018 | Kaneko et al. | | |
| 2019/0187558 A1 * | 6/2019 | Nihashi | ................. | G03F 7/0397 |

FOREIGN PATENT DOCUMENTS

| | | |
|---|---|---|
| EP | 2 746 853 A2 | 6/2014 |
| JP | 08-337616 A | 12/1996 |
| JP | 2000-267280 A | 9/2000 |
| JP | 2005-275282 A | 10/2005 |

(Continued)

OTHER PUBLICATIONS

Office Action dated Dec. 3, 2019 from the Japanese Patent Office in corresponding Japanese application No. 2018-542467.
Office Action dated Dec. 15, 2020, from the Taiwanese Patent Office in Taiwanese Application No. 106133431.
Office Action dated Sep. 25, 2020, from the Korean Intellectual Property Office in Korean application No. 10-2019-7011481.

(Continued)

*Primary Examiner* — John S Chu
(74) *Attorney, Agent, or Firm* — Sughrue Mion, PLLC

(57) ABSTRACT

Provided is an actinic ray-sensitive or radiation-sensitive resin composition including: (A) a resin including a repeating unit (a) represented by Formula (1); (B) a compound that generates an acid by irradiation with actinic rays or radiation; and (C) an organic solvent. A concentration of solid contents of the actinic ray-sensitive or radiation-sensitive resin composition is 4 mass % or less. (in the formula, $R_{11}$ and $R_{12}$ each independently represent a hydrogen atom, a halogen atom, or a monovalent organic group. $R_{13}$ represents a hydrogen atom, a halogen atom, or a monovalent organic group or is a single bond or an alkylene group, and is bonded to L or Ar in the formula to form a ring. L represents a single bond or a divalent linking group. Ar represents an aromatic ring group. n represents an integer of 2 or more.)

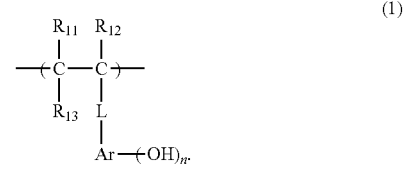

(1)

11 Claims, No Drawings

(56) References Cited

FOREIGN PATENT DOCUMENTS

| JP | 2014-041326 A | 3/2014 |
|---|---|---|
| KR | 10-2015-0028327 A | 3/2015 |
| TW | 201504757 A | 2/2015 |
| WO | 2013/047092 A1 | 4/2013 |
| WO | 2016/136481 A1 | 9/2016 |
| WO | 2017/115629 A1 | 7/2017 |

OTHER PUBLICATIONS

Extended European Search Report (EESR) dated Aug. 2, 2019 from European Patent Office in counterpart EP Application No. 17855899.5.
International Search Report dated Dec. 12, 2017, issued by the International Searching Authority in application No. PCT/JP2017/033951.
Written Opinion dated Dec. 12, 2017, issued by the International Searching Authority in application No. PCT/JP2017/033951.
International Preliminary Report on Patentability (with translation of the Written Opinion) dated Apr. 2, 2019, issued by the International Bureau in application No. PCT/JP2017/033951.
Office Action dated Apr. 8, 2021, issued by the Taiwanese Patent Office in Taiwanese application No. 106133431.

\* cited by examiner

ACTINIC RAY-SENSITIVE OR RADIATION-SENSITIVE RESIN COMPOSITION, PATTERN FORMING METHOD, AND METHOD OF MANUFACTURING ELECTRONIC DEVICE

CROSS-REFERENCE TO RELATED APPLICATIONS

This application is a Continuation Application of PCT Application No. PCT/JP2017/033951, filed Sep. 20, 2017, and based upon and claiming the benefit of priority from Japanese Patent Application No. 2016-191775, filed Sep. 29, 2016, the entire contents of which are incorporated herein by reference.

BACKGROUND OF THE INVENTION

1. Field of the Invention

The present invention relates to an actinic ray-sensitive or radiation-sensitive resin composition, a pattern forming method, and a method of manufacturing an electronic device.

More specifically, the present invention relates to an actinic ray-sensitive or radiation-sensitive resin composition used in a step of manufacturing a semiconductor such as an IC, the manufacturing of a circuit substrate such as a liquid crystal and a thermal head, and a lithographic step of other photofabrication, a pattern forming method, and a method of manufacturing an electronic device including the pattern forming method.

2. Description of the Related Art

In the related art, microfabrication by lithography using a resist composition has been performed in the process of manufacturing a semiconductor device such as an integrated circuit (IC) and a large scale integrated circuit (LSI). In recent years, according to the high integration of integrated circuits, formation of ultrafine patterns in a submicron region and a quarter micron region has been required. Along with this, there is a tendency in that an exposure wavelength also becomes shorter from g rays to i rays further to excimer laser light such as KrF (for example, see JP1996-337616A (JP-H08-337616A) and JP2000-267280A). These days, lithography using electron beams, X-rays, or extreme ultra violet (EUV) light in addition to the excimer laser light is also being developed (for example, see JP2005-275282A).

Functions of various kinds of electronic devices have advanced, and accordingly, further improvement in characteristics of resist patterns used for microfabrication is required. Under such circumstances, in addition to high sensitivity and high resolution, it is also required to provide patterns having excellent in-plane uniformity (CDU) of the pattern line width, excellent in-plane uniformity of the film thickness, and also excellent line width roughness (LWR) performances.

However, it is difficult to provide a pattern satisfying all the sensitivity, the resolution, the in-plane uniformity (CDU) of the pattern line width, the in-plane uniformity of the film thickness, and the roughness characteristic to the levels required at the recent times.

SUMMARY OF THE INVENTION

An object of the present invention is to provide an actinic ray-sensitive or radiation-sensitive resin composition and a pattern forming method in which a pattern having the excellent sensitivity, the excellent resolution, the excellent in-plane uniformity (CDU) of the pattern line width, the excellent in-plane uniformity of the film thickness, and the excellent roughness characteristics can be provided at a high level. Another object of the present invention is to provide a method of manufacturing an electronic device including the pattern forming method.

The present inventors have diligently conducted research on the above objects to find that the above objects can be achieved by using a resin (hereinafter, referred to as the resin (A)) including a specific repeating unit (a) having two or more phenolic hydroxyl groups as a base resin and adjusting a concentration of solid contents in the actinic ray-sensitive or radiation-sensitive resin composition that contains the resin (A) to a specific low concentration.

According to an aspect, the present invention is as follows.

[1] An actinic ray-sensitive or radiation-sensitive resin composition comprising: (A) a resin including a repeating unit (a) represented by Formula (1); (B) a compound that generates an acid by irradiation with actinic rays or radiation; and (C) an organic solvent, in which a concentration of solid contents of the composition is 4 mass % or less,

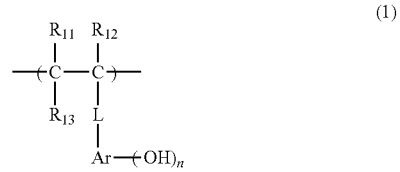

in Formula (1), $R_{11}$ and $R_{12}$ each independently represent a hydrogen atom, a halogen atom, or a monovalent organic group, $R_{13}$ represents a hydrogen atom, a halogen atom, or a monovalent organic group or is a single bond or an alkylene group, and is bonded to L or Ar in the formula to form a ring, L represents a single bond or a divalent linking group, Ar represents an aromatic ring group, and n represents an integer of 2 or more.

[2] The actinic ray-sensitive or radiation-sensitive resin composition according to [1], in which the resin (A) further includes a repeating unit (b) having an acid-decomposable group in which a protective group leaves due to an action of an acid to generate a polar group, and the protective group only includes carbon atoms and hydrogen atoms, and the number of carbon atoms is 5 to 12.

[3] The actinic ray-sensitive or radiation-sensitive resin composition according to [2], in which the repeating unit (b) is a repeating unit represented by Formula (A1),

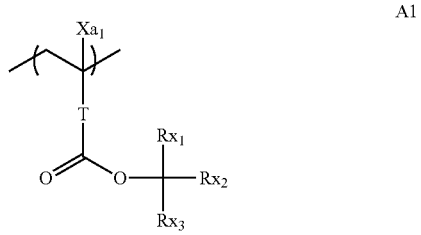

in Formula (A1), $Xa_1$ represents a hydrogen atom or an alkyl group,

T represents a single bond or a divalent linking group, $Rx_1$, $Rx_2$, and $Rx_3$ each independently represent an alkyl group, a cycloalkyl group, or a phenyl group, two of $Rx_1$, $Rx_2$, and $Rx_3$ may be bonded to each other to form a cycloalkyl group, and $Rx_1$, $Rx_2$, and $Rx_3$ each only include carbon atoms and hydrogen atoms, and a total number of carbon atoms included in $Rx_1$, $Rx_2$, and $Rx_3$ is 4 to 11.

[4] The actinic ray-sensitive or radiation-sensitive resin composition according to [2] or [3], in which the resin (A) further includes any one of a repeating unit (c) represented by Formula (A2) or a repeating unit (d) represented by Formula (A3),

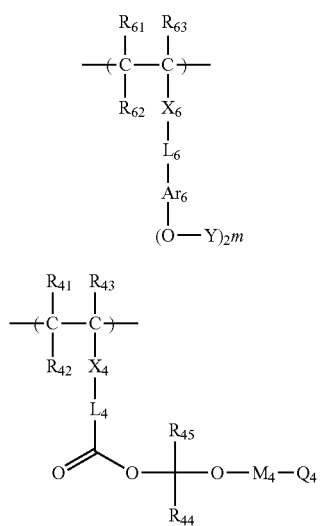

in Formula (A2), $R_{61}$, $R_{62}$, and $R_{63}$ each independently represent a hydrogen atom, an alkyl group, a cycloalkyl group, a halogen atom, a cyano group, or an alkoxycarbonyl group, here, $R_{62}$ may be bonded to $Ar_6$ or $L_6$ to form a ring, and $R_{62}$ in this case represents a single bond or an alkylene group, $X_6$ represents a single bond, —COO—, or —$CONR_{64}$—, and $R_{64}$ represents a hydrogen atom or an alkyl group, $L_6$ represents a single bond or a divalent linking group, and in a case of forming a ring with $R_{62}$, $L_6$ represents a trivalent linking group, $Ar_6$ represents a (m+1)-valent aromatic ring group, and in a case where $Ar_6$ is bonded to $R_{62}$ to form a ring, $Ar_6$ represents a (m+2)-valent aromatic ring group, $Y_2$ represents a hydrogen atom or a group that leaves by an action of an acid, and in a case where m≥2, a plurality of $Y_2$'s may be identical to or different from each other, here, at least one of $Y_2$'s represents a group that leaves due to an action of an acid, and m represents an integer of 1 to 4, in Formula (A3), $R_{41}$, $R_{42}$, and $R_{43}$ each independently represent a hydrogen atom, an alkyl group, a cycloalkyl group, a halogen atom, a cyano group, or an alkoxycarbonyl group, $R_{42}$ may be bonded to $L_4$ to form a ring, and $R_{42}$ in this case represents an alkylene group, $X_4$ represents a single bond, —COO—, or —$CONR_{44}$—, and $R_{44}$ represents a hydrogen atom or an alkyl group, $L_4$ represents a single bond or a divalent linking group, and in a case of forming a ring with $R_{42}$, $L_4$ represents a trivalent linking group, $R_{44}$ and $R_{45}$ represent a hydrogen atom, an alkyl group, a cycloalkyl group, an aryl group, an aralkyl group, an alkoxy group, an acyl group, or a heterocyclic group, $M_4$ represents a single bond or a divalent linking group, $Q_4$ represents an alkyl group, a cycloalkyl group, an aryl group, or a heterocyclic group, and at least two of $Q_4$, $M_4$, or $R_{44}$ may be bonded to each other to form a ring.

[5] The actinic ray-sensitive or radiation-sensitive resin composition according to any one of [1] to [4], in which the resin (A) further contains a repeating unit (e) having a lactone structure.

[6] The actinic ray-sensitive or radiation-sensitive resin composition according to [5], in which a repeating unit having a lactone structure represented by Formula (AII) is contained as the repeating unit (e),

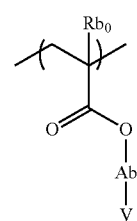

in Formula (AII), $Rb_0$ represents a hydrogen atom, a halogen atom, or an alkyl group having 1 to 4 carbon atoms, Ab represents a single bond, an alkylene group, a divalent linking group having a monocyclic or polycyclic alicyclic hydrocarbon structure, an ether bond, an ester bond, a carbonyl group, a carboxyl group, or a divalent group obtained by combining these, and V represents a group represented by any one of Formulae (LC1-1) to (LC1-17),

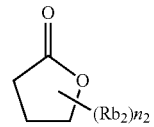

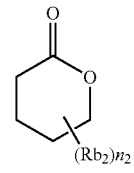

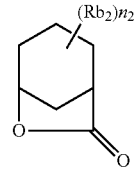

-continued

LC1-4 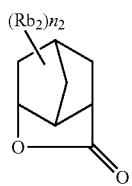

LC1-5 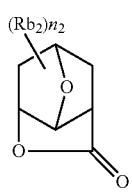

LC1-6 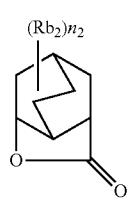

LC1-7 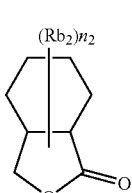

LC1-8 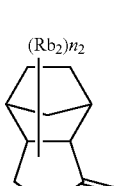

LC1-9 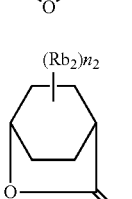

LC1-10 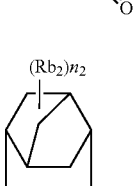

LC1-11 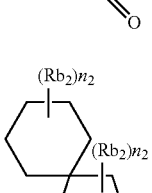

-continued

LC1-12 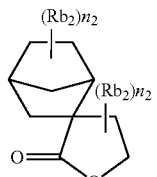

LC1-13 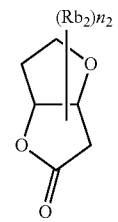

LC1-14 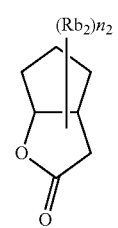

LC1-15 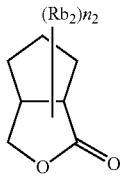

LC1-16 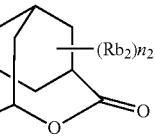

LC1-17 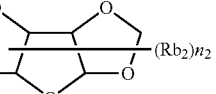

in Formulae (LC1-1) to (LC1-17), $Rb_2$ represents an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, or an acid-decomposable group, $n_2$ represents an integer of 0 to 4, and in a case where $n_2$ is 2 or more, a plurality of $Rb_2$'s may be identical to or different from each other, and the plurality of $Rb_2$'s which are present may be bonded to each other to form a ring.

[7] The actinic ray-sensitive or radiation-sensitive resin composition according to any one of [1] to [6], in which the concentration of solid contents is 0.3 mass % or more.

[8] A pattern forming method comprising: forming actinic ray-sensitive or radiation-sensitive film including the actinic ray-sensitive or radiation-sensitive resin composition according to any one of [1] to [7];

exposing the actinic ray-sensitive or radiation-sensitive film; and developing the actinic ray-sensitive or radiation-sensitive film after exposure.

[9] The pattern forming method according to [8], in which a film thickness of the actinic ray-sensitive or radiation-sensitive film before exposure is 5 to 80 nm.

[10] A method of manufacturing an electronic device comprising: the pattern forming method according to [8] or [9].

According to the present invention, it is possible to provide an actinic ray-sensitive or radiation-sensitive resin composition and a pattern forming method in which a pattern having all the excellent sensitivity, the excellent resolution, the excellent in-plane uniformity (CDU) of the pattern line width, the excellent in-plane uniformity of the film thickness, and the excellent roughness characteristics can be formed at a high level. According to the present invention, it is possible to provide a method of manufacturing an electronic device including the pattern forming method.

DESCRIPTION OF THE PREFERRED EMBODIMENTS

Hereinafter, an example of an aspect for implementing the present invention is described.

With respect to an expression of a group and an atomic group in the present specification, in a case where substitution or non-substitution is not indicated, both of a group not having a substituent and a group having a substituent are included. For example, an "alkyl group" that does not indicate substitution or non-substitution includes not only an alkyl group (unsubstituted alkyl group) not having a substituent but also an alkyl group (substituted alkyl group) having a substituent.

An "actinic ray" or a "radiation" in the present invention, for example, means a bright line spectrum of a mercury lamp, or a far ultraviolet ray represented by an excimer laser, extreme ultraviolet (EUV ray), an X-ray, a particle beam such as an electron beam and an ion beam. In the present invention, the "light" means actinic rays or radiation.

Unless described otherwise, the "exposure" in the present specification includes not only exposure to a bright line spectrum of a mercury lamp, a far ultraviolet ray represented by an excimer laser, an X-ray, and extreme ultraviolet (EUV ray) but also drawing by a particle beam such as an electron beam and an ion beam.

In the present specification, "(meth)acrylate" means "at least one of acrylate or methacrylate". "(Meth)acrylic acid" means "at least one of acrylic acid or methacrylic acid".

In the present specification, the numerical range expressed by using "to" means a range including numerical values described before and after "to" as a lower limit and an upper limit.

In the present specification, a weight-average molecular weight of a resin is a value in terms of polystyrene measured by a gel permeation chromatography (GPC) method. The GPC corresponds to a method in which HLC-8120 (manufactured by Tosoh Corporation) is used, TSK gel Multipore HXL-M (manufactured by Tosoh Corporation, 7.8 mm ID×30.0 cm) is used as a column, and tetrahydrofuran (THF) is used as an eluent.

[Actinic Ray-Sensitive or Radiation-Sensitive Resin Composition]

The actinic ray-sensitive or radiation-sensitive resin composition according to the embodiment of the present invention is typically a resist composition and is preferably a chemically amplified resist composition.

The actinic ray-sensitive or radiation-sensitive resin composition is preferably an actinic ray-sensitive or radiation-sensitive resin composition for organic solvent development using a developer including an organic solvent and/or for alkali development using an alkali developer. Here, the organic solvent development means at least an application to be provided in a step of development using a developer including an organic solvent. The alkali development means at least an application to be provided in a step of development using an alkali developer.

The actinic ray-sensitive or radiation-sensitive resin composition according to the embodiment of the present invention may be a positive resist composition or may be a negative resist composition.

The actinic rays or radiation applied to the actinic ray-sensitive or radiation-sensitive resin composition is not particularly limited, and for example, KrF excimer laser, ArF excimer laser, extreme ultraviolet (EUV), and electron beams (EB) or the like can be used, but an application for electron beam or extreme ultraviolet exposure is preferable.

Hereinafter, respective essential components and optional components contained in the actinic ray-sensitive or radiation-sensitive resin composition are described.

<Resin (A)>

A resin (A) includes a repeating unit (a) represented by Formula (1). The repeating unit (a) represented by Formula (1) is a repeating unit having two or more phenolic hydroxyl groups, and it is understood that, in a case where the concentration of solid contents in an actinic ray-sensitive or radiation-sensitive resin composition containing the resin (A) including the repeating unit (a) as a base resin is set to 4 mass % or less, the high-sensitivity and the high resolution are satisfied, all of the CDU, the in-plane uniformity of the film thickness, and the LWR performance can be satisfactory at a high level. The reason is not necessarily clear, but it is assumed as follows.

That is, in a case where the resin (A) includes the repeating unit (a) having two or more phenolic hydroxyl groups, the number of polar groups per unit having polarity, that is, interaction points with other molecules increase. As a result, aggregation and surface unevenness of a photoacid generator (B) described below, which is considered to be a major factor causing unevenness of CDU in the resist pattern, the in-plane uniformity of the film thickness, LWR performances, and the like, are improved. That is, according to the interaction between the resin (A) and the photoacid generator (B), the aggregation between the photoacid generators (B) is suppressed. Here, by causing the concentration of solid contents in the actinic ray-sensitive or radiation-sensitive resin composition to be 4 mass % or less, the effect of improving the CDU, the in-plane uniformity of the film thickness, and the LWR performance by the aggregation suppression is prominently increased. That is, by causing the total concentration of solid contents to be 4 mass % or less, in addition to the aggregation suppression of the photoacid generator (B) is further improved, and the aggregation between the resins (A) containing the repeating unit (a) having two or more phenolic hydroxyl groups can be suppressed, and the in-plane uniformity of the CDU and the film thickness is remarkably improved.

According to the embodiment of the present invention, the total concentration of solid contents in the actinic ray-sensitive or radiation-sensitive resin composition is 4 mass % or less, preferably 3.0 mass % or less, and more preferably 2.5 mass % or less. For example, in view of obtaining a predetermined film thickness, the concentration of solid contents of the actinic ray-sensitive or radiation-sensitive resin composition is preferably 0.3 mass % or more.

—Repeating Unit (a)—

The repeating unit (a) is a repeating unit having two or more phenolic hydroxyl groups represented by Formula (1).

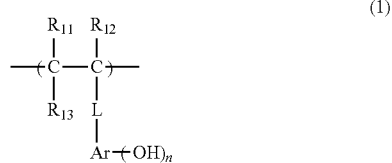

In Formula (1), $R_{11}$ and $R_{12}$ each independently represent a hydrogen atom, a halogen atom, or a monovalent organic group.

$R_{13}$ represents a hydrogen atom, a halogen atom, or a monovalent organic group or is a single bond or an alkylene group, and is bonded to L or Ar in the formula to form a ring.

L represents a single bond or a divalent linking group.

Ar represents an aromatic ring group.

n represents an integer of 2 or more.

In Formula (1), examples of the halogen atom represented by $R_{11}$, $R_{12}$, and $R_{13}$ include a fluorine atom, a chlorine atom, a bromine atom, and an iodine atom, and a fluorine atom is particularly preferable.

Examples of the monovalent organic groups represented by $R_{11}$, $R_{12}$, and $R_{13}$ each include an alkyl group, a cycloalkyl group, an alkoxycarbonyl group, or a cyano group.

The alkyl group represented by $R_{11}$, $R_{12}$, and $R_{13}$ is preferably an alkyl group having 20 or less carbon atoms which may have a substituent such as a methyl group, an ethyl group, a propyl group, an isopropyl group, an n-butyl group, a sec-butyl group, a hexyl group, a 2-ethylhexyl group, an octyl group, and a dodecyl group. In one aspect, the alkyl group represented by $R_{11}$, $R_{12}$, and $R_{13}$ is preferably an alkyl group having 8 or less carbon atoms and more preferably an alkyl group having 3 or less carbon atoms.

The cycloalkyl group as $R_{11}$, $R_{12}$, and $R_{13}$ may have a monocyclic shape or a polycyclic shape. Preferable examples thereof include a monocyclic cycloalkyl group having 3 to 8 carbon atoms such as a cyclopropyl group, a cyclopentyl group, and a cyclohexyl group which may have a substituent.

The alkyl group included in the alkoxycarbonyl group of $R_{11}$, $R_{12}$, and $R_{13}$ is preferably the same as those in the alkyl group in $R_{11}$, $R_{12}$, and $R_{13}$.

Each of the groups represented by $R_{11}$, $R_{12}$, and $R_{13}$ may have a substituent. Examples of the preferable substituent include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and it is preferable that the number of carbon atoms of the substituent is 8 or less.

Examples of the alkyl group having a substituent include a halogenated alkyl group, and among them, a fluorinated alkyl group (for example, $CF_3$) is preferable.

The divalent linking group represented by L includes, for example, an ester bond, —$CONR_{64}$— ($R_{64}$ represents a hydrogen atom or an alkyl group)-, an alkylene group, or a combination of two or more selected from any of these.

The alkyl group of $R_{64}$ in —$CONR_{64}$— ($R_{64}$ represents a hydrogen atom or an alkyl group) is preferably an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group which may have a substituent and more preferably an alkyl group having 8 or less carbon atoms. In one aspect, —$CONR_{64}$— is preferably —CONH—.

Examples of the alkylene group represented by L include an alkylene group having 1 to 8 carbon atoms such as a methylene group, an ethylene group, a propylene group, a butylene group, a hexylene group, and an octylene group. The alkylene group may have a substituent.

In one aspect of the present invention, L is preferably a single bond, an ester bond, or —CONH—, more preferably a single bond or an ester bond, and particularly preferably a single bond.

Examples of the aromatic ring group represented by Ar include an aromatic hydrocarbon ring having 6 to 18 carbon atoms such as a benzene ring, a naphthalene ring, an anthracene ring, a fluorene ring, and a phenanthrene ring and an aromatic heterocyclic ring including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring and a naphthalene ring are preferable in view of resolution, and a benzene ring is most preferable.

These aromatic rings may have a substituent. Examples of the preferable substituent include specific examples of the alkyl group represented by $R_{11}$, $R_{12}$, and $R_{13}$; an alkoxy group such as a methoxy group, an ethoxy group, a hydroxyethoxy group, a propoxy group, a hydroxypropoxy group, and a butoxy group; and an aryl group such as a phenyl group.

n represents an integer of 2 or more, preferably represents an integer of 2 to 5, and more preferably represents 2 or 3.

Specific examples of the repeating unit (a) are provided below, but the present invention is not limited to these. In the formula, R represents a hydrogen atom or a methyl group, and a represents 2 or 3.

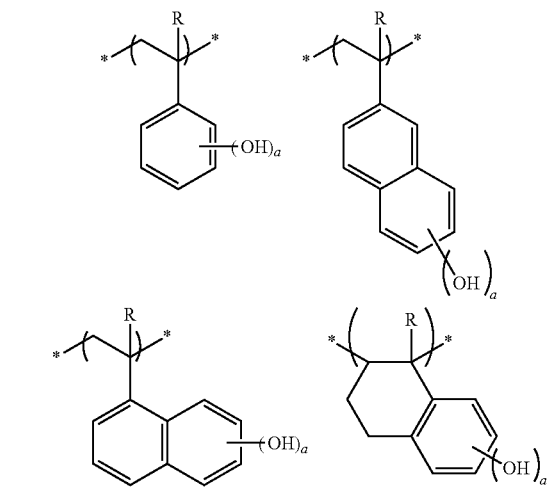

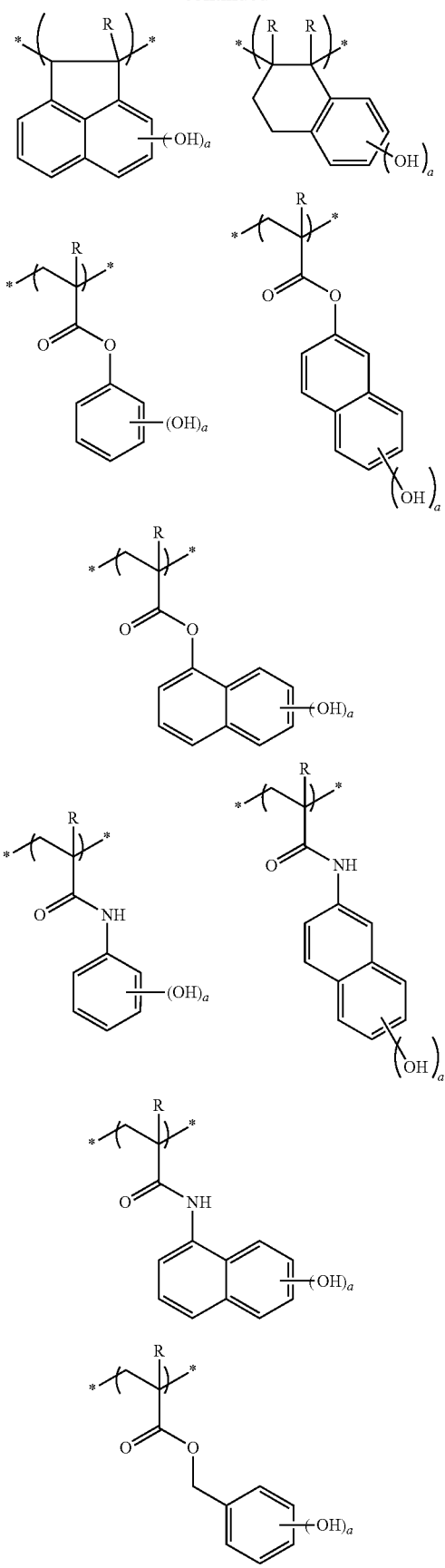

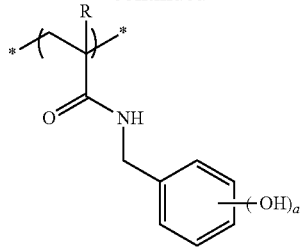

In the resin (A), the repeating unit (a) may be used singly or two or more kinds thereof may be used in combination.

In view of compatibility between the reactivity of the resin (A) and the diffusion suppressing performance of generated acid, the content ratio (total content ratio in a case where two or more kinds thereof are contained) of the repeating unit (a) is preferably 5 to 60 mol %, more preferably 10 to 50 mol %, and even more preferably 20 to 40 mol % with respect to all repeating units in the resin (A).

—Repeating unit (b)—

According to an aspect, the resin (A) preferably includes a repeating unit (hereinafter, referred to as an "acid-decomposable repeating unit") having an acid-decomposable group in which a protective group leaves due to an action of an acid to generate a polar group.

The resin (A) preferably includes a repeating unit (b) having a protective group (hereinafter, referred to as a "protective group P") that only includes carbon atoms and hydrogen atoms and in which the number of carbon atoms is 5 to 12 as the acid-decomposable repeating unit.

The repeating unit (a) having two or more phenolic hydroxyl groups represented by Formula (1) and the repeating unit (b) having an acid-decomposable group protected by the protective group P are used together, to further improve the resolution, the LWR, the and the CDU. The reason is not always clear, but it is assumed as follows. That is, by using the protective group P including a hydrocarbon group having 5 to 12 carbon atoms, a boiling point of a compound derived by the acid-decomposable group and the protective group P left due to a reaction of an acid is in a constant range. By using the repeating unit (a) having two or more phenolic hydroxyl groups together, the increase of unevenness due to rapid volatilization of the compound derived from the protective group P from the film in a case of exposure, specifically, the increase of the unevenness in CDU and LWR can be suppressed at a high level. The promotion of diffusion of an acid caused by many left substances remaining in the film and the deterioration of the resolution caused as a result thereof can be suppressed at a high level.

This effect cannot be obtained by an acid-decomposable repeating unit having a t-butoxycarbonyl group as a protecting group or an acid-decomposable repeating unit having an acetal structure as an acid-decomposable group. That is, in the acid-decomposable repeating unit having a t-butoxycarbonyl group, the reactivity of the reaction of a deprotected substance by acid is too low and thus the resolution becomes inferior. Meanwhile, in the repeating unit having an acetal structure, the reactivity is too high and thus the resolution becomes inferior.

The effect is particularly great in a case where the protective group P has a structure represented by —C(Rx$_1$)(Rx$_2$)(Rx$_3$). The reason is that the reactivity of the resist can be adjusted to a preferable range, and both of the high-sensitivity and the high resolution can be achieved. Here, the definitions of respective reference numerals represented by $Rx_1$, $Rx_2$, and $Rx_3$ are the same as those of $Rx_1$, $Rx_2$, and $Rx_3$ in Formula (A1) described below.

It is preferable that the resin (A) includes a repeating unit represented by Formula (A1) as the repeating unit (b).

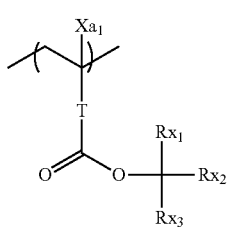

In Formula (A1), $Xa_1$ represents a hydrogen atom or an alkyl group that may have a substituent.

T represents a single bond or a divalent linking group.

$Rx_1$, $Rx_2$, and $Rx_3$ each independently represent a (linear or branched) alkyl group, a (monocyclic or polycyclic) cycloalkyl group, or a phenyl group. Here, in a case where all of $Rx_1$, $Rx_2$, and $Rx_3$ are (linear or branched) alkyl groups, at least two of $Rx_1$, $Rx_2$, or $Rx_3$ are preferably methyl groups.

Two out of $Rx_1$, $Rx_2$, and $Rx_3$ may be bonded to each other to form a (monocyclic or polycyclic) cycloalkyl group.

$Rx_1$, $Rx_2$, and $Rx_3$ each only include carbon atoms and hydrogen atoms, and a total number of carbon atoms included in $Rx_1$, $Rx_2$, and $Rx_3$ is 4 to 11.

Examples of the alkyl group that is represented by $Xa_1$ and may have a substituent include a methyl group or a group represented by $—CH_2—R_{11}$. $R_{11}$ represents a halogen atom (such as a fluorine atom), a, hydroxyl group, or a monovalent organic group, examples of the monovalent organic group include an alkyl group having 5 or less carbon atoms and an acyl group having 5 or less carbon atoms, and an alkyl group having 3 or less carbon atoms is preferable, and a methyl group is more preferable. According to an aspect, $Xa_1$ is preferably a hydrogen atom, a methyl group, a trifluoromethyl group, or a hydroxymethyl group.

Examples of the divalent linking group of T include an alkylene group, a —COO-Rt- group, and an —O-Rt- group. In the formula, Rt represents an alkylene group or a cycloalkylene group.

T is preferably a single bond, an arylene group, or a —COO-Rt- group and more preferably a single bond or an arylene group. The arylene group is preferably an arylene group having 6 to 10 carbon atoms and more preferably a phenylene group. Rt is preferably an alkylene group having 1 to 5 carbon atoms and more preferably a $—CH_2—$ group, a $—(CH_2)_2—$ group, and a $—(CH_2)_3—$ group.

The alkyl group of $Rx_1$ to $Rx_3$ is preferably an alkyl group having 1 to 4 carbon atoms such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, a polycyclic cycloalkyl group such as a norbornyl group.

The cycloalkyl group formed by bonding two of $Rx_1$ to $Rx_3$ is preferably a monocyclic cycloalkyl group such as a cyclopentyl group and a cyclohexyl group and a polycyclic cycloalkyl group such as a norbornyl group, a tetracyclodecanyl group, and an adamantyl group. The monocyclic cycloalkyl group having 5 to 6 carbon atoms is particularly preferable.

It is preferable that the repeating unit represented by Formula (A1), for example, is an aspect in which $Rx_1$ is a methyl group or an ethyl group, and in which and $Rx_2$ and $Rx_3$ are bonded to each other to form the above cycloalkyl group.

Each of the above groups may have a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and a group having 8 or less carbon atoms is preferable.

The repeating unit represented by Formula (A1) preferably an acid-decomposable (meth)acrylic acid tertiary alkyl ester-based repeating unit (a repeating unit in which $Xa_1$ represents a hydrogen atom or a methyl group, and T represents a single bond). It is more preferable that $Rx_1$ to $Rx_3$ each independently represent a repeating unit representing a linear or branched alkyl group, it is even more preferable that $Rx_1$ to $Rx_3$ each independently represent a repeating unit representing a linear alkyl group.

Specific examples of the repeating unit represented by Formula (A1) are provided below, but the present invention is not limited to these.

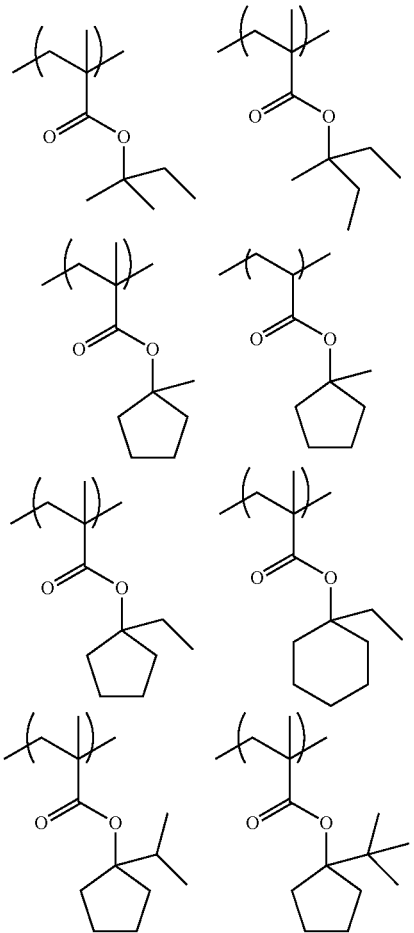

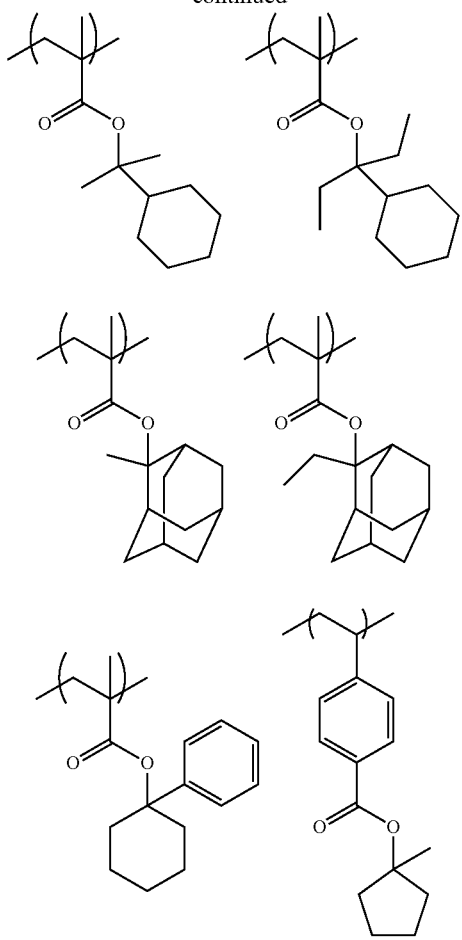

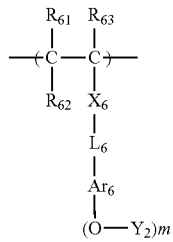

—Repeating Unit (c) and Repeating Unit (d)—

According to an aspect, in addition to the repeating unit (b), it is preferable that the resin (A) further includes any one of a repeating unit (c) represented by Formula (A2) as the acid-decomposable repeating unit or a repeating unit (d) represented by Formula (A3).

The repeating units (c) and (d) are acid-decomposable repeating units each having a specific acid-decomposable group, and at least any one thereof is used together with the repeating unit (b), LWR, the pattern collapse of a line pattern, and further the resolution of the trench pattern are further improved. The reason is not necessarily clear, but it is assumed as follows. That is, in a case where the resin (A) includes two or more specific acid-decomposable repeating units, the affinity to the developer is improved, and as a result, the development of the resist pattern in a development step more uniformly advances. It is assumed that the uniform advancement of the development suppresses the swelling of the pattern, and thus the collapse of the line pattern accompanied by the stress generation by the swelling or the bridge of the trench pattern accompanied by the pattern elongation by the swelling is suppressed. Particularly, this effect is prominent in the development of the organic solvent. In the case of the development of the organic solvent, the unexposed portion mainly dissolves, but an acid-decomposable group is unreacted to remain in the resin in the unexposed portion, and thus the above effect is prominent.

In Formula (A2), $R_{61}$, $R_{62}$, and $R_{63}$ each independently represent a hydrogen atom, an alkyl group, a cycloalkyl group, a halogen atom, a cyano group, or an alkoxycarbonyl group, $R_{62}$ may be bonded to $Ar_6$ or $L_6$ to form a ring, and $R_{62}$ in this case represents a single bond or an alkylene group.

$X_6$ represents a single bond, —COO—, or —CONR$_{64}$—, and $R_{64}$ represents a hydrogen atom or an alkyl group.

$L_6$ represents a single bond or a divalent linking group, and in a case of forming a ring with $R_{62}$, $L_6$ represents a trivalent linking group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

$Y_2$ represents a hydrogen atom or a group that leaves due to an action of an acid. In a case where m≥2, a plurality of $Y_2$'s may be identical to or different from each other. Here, at least one of $Y_2$'s represents a group that leaves due to an action of an acid.

Here, m represents an integer of 1 to 4.

Formula (A2) is more specifically described.

Examples of the alkyl group of $R_{61}$, $R_{62}$, and $R_{63}$ in Formula (A2) preferably include an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group which may have a substituent, and more preferably includes an alkyl group having 8 or less carbon atoms.

The alkyl group included in the alkoxycarbonyl group is preferably the same as those in the alkyl group in $R_{61}$, $R_{62}$, and $R_{63}$.

The cycloalkyl group may have a monocyclic shape or a polycyclic shape, and preferable examples thereof include a monocyclic cycloalkyl group having 3 to 8 carbon atoms such as a cyclopropyl group, a cyclopentyl group, and a cyclohexyl group which may have a substituent.

Examples of the halogen atom include a fluorine atom, a chlorine atom, a bromine atom, and an iodine atom, and a fluorine atom is more preferable.

In a case where $R_{62}$ represents an alkylene group, the alkylene group is preferably an alkylene group having 1 to 8 carbon atoms which may have a substituent such as a methylene group, an ethylene group, a propylene group, a butylene group, a hexylene group, and an octylene group.

Examples of the alkyl group of $R_{64}$ in —CONR$_{64}$— ($R_{64}$ represents a hydrogen atom and an alkyl group) exemplified as $X_6$ include those which are the same as the alkyl group of $R_{61}$ to $R_{63}$.

$X_6$ is preferably a single bond, —COO—, and —CONH— and more preferably a single bond and —COO—.

The divalent linking group in $L_6$ is preferably an alkylene group.

The alkylene group in $L_6$ is preferably an alkylene group having 1 to 8 carbon atoms which may have a substituent such as a methylene group, an ethylene group, a propylene group, a butylene group, a hexylene group, and an octylene group. The ring formed by bonding $R_{62}$ and $L_6$ is particularly preferably a 5-membered or 6-membered ring.

A single bond is preferable as $L_6$.

$Ar_6$ represents a (m+1)-valent aromatic ring group, and in a case where $Ar_6$ is bonded to $R_{62}$ to form a ring, $Ar_6$ represents a (m+2)-valent aromatic ring group. The aromatic ring group may have a substituent and examples thereof include an aromatic hydrocarbon ring having 6 to 18 carbon atoms which may have a substituent such as a benzene ring, a naphthalene ring, an anthracene ring, a fluorene ring, and a phenanthrene ring and an aromatic heterocyclic ring including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring.

Examples of the substituent that may be included the alkyl group, the cycloalkyl group, the alkoxycarbonyl group, the alkylene group, and the divalent aromatic ring group include the same specific examples as in the substituent that can be included in the respective groups represented by $R_{11}$, $R_{12}$, and $R_{13}$ in Formula (1).

m is preferably 1 or 2 and more preferably 1.

m items of $Y_2$'s each independently represent a hydrogen atom or a group that leaves by an action of an acid. Here, at least one of m items represents a group that leaves due to an action of an acid.

Examples of the group $Y_2$ that leaves due to an action of an acid include —$C(R_{36})(R_{37})(R_{38})$, —$C(=O)$—O—$C(R_{36})(R_{37})(R_{38})$, —$C(R_{01})(R_{02})(OR_{39})$, —$C(R_{01})(R_{02})$—$C(=O)$—O—$C(R_{36})(R_{37})(R_{38})$, and —$CH(R_{36})(Ar)$.

In the formula, $R_{36}$ to $R_{39}$ each independently represents an alkyl group, a cycloalkyl group, a monovalent aromatic ring group, a group obtained by combining an alkylene group and a monovalent aromatic ring group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, a monovalent aromatic ring group, a group obtained by combining an alkylene group and a monovalent aromatic ring group, or an alkenyl group.

Ar represents a monovalent aromatic ring group.

The alkyl group as $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may have a monocyclic shape or a polycyclic shape. The monocyclic type is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic type is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. A portion of the carbon atoms in the cycloalkyl group may be substituted with a hetero atom such as an oxygen atom.

A monovalent aromatic ring group of $R_{36}$ to $R_{39}$, $R_{01}$, $R_{02}$, and Ar is preferably a monovalent aromatic group having 6 to 10 carbon atoms, and examples thereof include an aryl group such as a phenyl group, a naphthyl group, and an anthryl group, and a divalent aromatic ring group including a heterocyclic ring such as thiophene, furan, pyrrole, benzothiophene, benzofuran, benzopyrrole, triazine, imidazole, benzimidazole, triazole, thiadiazole, and thiazole.

The group obtained by combining an alkylene group and a monovalent aromatic ring group in $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group as $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring that may be formed by bonding $R_{36}$ and $R_{37}$ with each other may have a monocyclic shape or a polycyclic shape. The monocyclic type is preferably a cycloalkyl structure having 3 to 8 carbon atoms, and examples thereof include a cyclopropane structure, a cyclobutane structure, a cyclopentane structure, a cyclohexane structure, a cycloheptane structure, and a cyclooctane structure. The polycyclic type is preferably a cycloalkyl structure having 6 to 20 carbon atoms, and examples thereof include an adamantane structure, a norbornane structure, a dicyclopentane structure, a tricyclodecane structure, and a tetracyclododecane structure. A portion of the carbon atoms in the cycloalkyl structure may be substituted with a hetero atom such as an oxygen atom.

The respective groups as $R_{36}$ to $R_{39}$, $R_{01}$, $R_{02}$, and Ar may have a substituent and examples of the substituent include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and it is preferable that the number of carbon atoms of the substituent is 8 or less.

The group $Y_2$ that leaves due to an action of an acid is more preferably a structure represented by Formula (VI-A).

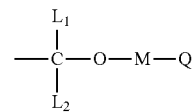

(VI-A)

Here, $L_1$ and $L_2$ each independently represent a hydrogen atom, an alkyl group, a cycloalkyl group, a monovalent aromatic ring group, or a group obtained by combining an alkylene group and a monovalent aromatic ring group.

M represents a single bond or a divalent linking group.

Q represents an alkyl group, a cycloalkyl group that may include a hetero atom, a monovalent aromatic ring group which may include a hetero atom, an amino group, an ammonium group, a mercapto group, a cyano group, or an aldehyde group.

At least two of Q, M, and $L_1$ are bonded to each other to form a ring (preferably 5-membered or 6-membered ring).

Examples of the alkyl group as $L_1$ and $L_2$ include an alkyl group having 1 to 8 carbon atoms, and specifically, the alkyl group is preferably a methyl group, an ethyl group, a propyl group, an n-butyl group, a sec-butyl group, a hexyl group, and an octyl group.

The cycloalkyl group as $L_1$ and $L_2$ is preferably a cycloalkyl group having 3 to 15 carbon atoms, and specifically, preferable examples thereof include a cyclopentyl group, a cyclohexyl group, a norbornyl group, and an adamantyl group.

Examples of the monovalent aromatic ring group as $L_1$ and $L_2$ include an aryl group having 6 to 15 carbon atoms, and specifically, preferable examples thereof include a phenyl group, a tolyl group, a naphthyl group, and an anthryl group.

Examples of the group obtained by combining an alkylene group and a monovalent aromatic ring group as $L_1$ and $L_2$ include an aralkyl group having 6 to 20 carbon atoms such as a benzyl group and a phenethyl group.

Examples of the divalent linking group as M include an alkylene group (for example, a methylene group, an ethylene group, a propylene group, a butylene group, a hexylene group, and an octylene group), a cycloalkylene group (for example, a cyclopentylene group, a cyclohexylene group, and an adamantylene group), an alkenylene group (for example, an ethenylene group, a propenylene group, and a butenylene group), a divalent aromatic ring group (for example, a phenylene group, a tolylene group, and a naphthylene group), —S—, —O—, —CO—, —SO$_2$—, —N(R$_0$)—, and a divalent linking group obtained by combining a plurality of these. R$_0$ is a hydrogen atom or an alkyl group (for example, an alkyl group having 1 to 8 carbon atoms, and specifically a methyl group, an ethyl group, a propyl group, an n-butyl group, a sec-butyl group, a hexyl group, and an octyl group).

The alkyl group as Q is the same as each group as $L_1$ and $L_2$.

Examples of the aliphatic hydrocarbon ring group that does not include a hetero atom and the monovalent aromatic ring group that does not include a hetero atom in a cycloalkyl group that may contain a hetero atom and a monovalent aromatic ring group that may contain a hetero atom as Q include a cycloalkyl group as $L_1$ and $L_2$ and a monovalent aromatic ring group, and the number of carbon atoms is preferably 3 to 15.

Examples of the cycloalkyl group including a hetero atom and the monovalent aromatic ring group including a hetero atom include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone, but generally, as long as the structure thereof is a structure (a ring formed with carbon and a hetero atom or a ring formed with a hetero atom) called a heterocyclic ring, the present invention is not limited thereto.

Examples of the ring that may be formed by bonding at least two of Q, M, and $L_1$ include a case of forming a 5-membered or 6-membered ring obtained by bonding at least two of Q, M, and $L_1$ and forming, for example, a propylene group or a butylene group to contain an oxygen atom.

The group represented by $L_1$, $L_2$, M, and Q in Formula (VI-A) may have a substituent, examples thereof include those described as the substituents that may be included in $R_{36}$ to $R_{39}$, $R_{01}$, $R_{02}$, and Ar, and the number of carbon atoms of the substituent is preferably 8 or less.

The group represented by -M-Q is preferably a group including 1 to 30 carbon atoms and more preferably a group including 5 to 20 carbon atoms.

Specific examples of the repeating unit represented by Formula (A2) are provided below, but the present invention is not limited to these.

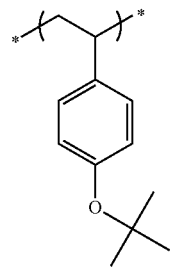

(VI-1)

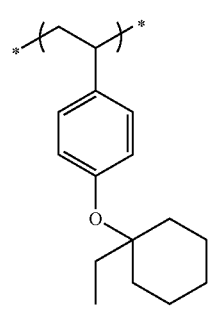

(VI-2)

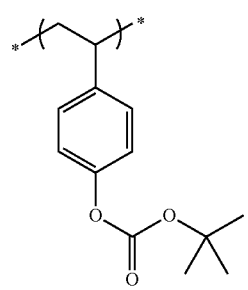

(VI-3)

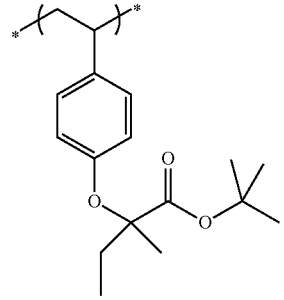

(VI-4)

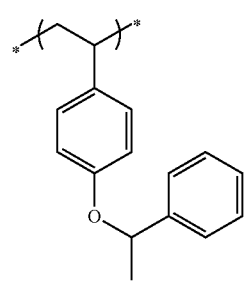

(VI-5)

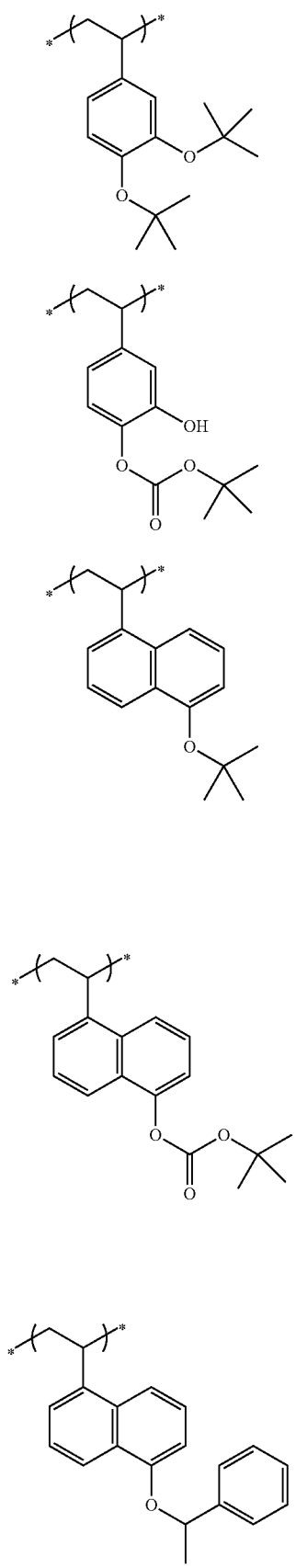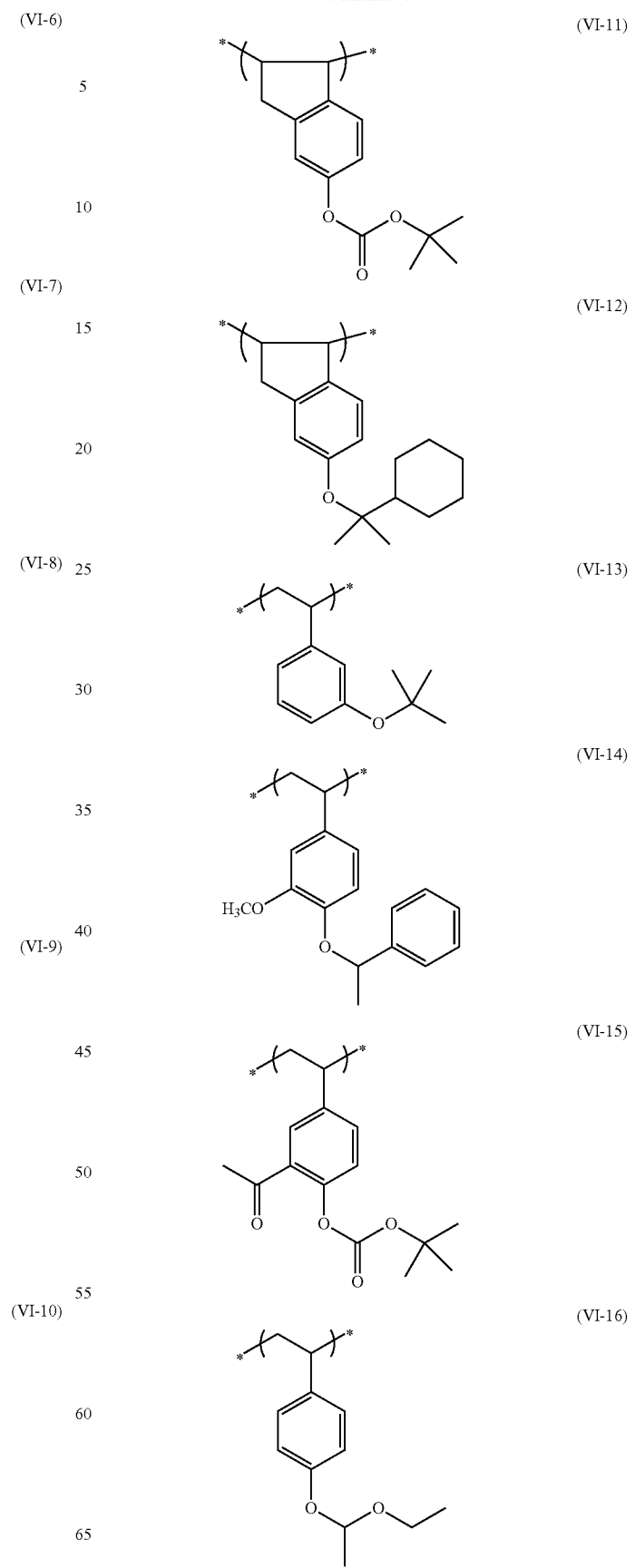

(VI-17)
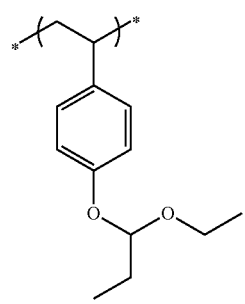
(VI-18)
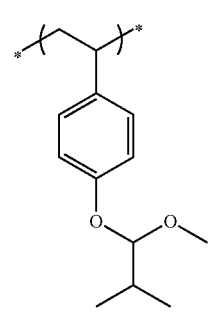
(VI-19)
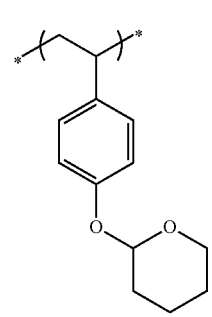
(VI-20)
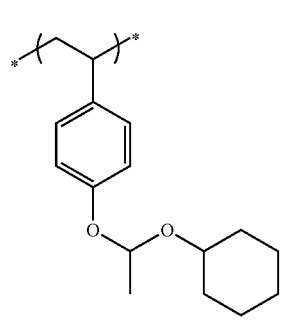
(VI-21)
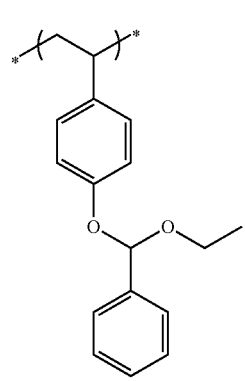
(VI-22)
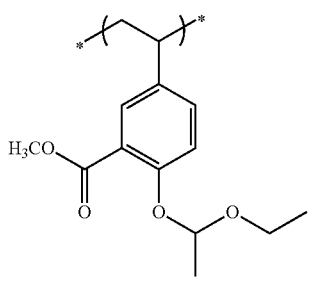
(VI-23)
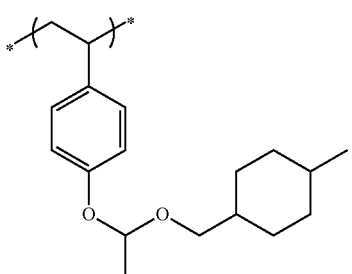
(VI-24)
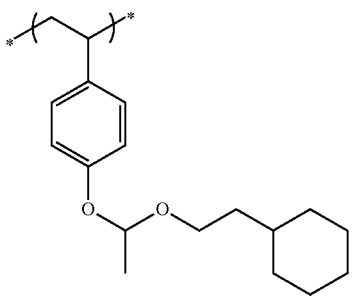
(VI-25)
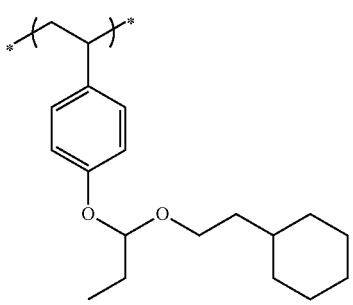
(VI-26)
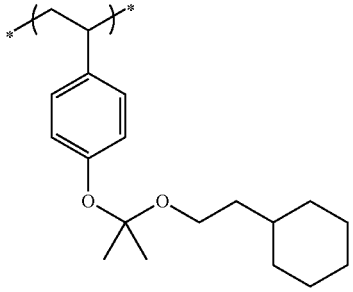

(VI-27)
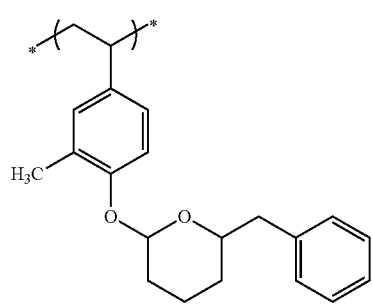
(VI-28)
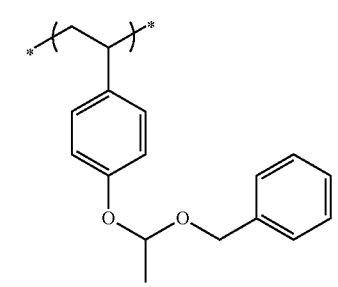
(VI-29)
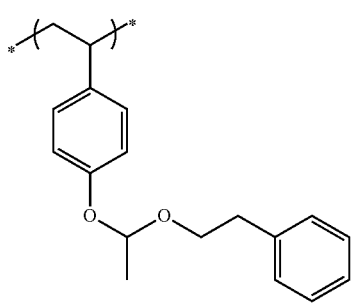
(VI-30)
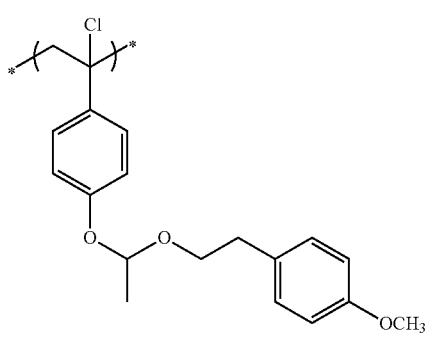
(VI-31)
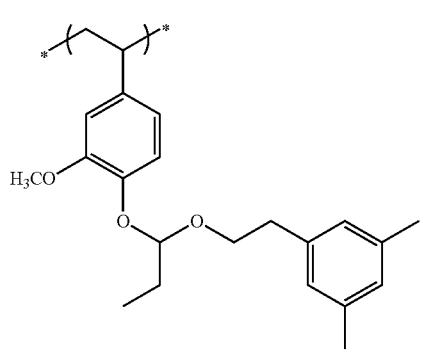
(VI-32)
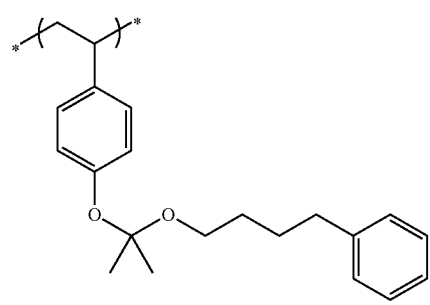
(VI-33)
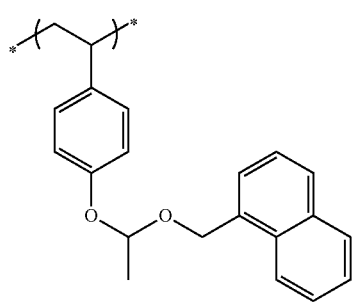
(VI-34)
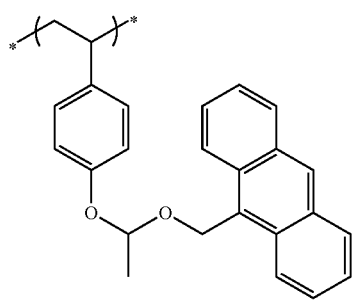
(VI-35)
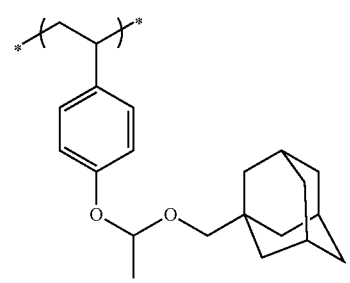
(VI-36)

(VI-37)

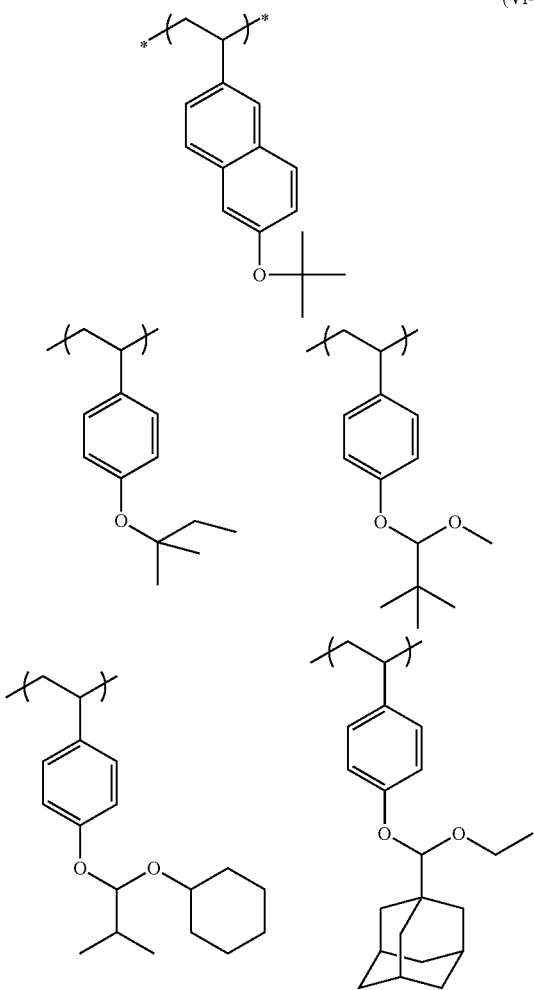

Subsequently, Formula (A3) is more specifically described.

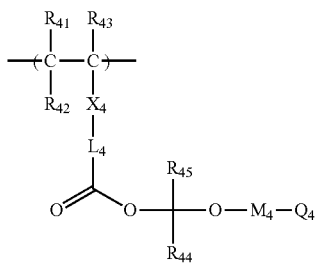

In Formula (A3), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and $R_{42}$ in this case represents an alkylene group.

$X_4$ represents a single bond, —COO—, or —CONR$_{44}$—, and $R_{44}$ represents a hydrogen atom or an alkyl group.

$L_4$ represents a single bond or a divalent linking group, and in a case of forming a ring with $R_{42}$, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to each other to form a ring.

Formula (A3) is more specifically described.

Examples of the alkyl group of $R_{41}$ to $R_{43}$ in Formula (A3) preferably include an alkyl group having 20 or less carbon atoms such as a methyl group, an ethyl group, a propyl group, an isopropyl group, an n-butyl group, a sec-butyl group, a hexyl group, a 2-ethylhexyl group, an octyl group, and a dodecyl group, which may have a substituent, more preferably includes an alkyl group having 8 or less carbon atoms, and particularly preferably includes an alkyl group having 3 or less carbon atoms.

The alkyl group included in the alkoxycarbonyl group is preferably the same as those in the alkyl group in $R_{41}$ to $R_{43}$.

The cycloalkyl group may have a monocyclic shape or a polycyclic shape. Preferable examples thereof include a monocyclic cycloalkyl group having 3 to 10 carbon atoms such as a cyclopropyl group, a cyclopentyl group, and a cyclohexyl group which may have a substituent.

Examples of the halogen atom include a fluorine atom, a chlorine atom, a bromine atom, and an iodine atom, and a fluorine atom is particularly preferable.

Examples of the preferable substituent in each group include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and it is preferable that the number of carbon atoms of the substituent is 8 or less.

In a case where $R_{42}$ forms a ring with $L_4$ which is an alkylene group, the alkylene group is preferably an alkylene group having 1 to 8 carbon atoms such as a methylene group, an ethylene group, a propylene group, a butylene group, a hexylene group, and an octylene group. An alkylene group having 1 to 4 carbon atoms is more preferable, and an alkylene group having 1 to 2 carbon atoms is particularly preferable. The ring formed by bonding $R_{42}$ and $L_4$ is particularly preferably a 5-membered or 6-membered ring.

$R_{41}$ and $R_{43}$ are more preferably a hydrogen atom, an alkyl group, or a halogen atom and particularly preferably a hydrogen atom, a methyl group, an ethyl group, a trifluoromethyl group (—CF$_3$), a hydroxymethyl group (—CH$_2$—OH), a chloromethyl group (—CH$_2$—Cl), and a fluorine atom (—F). $R_{42}$ is more preferably a hydrogen atom, an alkyl group, a halogen atom, or an alkylene group (for forming a ring with $L_4$), and particularly preferably a hydrogen atom, a methyl group, an ethyl group, a trifluoromethyl group (—CF$_3$), a hydroxymethyl group (—CH$_2$—OH), a chloromethyl group (—CH$_2$—Cl), a fluorine atom (—F), a methylene group (for forming a ring with $L_4$), and an ethylene group (for forming a ring with $L_4$).

According to an aspect, $X_4$ is preferably a single bond.

Examples of the divalent linking group represented by $L_4$ include an alkylene group, a divalent aromatic ring group, —COO-$L_1$-, —O-$L_1$-, and a group formed by combining two or more of these. Here, $L_1$ represents an alkylene group, a cycloalkylene group, a divalent aromatic ring group, and a group obtained by combining an alkylene group and a divalent aromatic ring group.

$L_4$ is preferably a single bond, a group represented by —COO-$L_1$-, or a divalent aromatic ring group, and more preferably a single bond or a divalent aromatic ring group (arylene group). $L_1$ is preferably an alkylene group having 1 to 5 carbon atoms and more preferably methylene group and propylene group. The divalent aromatic ring group is preferably a 1,4-phenylene group, a 1,3-phenylene group, a 1,2-phenylene group, or a 1,4-naphthylene group, and more preferably a 1,4-phenylene group.

In a case where $L_4$ is bonded to $R_{42}$ to form a ring, suitable examples of the trivalent linking group represented by $L_4$ include groups obtained by removing any one hydrogen atom from specific examples of the divalent linking group represented by $L_4$.

An alkyl group or the cycloalkyl group represented by $R_{44}$ and $R_{45}$ is the same as the alkyl group or the cycloalkyl group represented by $R_{36}$ to $R_{39}$, $R_{01}$, and $R_{02}$.

An aryl group represented by $R_{44}$ and $R_{45}$ are the same as the aryl group represented by $R_{36}$ to $R_{39}$, $R_{01}$, and $R_{02}$, and the preferable ranges thereof are the same.

The aralkyl group represented by $R_{44}$ and $R_{45}$ is preferably the aralkyl group having 7 to 12 carbon atoms, and the examples thereof include a benzyl group, a phenethyl group, and a naphthylmethyl group.

The alkyl group portion of the alkoxy group represented by $R_{44}$ and $R_{45}$ is the same as the alkyl group represented by $R_{36}$ to $R_{39}$, $R_{01}$, and $R_{02}$, and the preferable range is also the same.

Examples of the acyl group represented by $R_{44}$ and $R_{45}$ include an aliphatic acyl group having 1 to 10 carbon atoms such as a formyl group, an acetyl group, a propionyl group, a butyryl group, an isobutyryl group, a valeryl group, a pivaloyl group, a benzoyl group, and a naphthoyl group, and an acetyl group and a benzoyl group are preferable.

Examples of the heterocyclic group represented by $R_{44}$ and $R_{45}$ include the cycloalkyl group including a hetero atom and the aryl group including a hetero atom, and a pyridine ring group and a pyran ring group are preferable.

$R_{44}$ and $R_{45}$ each are preferably a linear or branched alkyl group having 1 to 8 carbon atoms (specifically, a methyl group, an ethyl group, a propyl group, an i-propyl group, an n-butyl group, a sec-butyl group, a tert-butyl group, a neopentyl group, a hexyl group, a 2-ethylhexyl group, and an octyl group), a cycloalkyl group having 3 to 15 carbon atoms (specifically, a cyclopentyl group, a cyclohexyl group, a norbornyl group, and an adamantyl group), and a group having two or more carbon atoms is more preferable. $R_{44}$ and $R_{45}$ each are more preferably an ethyl group, an i-propyl group, a sec-butyl group, a tert-butyl group, a neopentyl group, a cyclohexyl group, an adamantyl group, a cyclohexylmethyl group, or an adamantane methyl group, and even more preferably a tert-butyl group, a sec-butyl group, a neopentyl group, a cyclohexylmethyl group, or an adamantane methyl group.

The alkyl group, the cycloalkyl group, the aryl group, the aralkyl group, the alkoxy group, the acyl group, or the heterocyclic group may further have a substituent, and examples of the substituent that may be further included include those described as substituents that may be included in $R_{36}$ to $R_{39}$, $R_{01}$, $R_{02}$, and Ar.

A divalent linking group represented by $M_4$ is the same as M in a structure represented by Formula (VI-A), and the preferable range is also the same. $M_4$ may have a substituent, and examples of the substituent that is included in $M_4$ include a group which is the same as the substituent that is included in M in the group represented by Formula (VI-A).

The alkyl group, the cycloalkyl group, and the aryl group represented by $Q_4$ are the same as Q in the structure represented by Formula (VI-A), and the preferable range thereof is also the same.

Examples of the heterocyclic group represented by $Q_4$ include the cycloalkyl group including a hetero atom and the aryl group including a hetero atom as Q in the structure represented by Formula (VI-A), and the preferable range thereof is also the same.

$Q_4$ may have a substituent, and the substituent that may be included in $Q_4$ include a group that is the same as the substituent that may be included in Q in the group represented by Formula (VI-A).

The ring that is formed by bonding at least two of $Q_4$, $M_4$, and $R_{44}$ is the same as the ring that may be formed by bonding at least two of Q, M, and $L_1$ in Formula (VI-A), and the preferable range thereof is also the same.

Specific examples of the repeating unit represented by Formula (A3) are provided below, but the present invention is not limited to these.

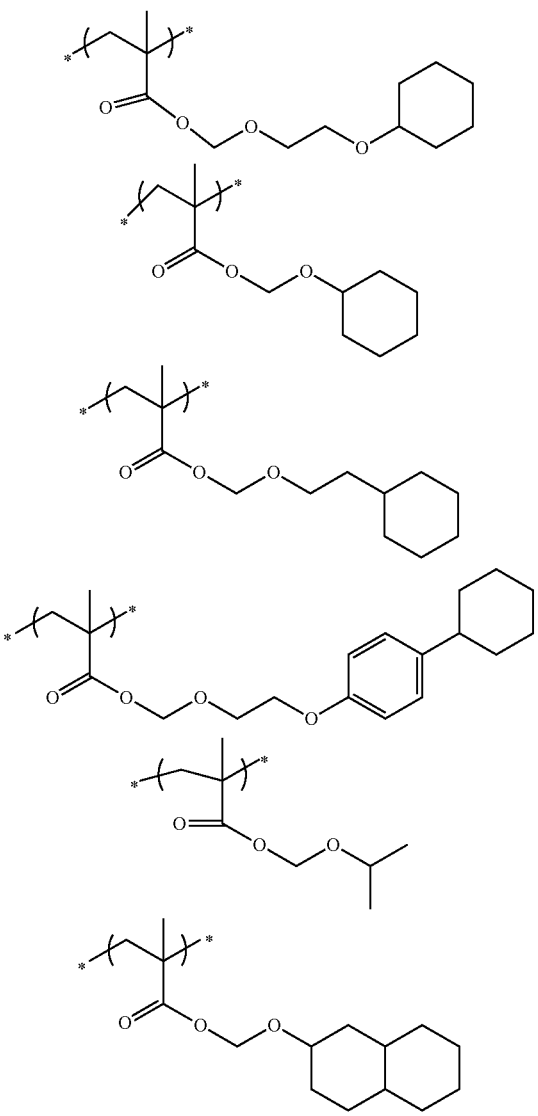

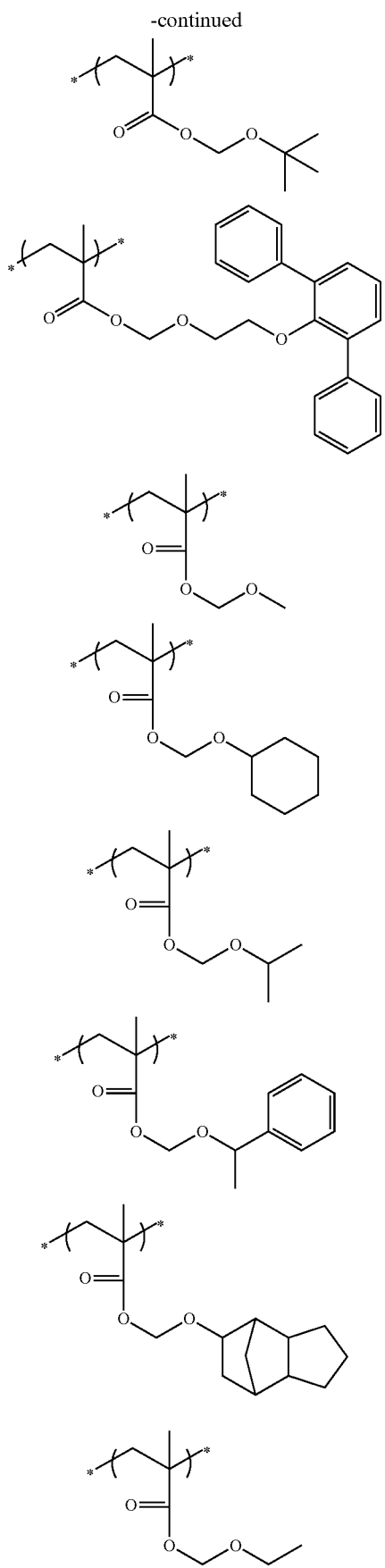
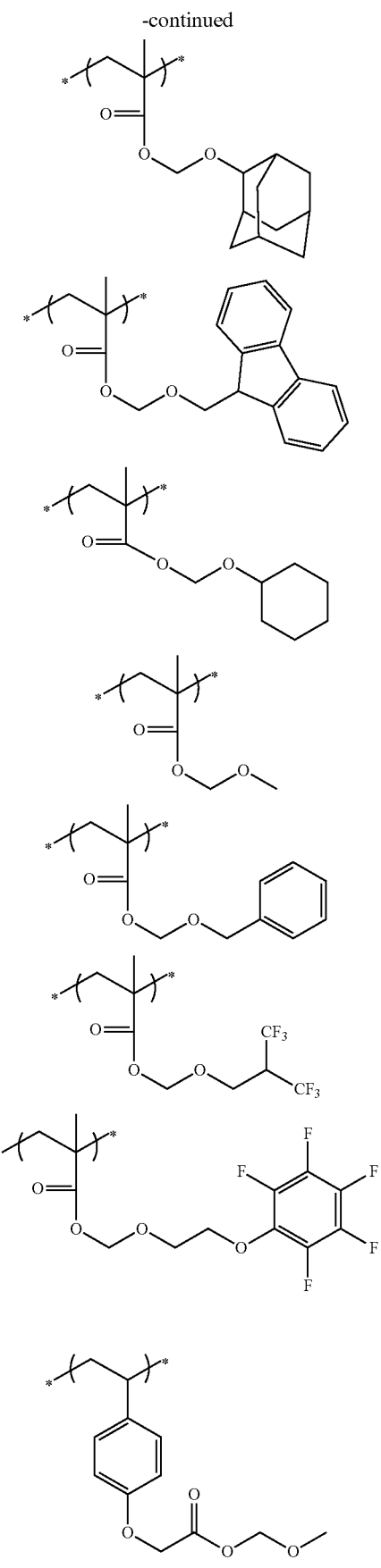

-continued
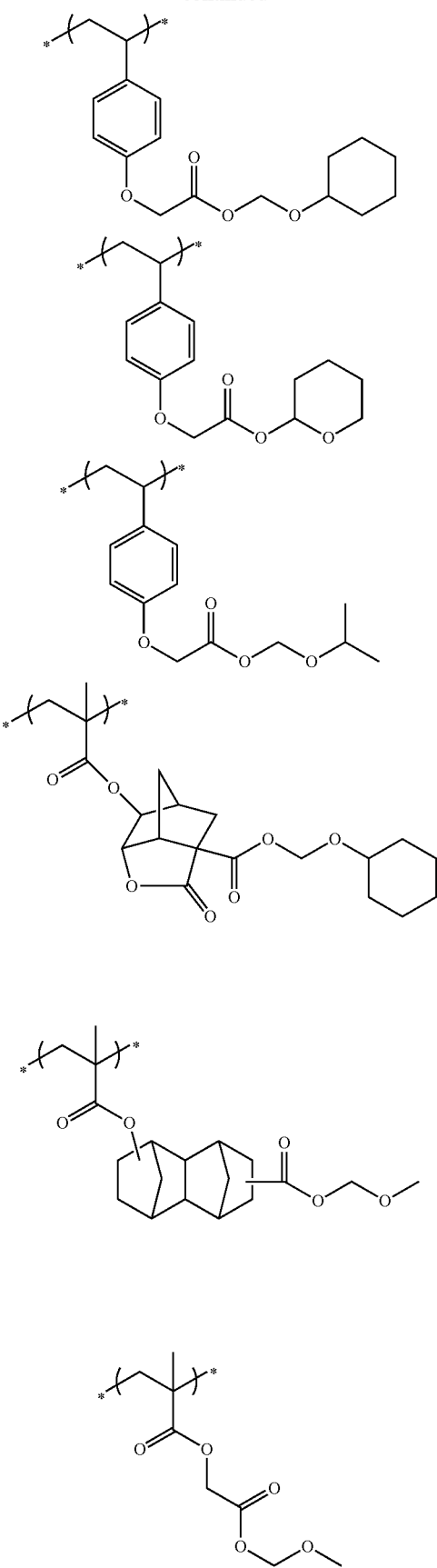
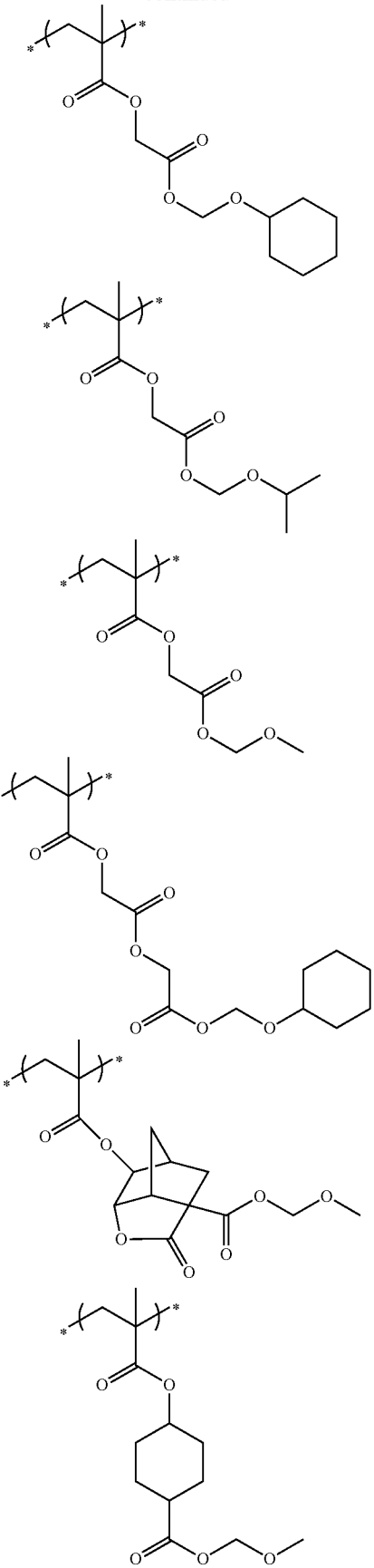

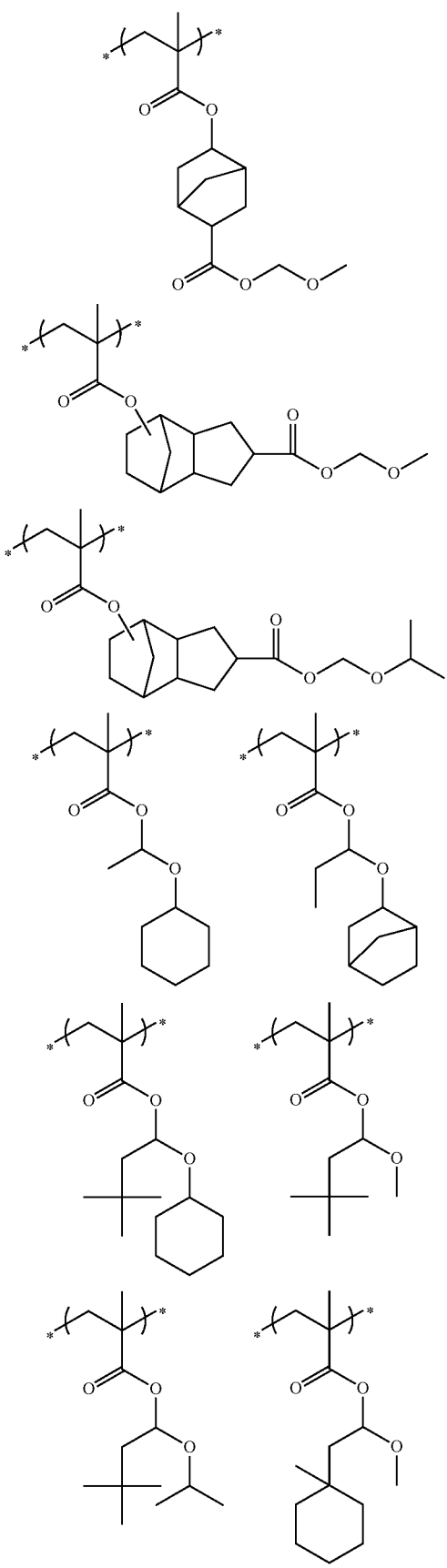
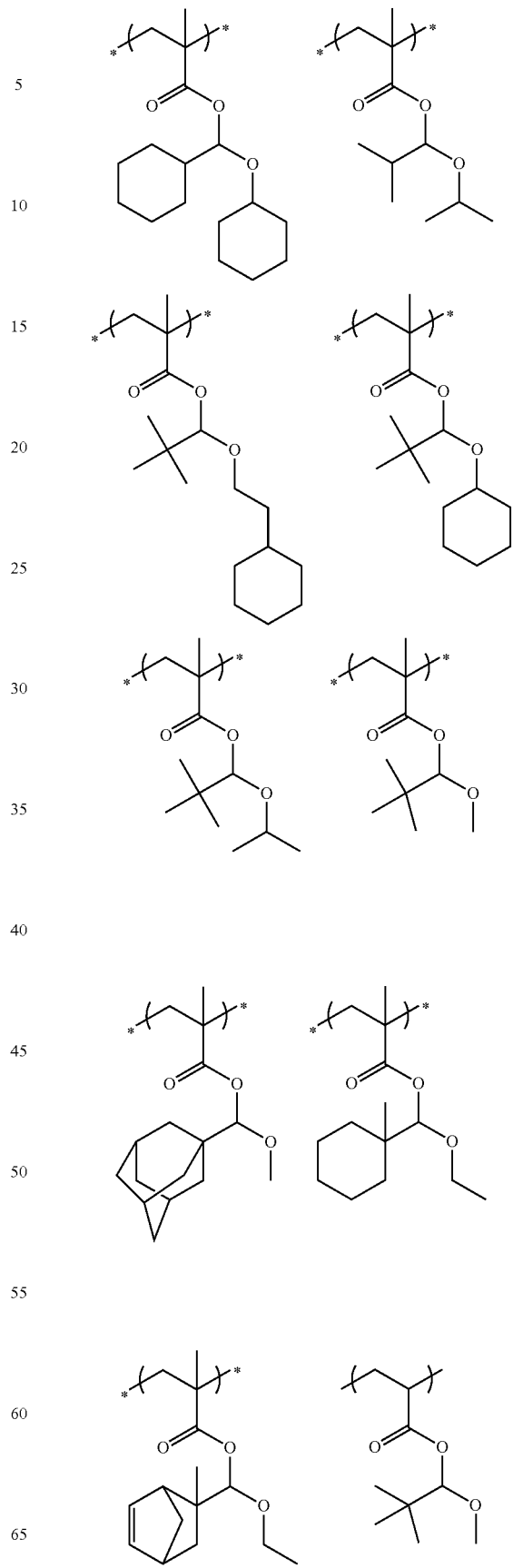

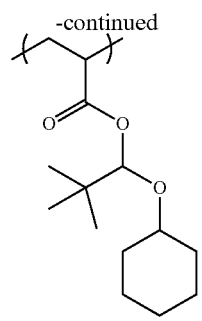

A content ratio (a sum thereof in a case where a plurality of kinds thereof are contained) of the repeating unit that has the acid-decomposable group in the resin (A) is preferably 5 mol % to 90 mol %, more preferably 5 mol % to 80 mol %, even more preferably 5 mol % to 75 mol %, particularly preferably 10 mol % to 70 mol %, and most preferably 10 mol % to 65 mol % with respect to all repeating units in the resin (A).

In the resin (A), the repeating unit (b) may be used singly or two or more kinds thereof may be used in combination. The content ratio of the repeating unit (b) (a sum thereof in a case where a plurality of kinds thereof are contained) is preferably 5 to 90 mol %, more preferably 5 to 80 mol %, and even more preferably 5 to 75 mol % with respect to all repeating units in the resin (A).

In the resin (A), the repeating unit (c) may be used singly or two or more kinds thereof may be used in combination. The content ratio of the repeating unit (c) (a sum in a case where a plurality kinds thereof are contained) is preferably 0 to 40 mol %, more preferably 0 to 30 mol %, and even more preferably 0 to 20 mol % with respect to all repeating units in the resin (A).

In the resin (A), the repeating unit (d) may be used singly or two or more kinds thereof may be used in combination. The content ratio of the repeating unit (d) (a sum thereof in a case where a plurality of kinds thereof are contained) is preferably 0 to 40 mol %, more preferably 0 to 30 mol %, and even more preferably 0 to 20 mol % with respect to all repeating units in the resin (A).

—Repeating Unit (e)—

According to the aspect, it is preferable that the resin (A) further contains a repeating unit (e) having a lactone structure. By causing the repeating unit (e) to have a lactone structure, sensitivity is further improved. It is assumed that this is because the lactone structure has very high polarity, and as a result, the proton leave from the repeating unit (a) represented by Formula (1) which becomes a proton source of an acid easily advances, and as a result, high-sensitivity can be obtained.

As the lactone group, any group having a lactone structure can be used, but a group containing a lactone structure of a 5-membered to 7-membered ring is preferable, and it is preferable that another ring structure is fused to a lactone structure of 5-membered to 7-membered ring in a form of forming a bicyclo structure or a spiro structure. It is more preferable that the resin (A) has a repeating unit having a group having a lactone structure represented by any one of Formulae (LC1-1) to (LC1-17). A group having a lactone structure may be directly bonded to a main chain. The preferable lactone structure is a group represented by Formulae (LC1-1), (LC1-4), (LC1-5), (LC1-6), (LC1-13), and (LC1-14).

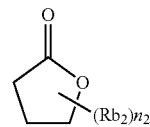
LC1-1

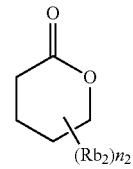
LC1-2

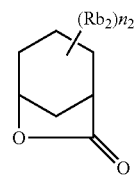
LC1-3

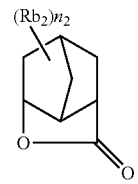
LC1-4

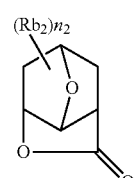
LC1-5

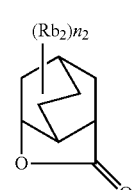
LC1-6

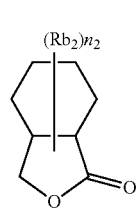
LC1-7

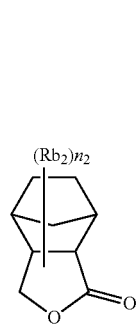
LC1-8

LC1-9 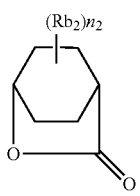

LC1-10 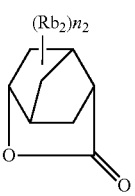

LC1-11 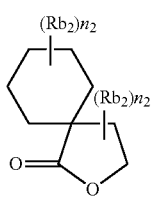

LC1-12 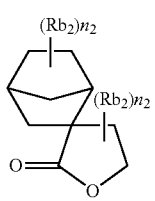

LC1-13 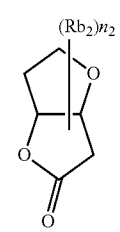

LC1-14 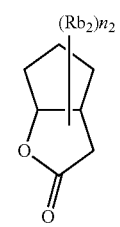

LC1-15 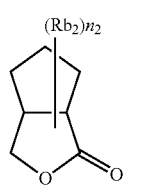

LC1-16 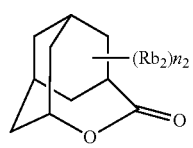

LC1-17 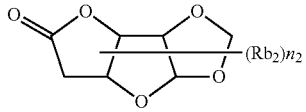

A lactone structure portion may have or may not have a substituent ($Rb_2$). Preferable examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, the plurality of $Rb_2$'s which are present may be identical to or different from each other, and the plurality of $Rb_2$'s which are present may be bonded to each other to form a ring.

Examples of the repeating unit having a group having a lactone structure represented by any one of Formulae (LC1-1) to (LC1-17) include repeating units represented by Formula (AII).

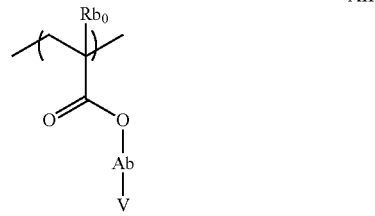

AII

In Formula (AII), $Rb_0$ represents a hydrogen atom, a halogen atom, or an alkyl group having 1 to 4 carbon atoms.

The alkyl group as $Rb_0$ may have a substituent, and examples of the preferable substituent that may be included in $Rb_0$ a hydroxyl group and a halogen atom.

Examples of the halogen atom in $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, a carboxyl group, or a divalent group obtained by combining these groups. A single bond and a linking group represented by -$Ab_1$—$CO_2$— are preferable. $Ab_1$ is a linear or branched alkylene group, a monocyclic or polycyclic cycloalkylene group and preferably a methylene group, an ethylene group, a cyclohexylene group, an adamantylene group, or a norbornylene group.

V represents a group represented by any one of Formulae (LC1-1) to (LC1-17).

In the repeating unit having a group having a lactone structure, an optical isomer is usually present, but any optical isomer may be used. One optical isomer may be used singly, or a plurality of optical isomers may be used in a mixture. In a case where one kind of optical isomer is mainly used, the optical purity (ee) thereof is preferably 90 or more and more preferably 95 or more.

Specific examples of the repeating unit having a group having a lactone structure are provided below, but the present invention is not limited thereto.

41
(In the formulae, Rx represents H, CH₃, CH₂OH, or CF₃)
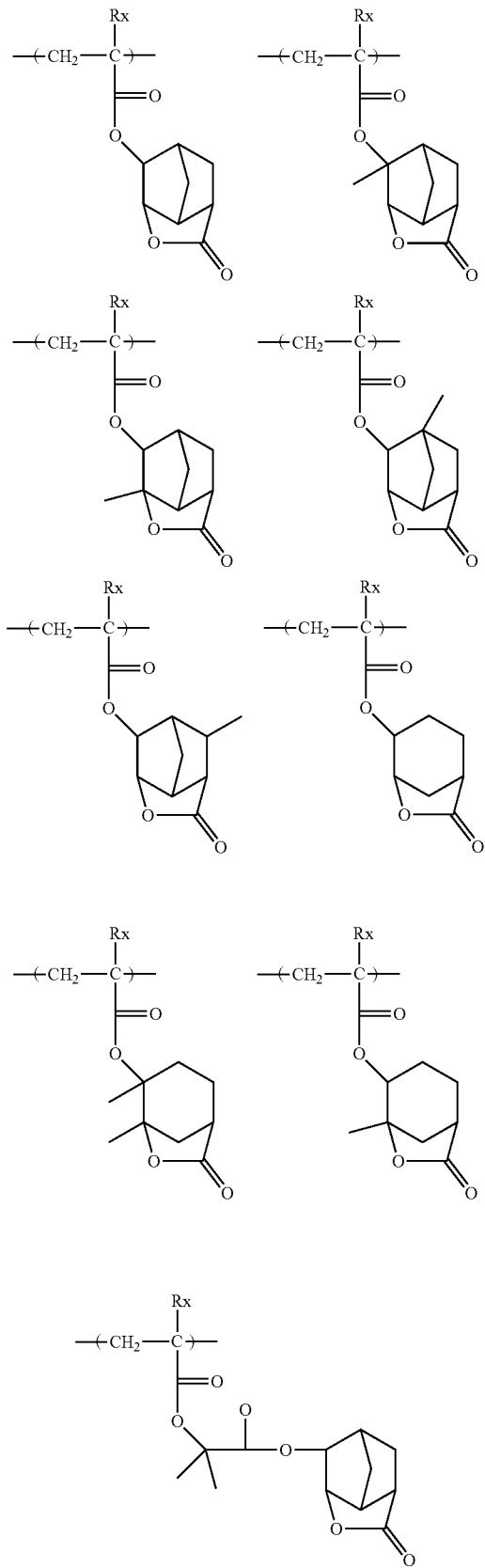
42
-continued
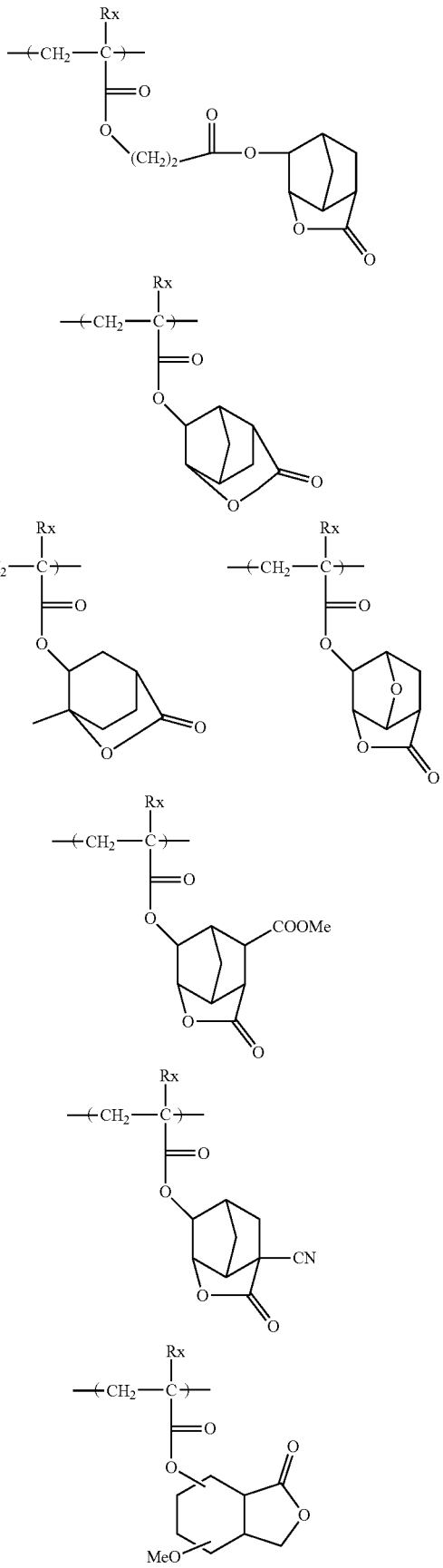

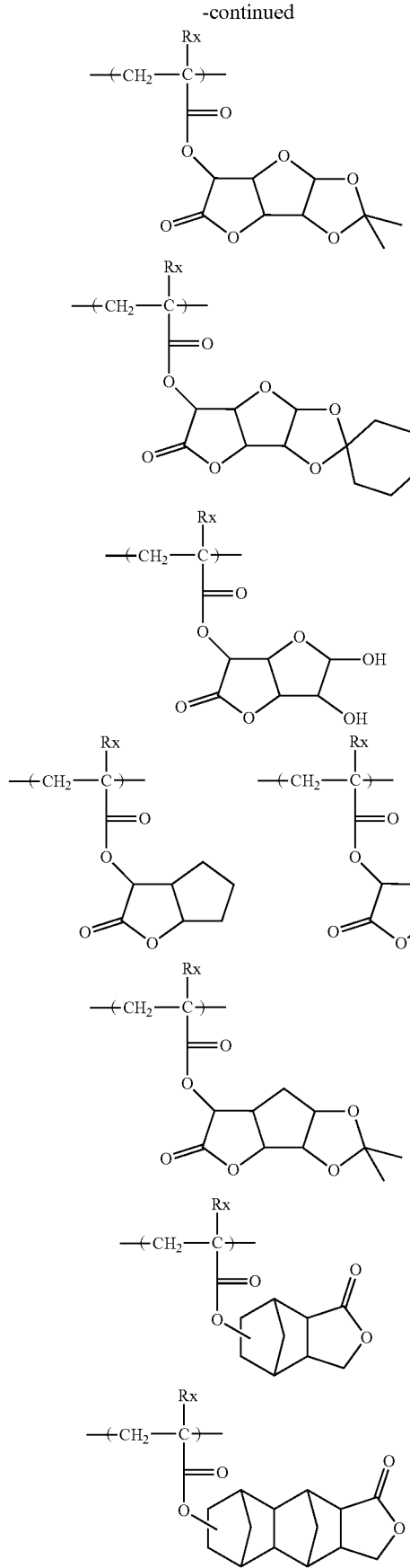
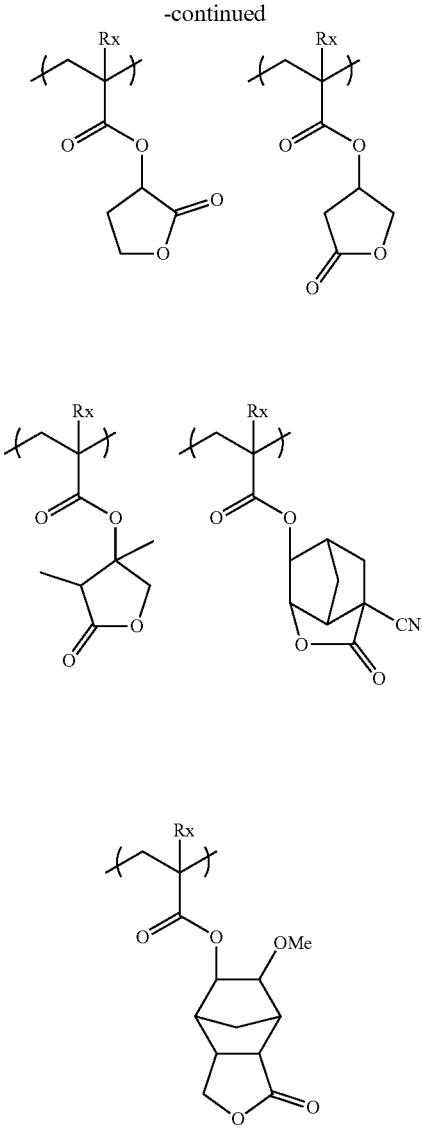

(In the formulae, Rx represents H, CH₃, CH₂OH, or CF₃)

The content ratio of the repeating unit (e) having a lactone group is preferably 1 to 30 mol %, more preferably 5 to 25 mol %, and even more preferably 5 to 20 mol % with respect to all repeating units in the resin (A).

—Repeating Unit Containing Organic Group Having Polar Group—

The resin (A) may further have a repeating unit containing an organic group having a polar group, particularly, a repeating unit having an alicyclic hydrocarbon structure substituted with a polar group.

As a result, the substrate adhesiveness and developer affinity are improved. The alicyclic hydrocarbon structure in the alicyclic hydrocarbon structure substituted with a polar group is preferably an adamantyl group, a diamantyl group, or a norbornane group. The polar group is preferably a hydroxyl group and a cyano group.

Specific examples of the repeating unit having a polar group are provided below, but the present invention is not limited thereto.

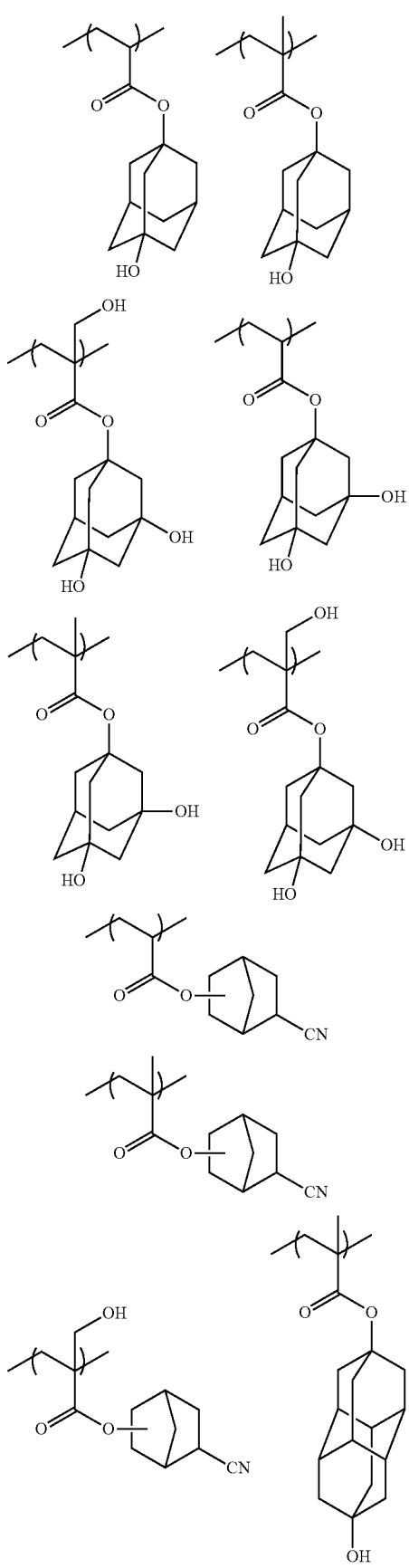

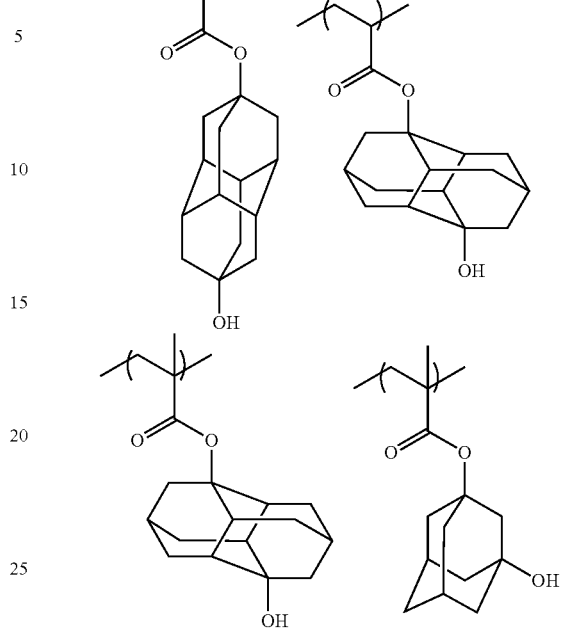

In a case where the resin (A) has a repeating unit containing an organic group having a polar group, the content ratio thereof is preferably 1 to 30 mol %, more preferably 5 to 25 mol %, and even more preferably 5 to 20 mol % with respect to all repeating units in the resin (A).

As the repeating unit other than the above, a repeating unit having a group (photoacid generating group) that generates an acid due to irradiation with actinic rays or radiation may be included. In this case, it can be considered that this repeating unit having a photoacid generating group corresponds to the compound (B) which generates an acid due to irradiation with an actinic ray or radiation described below.

Examples of the repeating unit include a repeating unit represented by Formula (4).

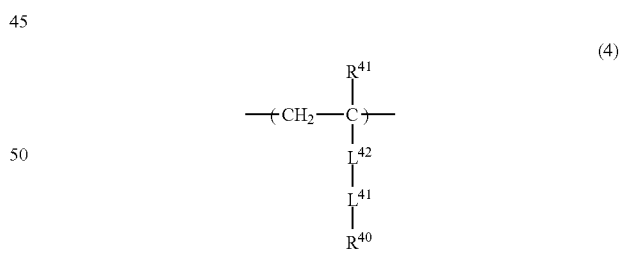

$R^{41}$ represents a hydrogen atom or a methyl group. $L^{41}$ represents a single bond or a divalent linking group. $L^{42}$ represents a divalent linking group. $R^{40}$ represents a structure moiety which is decomposed due to irradiation with actinic rays or radiation to generate an acid at a side chain.

Examples of the repeating unit represented by Formula (4) include repeating units disclosed in paragraphs [0094] to [0105] of JP2014-041327A.

In a case where the resin (A) contains a repeating unit having a photoacid generating group, the content of the repeating unit having a photoacid generating group is preferably 1 to 40 mol %, more preferably 5 to 35 mol %, and even more preferably 5 to 30 mol % with respect to all repeating units in the resin (A).

The resin (A) can be synthesized by a general method (for example, radical polymerization). Examples of the general synthesis method include a batch polymerization method in which polymerization is performed by dissolving a monomer species and an initiator in a solvent and heating and a dropwise addition polymerization method in which a solution of a monomer species and an initiator is added dropwise to the heated solvent over 1 to 10 hours. The dropwise addition polymerization method is preferable.

Examples of the reaction solvent include ethers such as tetrahydrofuran, 1,4-dioxane, and diisopropyl ether, ketones such as methyl ethyl ketone and methyl isobutyl ketone, an ester solvent such as ethyl acetate, an amide solvent such as dimethylformamide and dimethylacetamide, and a solvent for dissolving the actinic ray-sensitive or radiation-sensitive resin composition according to the embodiment of the present invention described below such as propylene glycol monomethyl ether acetate, propylene glycol monomethyl ether, and cyclohexanone. It is preferable to perform polymerization using the same solvent as the solvent used for the actinic ray-sensitive or radiation-sensitive resin composition according to the embodiment of the present invention. As a result, generation of particles during storage can be suppressed.

The polymerization reaction is preferably performed in an inert gas atmosphere such as nitrogen or argon. Polymerization is initiated by using a commercially available radical initiator (azo-based initiator, peroxide, and the like) as a polymerization initiator. The radical initiator is preferably an azo-based initiator and more preferably an azo-based initiator having an ester group, a cyano group, and a carboxyl group. Examples of the preferable initiators include azobisisobutyronitrile, azobisdimethylvaleronitrile, and dimethyl 2,2'-azobis(2-methylpropionate). An initiator is added or an initiator is added in portions as desired, and after completion of the reaction, the initiator is put in a solvent, and the desired polymer is collected by a method such as powder or solid collection. The concentration in the reaction is 5 to 50 mass % and preferably 10 to 30 mass %. The reaction temperature is generally 10° C. to 150° C., preferably 30° C. to 120° C., and even more preferably 60° C. to 100° C.

Purification can be performed by a general method such as a liquid-liquid extraction method in which retained monomers and oligomer components are removed by washing with water or combining appropriate solvents, a purification method in a solution state such as ultrafiltration for extracting and removing only those having a specific molecular weight or less, a reprecipitation method in which a resin solution is added dropwise into a poor solvent to solidify a resin in the poor solvent such that a retained monomer or the like is removed, and a purification method in a solid state in which a filtered resin slurry is washed with a poor solvent.

The weight-average molecular weight of the resin (A) is preferably 1,000 to 200,000, more preferably 3,000 to 20,000, and most preferably 5,000 to 15,000, as a value in terms of polystyrene by a GPC method. In a case where the weight-average molecular weight is caused to be 1,000 to 200,000, it is possible to prevent deterioration of heat resistance and dry etching resistance and it is possible to prevent deterioration of developability and deterioration of film formability due to increase in viscosity.

According to another particularly preferable aspect, the weight-average molecular weight of the resin (A) is 3,000 9,500, as a value in terms of polystyrene by a GPC method. By setting the weight-average molecular weight to be 3,000 to 9,500, particularly, a resist residue (hereinafter also referred to as "scum") is suppressed, and a better pattern can be formed.

The dispersion degree (molecular weight distribution) is generally in the range of 1 to 5, preferably in the range of 1 to 3, more preferably in the range of 1.2 to 3.0, and particularly preferably in the range of 1.2 to 2.0. As the dispersion degree is smaller, a resolution and a resist shape are excellent, a sidewall of a resist pattern is smooth, and roughness properties are excellent.

In the actinic ray-sensitive or radiation-sensitive resin composition, the content ratio of the resin (A) is preferably 50 to 99.9 mass % and more preferably 60 to 99.0 mass % with respect to the total solid content.

According to the actinic ray-sensitive or radiation-sensitive resin composition, the resin (A) may be used singly, or two or more kinds thereof may be used in combination.

<(B) Compound that Generates Acid by Irradiation with Actinic Ray or Radiation>

The actinic ray-sensitive or radiation-sensitive resin composition according to the embodiment of the present invention contains a compound (hereinafter, referred to as a "photoacid generator «PAG»" or the "compound (B)") that generates an acid due to the irradiation with actinic rays or radiation.

The photoacid generator may have an aspect of a low molecular weight compound or may have an aspect of being incorporated into a part of the polymer. The aspect of a low molecular weight compound and the aspect of being incorporated in a part of a polymer may be used in combination.

In a case of an aspect in which the photoacid generator is a low molecular weight compound, the molecular weight is preferably 3,000 or less, more preferably 2,000 or less, and even more preferably 1,000 or less.

In a case where the photoacid generator is in an aspect of being incorporated into a part of the polymer, the photoacid generator may be incorporated in a part of the resin (A) or may be incorporated in a resin different from the resin (A).

For the purpose of adjusting the pattern cross-sectional shape, the number of fluorine atoms included in the acid generator is appropriately adjusted. By adjusting the fluorine atom, the uneven distribution properties of the surface of the acid generator in the actinic ray-sensitive or radiation-sensitive film can be controlled. As the number of the fluorine atoms included in the acid generator is more, the acid generator is distributed more unevenly on the surface.

According to the present invention, the photoacid generator is preferably in an aspect of a low molecular weight compound.

The photoacid generator is not particularly limited as long as it is a well-known photoacid generator but is preferably a compound that generates at least one of organic acid, for example, sulfonic acid, bis(alkylsulfonyl) imide, or tris(alkylsulfonyl) methide, due to the irradiation with actinic ray or radiation, preferably electron beams or extreme ultraviolet.

It is more preferable that examples thereof include compounds represented by Formulae (ZI), (ZII), and (ZIII).

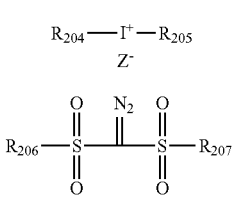

In Formula (ZI), $R_{201}$, $R_{202}$, and $R_{203}$ each independently represent organic groups.

The number of carbon atoms of the organic group as $R_{201}$, $R_{202}$, and $R_{203}$ is generally 1 to 30 and preferably 1 to 20.

Two of $R_{201}$ to $R_{203}$ may be bonded to each other to form a ring structure and may contain an oxygen atom, a sulfur atom, an ester bond, an amide bond, or a carbonyl group in the ring. Examples of the group formed by bonding two of $R_{201}$ to $R_{203}$ include an alkylene group (for example, a butylene group and a pentylene group).

Z⁻ represents a non-nucleophilic anion (anion markedly low ability to cause a nucleophilic reaction).

Examples of the non-nucleophilic anion include a sulfonate anion (aliphatic sulfonate anion, aromatic sulfonate anion, and camphor sulfonate anion), a carboxylate anion (aliphatic carboxylate anion, aromatic carboxylate anion, and aralkyl carboxylate anion), a sulfonylimide anion, a bis(alkylsulfonyl) imide anion, and a tris(alkylsulfonyl) methide anion.

The aliphatic moiety in the aliphatic sulfonate anion and the aliphatic carboxylate anion may be an alkyl group or a cycloalkyl group, and is preferably a linear or branched alkyl group having 1 to 30 carbon atoms and a cycloalkyl group having 3 to 30 carbon atoms.

The aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group and the cycloalkyl group, and the aryl group may have a substituent. Specific examples thereof include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). With respect to the aryl group and the ring structure of each group, examples of the substituent further include an alkyl group (preferably having 1 to 15 carbon atoms).

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl) imide anion and the tris(alkylsulfonyl) methide anion is preferably an alkyl group having 1 to 5 carbon atoms. Examples of the substituent of these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom or an alkyl group substituted with a fluorine atom is preferable.

The alkyl group in the bis(alkylsulfonyl) imide anion may be bonded to each other to form a ring structure. This increases the acid strength.

Examples of other non-nucleophilic anions include phosphorus fluoride (for example, $PF_6^-$), boron fluoride (for example, $BF_4^-$), and antimony fluoride (for example, $SbF_6^-$).

The non-nucleophilic anion is preferably an aliphatic sulfonate anion in which at least an α-position of the sulfonic acid is substituted with a fluorine atom, an aromatic sulfonate anion substituted with a fluorine atom or a group having a fluorine atom, a bis(alkylsulfonyl) imide anion in which an alkyl group is substituted with a fluorine atom, and a tris(alkylsulfonyl) methide anion in which an alkyl group is substituted with a fluorine atom. The non-nucleophilic anion is more preferably a perfluoroaliphatic sulfonate anion (more preferably having 4 to 8 carbon atoms) and a benzene sulfonate anion having a fluorine atom and is even more preferably a nonafluorobutanesulfonate anion, a perfluorooctanesulfonate anion, a pentafluorobenzenesulfonate anion, and a 3,5-bis(trifluoromethyl) benzenesulfonate anion.

In view of the acid strength, it is preferable that pKa of the generated acid is −1 or less, to improve sensitivity.

As a preferable aspect of the non-nucleophilic anion, an anion represented by Formula (AN1) is also provided.

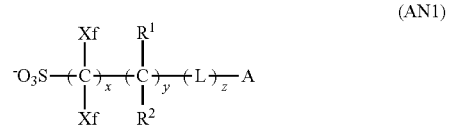

in the formula,

Xf's each independently represent a fluorine atom or an alkyl group substituted with at least one fluorine atom.

$R^1$ and $R^2$ each independently represent a hydrogen atom, a fluorine atom, or an alkyl group, $R^1$'s and $R^2$'s in a case where a plurality thereof are present may be identical to or different from each other, respectively.

L represents a divalent linking group, and L's in a case where a plurality thereof are present may be identical to or different from each other.

A represents a cyclic organic group.

x represents an integer of 1 to 20, y represents an integer of 0 to 10, and z represents an integer of 0 to 10.

Formula (AN1) is more specifically described.

The alkyl group in the alkyl group substituted with a fluorine atom of Xf is preferably an alkyl group having 1 to 10 carbon atoms and more preferably an alkyl group having 1 to 4 carbon atoms. The alkyl group substituted with a fluorine atom of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, a fluorine atom and $CF_3$ are preferable. Particularly, it is preferable that both Xf's are fluorine atoms.

The alkyl groups as $R^1$ and $R^2$ each may have a substituent (preferably a fluorine atom), and an alkyl group having 1 to 4 carbon atoms is preferable. A perfluoroalkyl group having 1 to 4 carbon atoms is more preferable. Specific examples of the alkyl group having substituents of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

$R^1$ and $R^2$ is preferably a fluorine atom or $CF_3$.

x is preferably 1 to 10 and more preferably 1 to 5.

y is preferably 0 to 4 and more preferably 0.

z is preferably 0 to 5 and more preferably 0 to 3.

The divalent linking group of L is not particularly limited, examples thereof include —COO—, —OCO—, —CO—, —O—, —S—, —SO—, —SO$_2$—, an alkylene group, a cycloalkylene group, an alkenylene group, or a linking group obtained by linking a plurality of these, and a linking group having 12 or less carbon atoms in total is preferable. Among these, —COO—, —OCO—, —CO—, and —O— are preferable, and —COO— and —OCO— are more preferable.

The cyclic organic group of A is not particularly limited as long as the cyclic organic group has a cyclic structure, and examples thereof include an alicyclic group, an aryl group, a heterocyclic group (including not only those having aromaticity but also those having no aromaticity).

The alicyclic group may be monocyclic or polycyclic, and is preferably a monocyclic cycloalkyl group such as a cyclopentyl group, a cyclohexyl group, and a cyclooctyl group, and a polycyclic cycloalkyl group such as a norbornyl group, a tricyclodecanyl group, a tetracyclodecanyl group, a tetracyclododecanyl group, and an adamantyl group. Among these, an alicyclic group having a bulky structure having 7 or more carbon atoms such as a norbornyl group, a tricyclodecanyl group, a tetracyclodecanyl group, a tetracyclododecanyl group, and an adamantyl group is preferable, in view of suppressing diffusion in the film in the heating after exposure step and improvement of a mask error enhancement factor (MEEF).

Examples of the aryl group include a benzene ring, a naphthalene ring, a phenanthrene ring, and an anthracene ring.

Examples of the heterocyclic group include groups derived from a furan ring, a thiophene ring, a benzofuran ring, a benzothiophene ring, a dibenzofuran ring, a dibenzothiophene ring, and a pyridine ring. Among them, ones derived from a furan ring, a thiophene ring, and a pyridine ring are preferable.

Examples of the cyclic organic group include a lactone structure, and specific examples thereof include a lactone structure represented by Formulae (LC1-1) to (LC1-17).

The cyclic organic group may have a substituent, and examples of the substituent include an alkyl group (may be any one of a linear group, a branched group, or a cyclic group and preferably having 1 to 12 carbon atoms), a cycloalkyl group (may be either any one of a monocyclic ring, a polycyclic ring, or a spiro ring and preferably having 3 to 20 carbon atoms), an aryl group (preferably having 6 to 14 carbon atoms), a hydroxy group, an alkoxy group, an ester group, an amide group, a urethane group, a ureido group, a thioether group, a sulfonamide group, and a sulfonic acid ester group. Carbon constituting the cyclic organic group (carbon contributing to ring formation) may be carbonyl carbon.

Examples of the organic groups of $R_{201}$, $R_{202}$, and $R_{203}$ each include an aryl group, an alkyl group, or a cycloalkyl group.

It is preferable that at least one of $R_{201}$, $R_{202}$, or $R_{203}$ is an aryl group, and it is more preferable that all of the three are aryl groups. In addition to a phenyl group and a naphthyl group, as the aryl group, a heteroaryl group such as an indole residue or a pyrrole residue is also exemplified. The alkyl group and the cycloalkyl group of $R_{201}$ to $R_{203}$ each are preferably a linear or branched alkyl group having 1 to 10 carbon atoms, and a cycloalkyl group having 3 to 10 carbon atoms. The alkyl group is more preferably a methyl group, an ethyl group, an n-propyl group, an i-propyl group, and an n-butyl group. The cycloalkyl group is more preferably a cyclopropyl group, a cyclobutyl group, a cyclopentyl group, a cyclohexyl group, and a cycloheptyl group. These groups may further have a substituent. Examples of the substituent include a halogen atom such as a nitro group and a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), and the present invention is not limited to these.

Preferable examples of the anion represented by Formula (AN1) are provided as below. In the following examples, A represents a cyclic organic group.

$SO_3$—$CF_2$—$CH_2$—OCO-A, $SO_3$—$CF_2$—CHF—$CH_2$—OCO-A, $SO_3$—$CF_2$—COO-A, $SO_3$—$CF_2$—$CF_2$—$CH_2$-A, and $SO_3$—$CF_2$—$CH(CF_3)$—OCO-A In Formulae (ZII) and (ZIII), $R_{204}$ to $R_{207}$ each independently represent an aryl group, an alkyl group, or a cycloalkyl group.

The aryl group, the alkyl group, and the cycloalkyl group of $R_{204}$ to $R_{207}$ are the same as the aryl group described in the aryl group, the alkyl group, and the cycloalkyl group of $R_{201}$ to $R_{203}$ in the Formula (ZI).

An aryl group, an alkyl group, and a cycloalkyl group of $R_{204}$ to $R_{207}$ each may have a substituent. Examples of the substituent include a substituent that may be included in an aryl group, an alkyl group, and a cycloalkyl group of $R_{201}$ to $R_{203}$ in the Formula (ZI).

$Z^-$ represents a non-nucleophilic anion, and examples thereof include the same as the non-nucleophilic anion of $Z^-$ in Formula (ZI).

According to the present invention, in view of suppressing diffusion of an acid generated by exposure to a non-exposed portion and improving resolution, by the irradiation with an electron beam or an extreme ultraviolet ray, the photoacid generator is preferably a compound that generates an acid (more preferably a sulfonic acid) having a size of a volume of 130 Å$^3$ (10 Å=1 nm) or more, more preferably a compound that generates an acid (more preferably a sulfonic acid) having a size of a volume of 190 Å$^3$ or more, even more preferably a compound that generates an acid (more preferably a sulfonic acid) having a size of a volume of 270

Å³ or more, and particularly preferably a compound that generates an acid (more preferably a sulfonic acid) having a size of a volume of 400 Å³ or more. Here, in view of sensitivity or coating solvent solubility, the above volume is preferably 2,000 Å³ or less and is more preferably 1,500 Å³ or less. The above volume value was obtained by using "WinMOPAC" manufactured by Fujitsu Limited. That is, first, the chemical structure of the acid according to each example is inputted, then this structure is used as an initial structure to determine the most stable conformation of each acid by molecular force field calculation using an MM3 method, and then a PM3 method is used according to the most stable conformation so as to perform the molecular orbital calculation, such that the "accessible volume" of each acid can be calculated.

As the photoacid generator, paragraphs [0368] to [0377] of JP2014-041328A and paragraphs [0240] to [0262] ([0339] of corresponding US2015/0004533A) of JP2013-228681A can be referred to, and the contents thereof are incorporated into the present specification. Preferable specific examples thereof include the following compounds, but the present invention is not limited to these.

(z1)

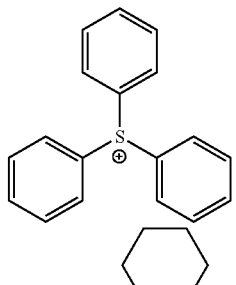

(z2)

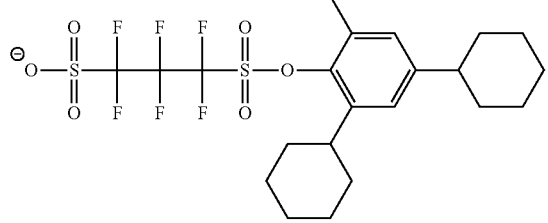

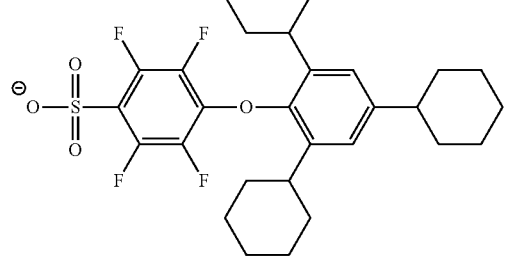

(z3)

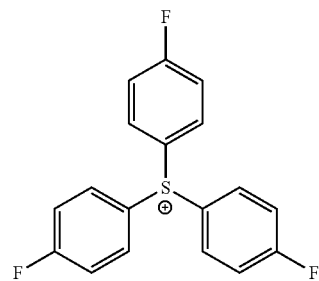

(z4)

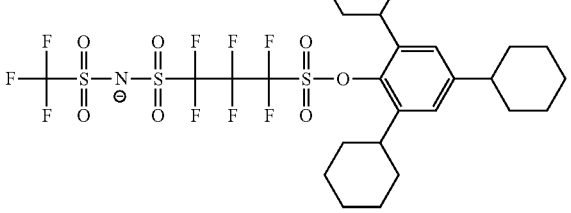

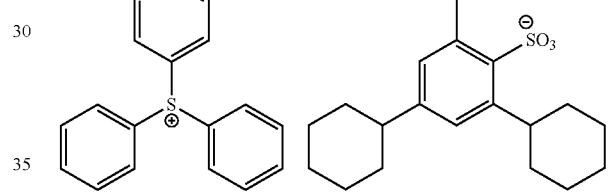

(z5)

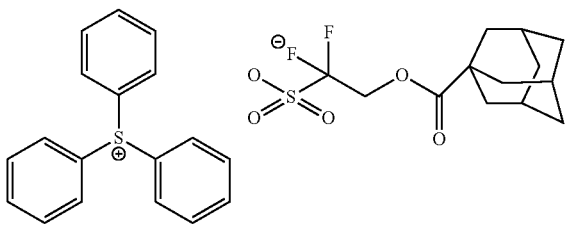

(z6)

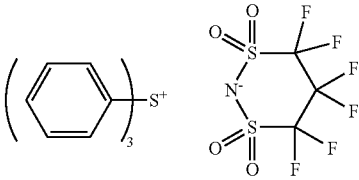

(z7)

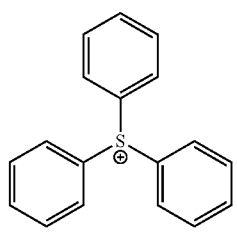 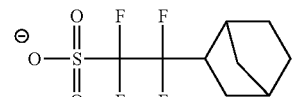

-continued
(z8)
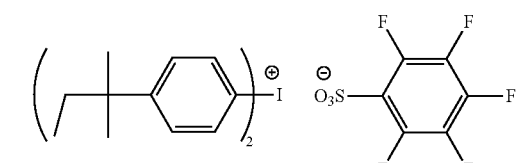
(z9)
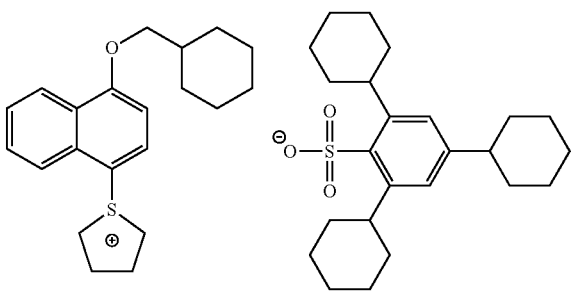
(z10)
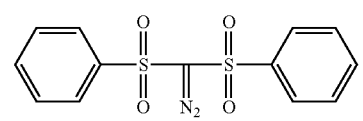
(z11)
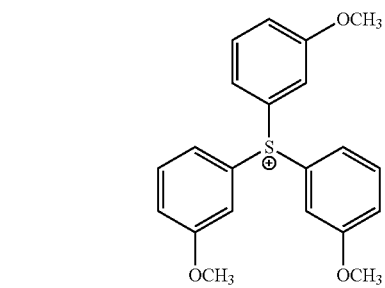
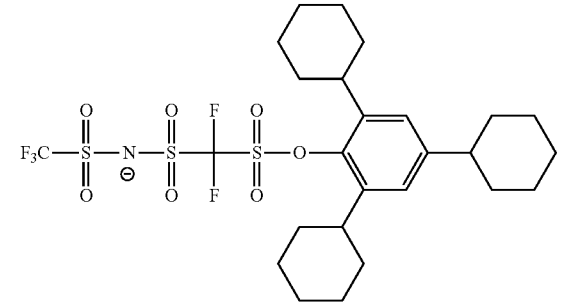
(z12)
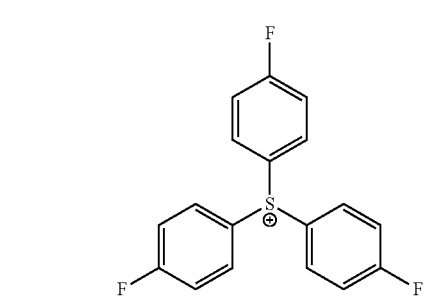
-continued
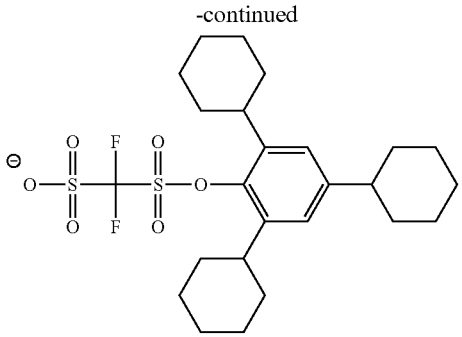
(z13)
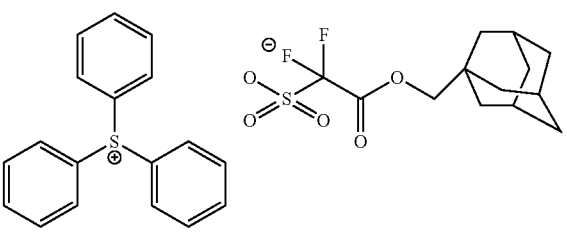
(z14)
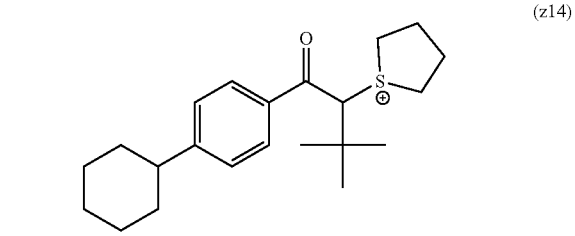
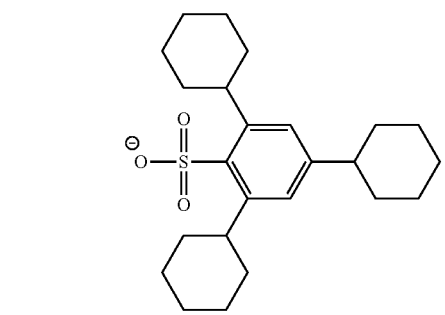
(z15)
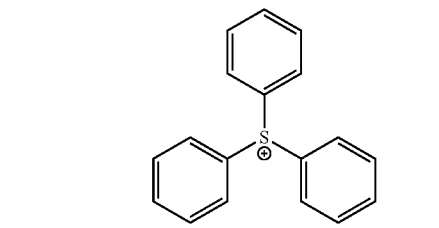
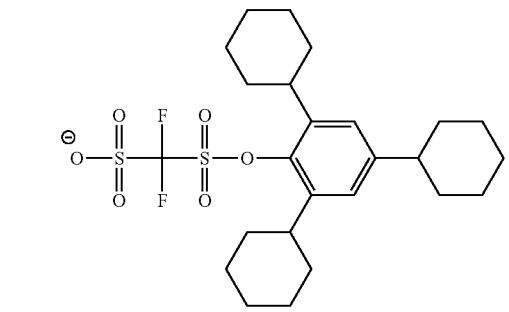

-continued
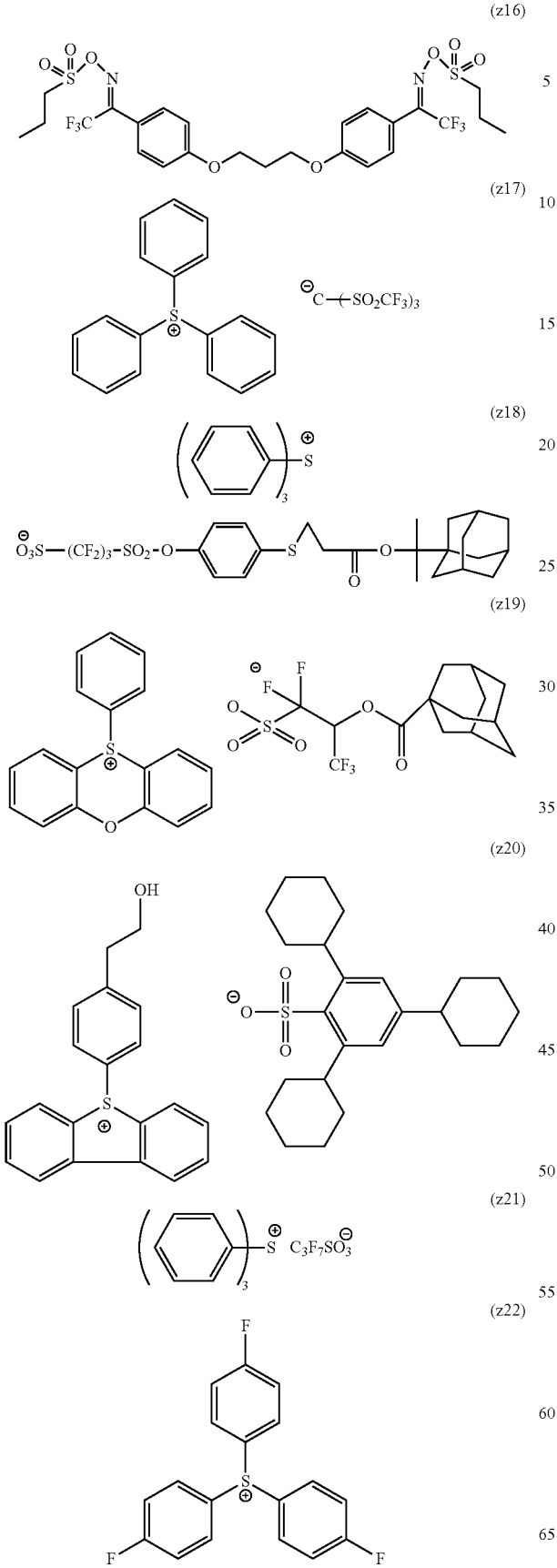
-continued
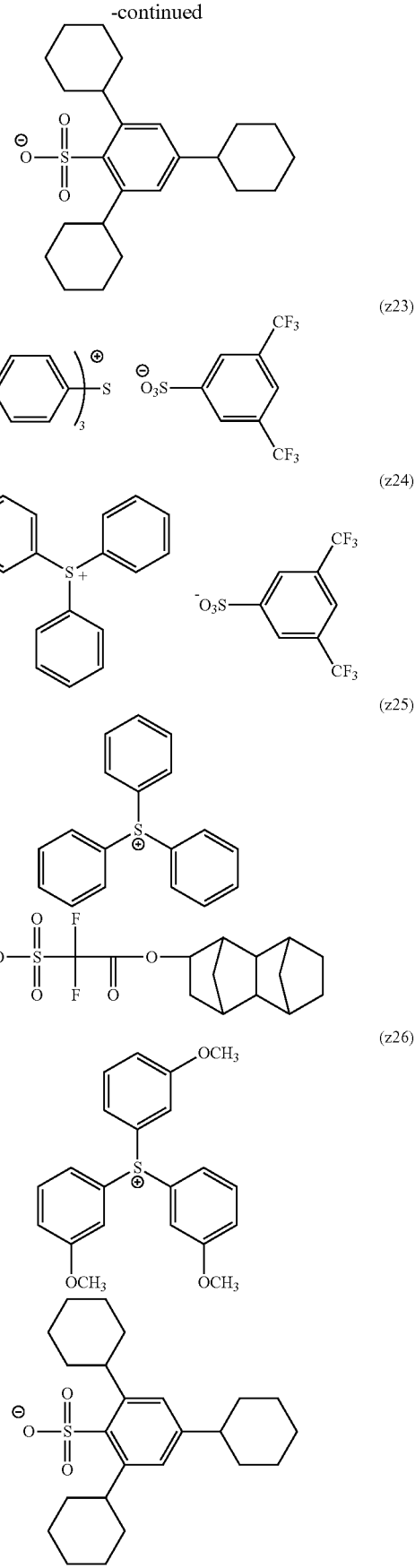

(z27) 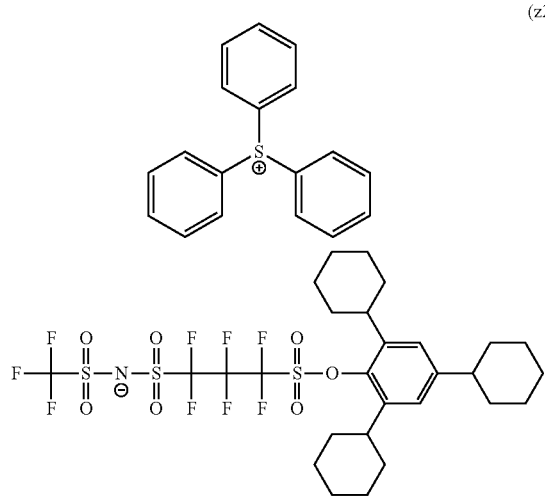
(z28) 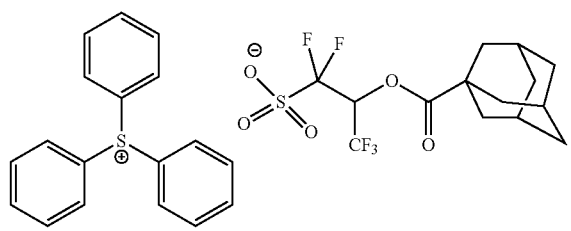
(z29) 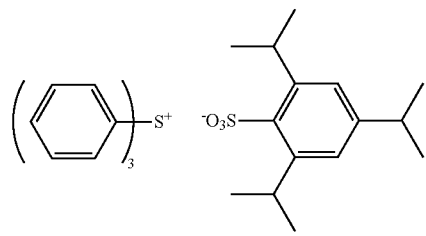
(z30) 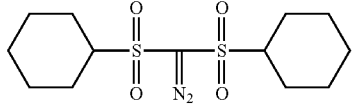
(z31) 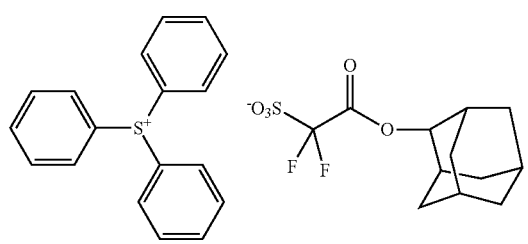
(z32) 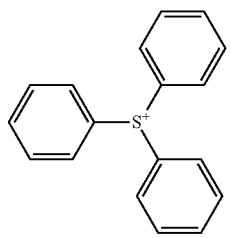
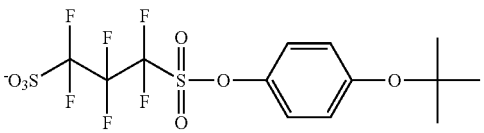
(z33) 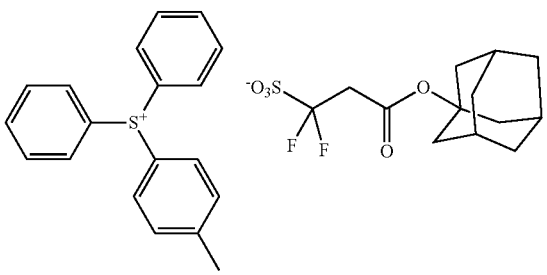
(z34) 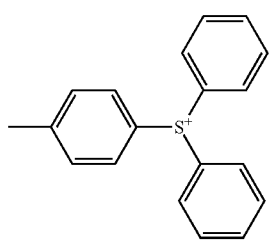
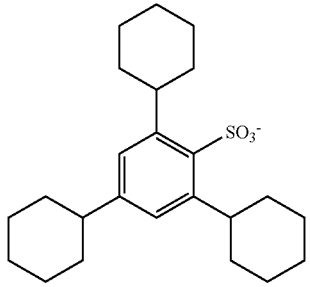
(z35) 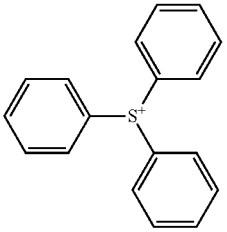
(z36) 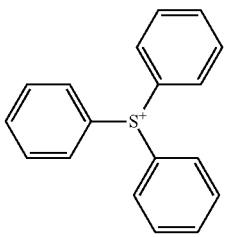 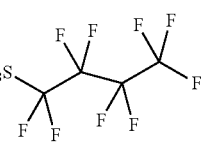

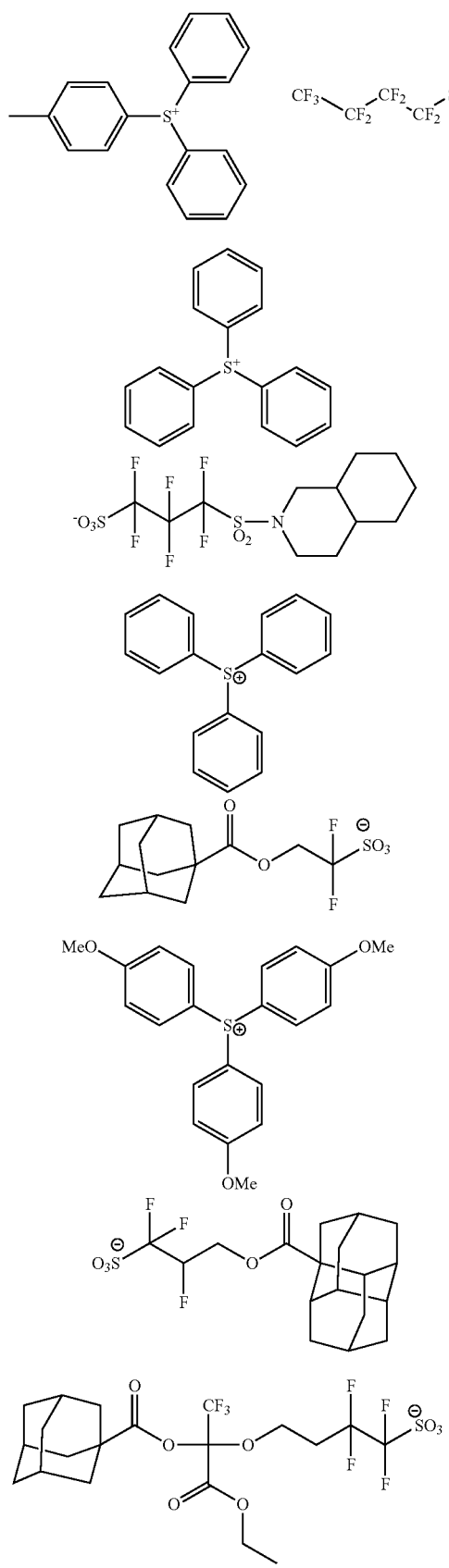

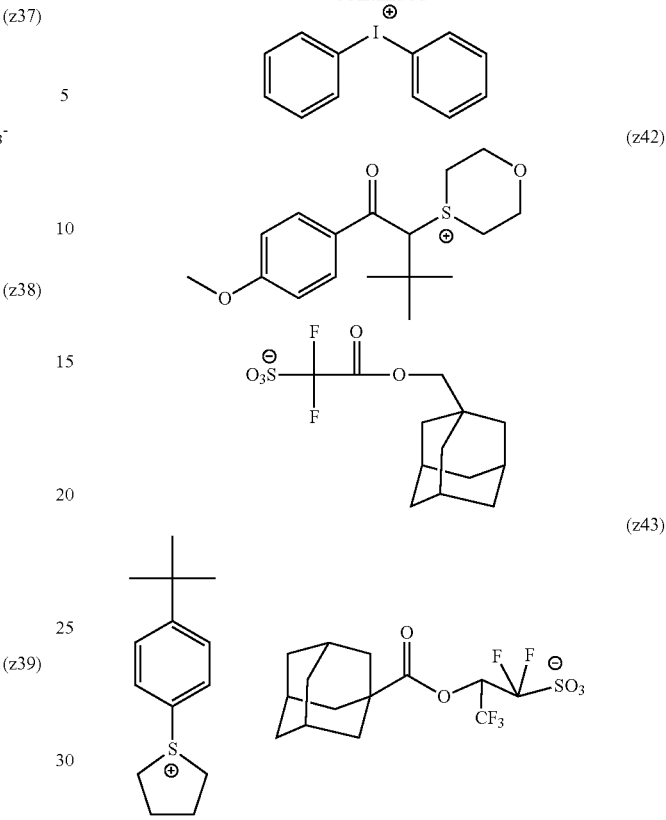

The photoacid generator may be used singly, or two or more kinds thereof may be used in combination.

The content ratio of the photoacid generator in the actinic ray-sensitive or radiation-sensitive resin composition is preferably 0.1 to 50 mass %, more preferably 5 to 50 mass %, and even more preferably 8 to 40 mass % with respect to the total solid content of the composition. Particularly, in order to achieve both high sensitivity and high resolution in a case of the electron beam or extreme ultraviolet exposure, the content ratio of the photoacid generator is preferably high, more preferably 10 to 40 mass %, and most preferably 10 to 35 mass %.

<Solvent>

The actinic ray-sensitive or radiation-sensitive resin composition used in the present invention preferably includes a solvent (also referred to as a "resist solvent"). The solvent may include an isomer (a compound having the same number of atoms and different structures). Only one kind of isomers may be included, or a plurality of kinds of isomers may be included. The solvent preferably contains at least one of (M1) propylene glycol monoalkyl ether carboxylate or (M2) at least one selected from the group consisting of propylene glycol monoalkyl ether, lactic acid ester, acetic acid ester, alkoxypropionic acid ester, chain ketone, cyclic ketone, lactone, and alkylene carbonate. The solvent may further include a component in addition to the components (M1) and (M2).

The component (M1) is preferably at least one selected from the group consisting of propylene glycol monomethyl ether acetate, propylene glycol monomethyl ether propionate, and propylene glycol monoethyl ether acetate and particularly preferably propylene glycol monomethyl ether acetate.

The following is preferable as the component (M2).

As the propylene glycol monoalkyl ether, propylene glycol monomethyl ether and propylene glycol monoethyl ether are preferable.

As the lactic acid ester, ethyl lactate, butyl lactate, or propyl lactate is preferable.

Preferable examples of the acetic acid ester include methyl acetate, ethyl acetate, butyl acetate, isobutyl acetate, propyl acetate, isoamyl acetate, methyl formate, ethyl formate, butyl formate, propyl formate, and 3-methoxybutyl acetate.

Butyl butyrate is also preferable.

As the alkoxypropionic acid ester, methyl 3-methoxypropionate (MMP) or ethyl 3-ethoxypropionate (EEP) is preferable.

As the chain ketone, 1-octanone, 2-octanone, 1-nonanone, 2-nonanone, acetone, 4-heptanone, 1-hexanone, 2-hexanone, diisobutyl ketone, phenyl acetone, methyl ethyl ketone, methyl isobutyl ketone, acetylacetone, acetonylacetone, ionone, diacetyl alcohol, acetyl carbinol, acetophenone, methyl naphthyl ketone, and methyl amyl ketone are preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

The component (M2) is more preferably propylene glycol monomethyl ether, ethyl lactate, ethyl 3-ethoxypropionate, methyl amyl ketone, cyclohexanone, butyl acetate, pentyl acetate, γ-butyrolactone, or propylene carbonate.

In addition to the above components, an ester-based solvent having 7 or more carbon atoms (preferably 7 to 14 carbon atoms, more preferably 7 to 12 carbon atoms, and even more preferably 7 to 10 carbon atoms) and having 2 or less hetero atoms is preferably used.

Preferable examples of the ester-based solvent having 7 or more carbon atoms and having 2 or less hetero atoms include amyl acetate, 2-methylbutyl acetate, 1-methylbutyl acetate, hexyl acetate, pentyl propionate, hexyl propionate, butyl propionate, isobutyl propionate, heptyl propionate, and butyl butanoate, and isoamyl acetate is particularly preferably used.

As the component (M2), a component having a flash point (hereinafter also referred to as fp) of 37° C. or higher is preferably used. Preferable examples of the component (M2) include propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), and propylene carbonate (fp: 132° C.). Among these, propylene glycol monoethyl ether, ethyl lactate, pentyl acetate, or cyclohexanone are more preferable, and propylene glycol monoethyl ether or ethyl lactate is particularly preferable. Here, the "flash point" means a value disclosed in a reagent catalog of Tokyo Chemical Industry Co., Ltd. or Sigma-Aldrich Co. LLC.

It is preferable that the solvent contains the component (M1). It is more preferable that the solvent is substantially formed only of the component (M1) or a mixed solvent of the component (M1) and other components. In the latter case, it is more preferred that the solvent contains both of the components (M1) and (M2).

The mass ratio of the components (M1) and (M2) is preferably in the range of 100:0 to 15:85, more preferably in the range of 100:0 to 40:60, and even more preferably in the range of 100:0 to 60:40. That is, it is preferable that the solvent is formed only of the component (M1), or both of the components (M1) and (M2), and the mass ratio thereof is as follows. That is, in the latter case, the mass ratio of the component (M1) to the component (M2) is preferably 15/85 or more, more preferably 40/60 or more, and even more preferably 60/40 or more. In a case where the configuration is employed, the number of development defects can be further reduced.

In a case where the solvent includes both of the components (M1) and (M2), the mass ratio of the component (M1) to the component (M2) is, for example, 99/1 or less.

As described above, the solvent may further contain components in addition to the components (M1) and (M2). In this case, the content of the components in addition to the components (M1) and (M2) is preferably in the range of 5 mass % to 30 mass % with respect to the total amount of the solvent.

The concentration of solid contents of the actinic ray-sensitive or radiation-sensitive resin composition can be appropriately adjusted for the purpose of adjusting the thickness of the manufactured actinic ray-sensitive or radiation-sensitive film.

<Basic Compound>

The actinic ray-sensitive or radiation-sensitive resin composition according to the embodiment of the present invention preferably contains a basic compound in order to reduce the performance change due to the elapse of time from exposure to heating.

Preferable examples of the basic compound include compounds having structures represented by Formulae (A) to (E).

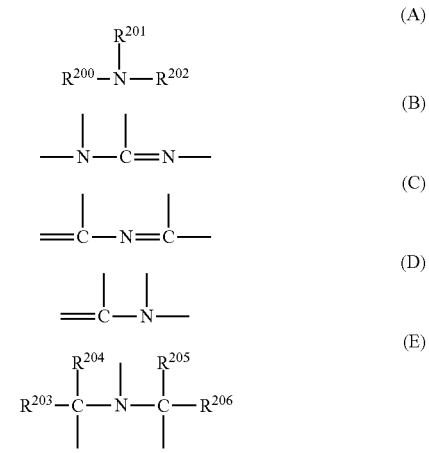

In Formulae (A) and (E), $R^{200}$, $R^{201}$, and $R^{202}$ may be identical to or different from each other, and represent hydrogen atoms, alkyl groups (preferably having 1 to 20 carbon atoms), cycloalkyl groups (preferably having 3 to 20 carbon atoms), or aryl groups (preferably having 6 to 20 carbon atoms). Here, $R^{201}$ and $R^{202}$ may be bonded to each other to form a ring.

With respect to the alkyl group, the alkyl group having the substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be identical to or different from each other, and each represent an alkyl group having 1 to 20 carbon atoms.

The alkyl groups in General Formulae (A) and (E) are preferably unsubstituted.

Preferable examples of the compounds include guanidine, aminopyrrolidine, pyrazole, pyrazoline, piperazine, aminomorpholine, aminoalkylmorpholine, and piperidine. More preferable examples of the compound include compounds having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond.

Preferable examples of the basic compound include an amine compound having a phenoxy group, and an ammonium salt compound having a phenoxy group.

As the amine compound, a primary, secondary, or tertiary amine compound can be used, and an amine compound in which at least one alkyl group is bonded to a nitrogen atom is preferable. The amine compound is more preferably a tertiary amine compound. With respect to the amine compound, as long as at least one alkyl group (preferably having from 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

It is preferable that the amine compound has an oxygen atom in the alkyl chain, and an oxyalkylene group is formed. The number of the oxyalkylene group is 1 or more, preferably 3 to 9, and more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. With respect to the ammonium salt compound, as long as at least one alkyl group (preferably having 1 to 20 carbon atoms) is bonded to the nitrogen atom, in addition to the alkyl group, a cycloalkyl group (preferably having 3 to 20 carbon atoms) or an aryl group (preferably having 6 to 12 carbon atoms) may be bonded to a nitrogen atom.

It is preferable that the ammonium salt compound has an oxygen atom in the alkyl chain to form an oxyalkylene group. The number of the oxyalkylene groups is 1 or more, preferably 3 to 9, and more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of the anion of the ammonium salt compound include a halogen atom, sulfonate, borate, and phosphate, but among these, a halogen atom and sulfonate are preferable. As the halogen atom, chloride, bromide, and iodide are particularly preferable. As the sulfonate, an organic sulfonate having 1 to 20 carbon atoms is particularly preferable.

The amine compound having a phenoxy group can be obtained by heating a primary or secondary amine having a phenoxy group and haloalkyl ether to react with other, adding an aqueous solution of a strong base such as sodium hydroxide, potassium hydroxide, and tetraalkylammonium, and performing extraction with an organic solvent such as ethyl acetate and chloroform. Alternatively, the amine compound having a phenoxy group can be obtained by heating a primary or secondary amine and haloalkyl ether having a phenoxy group at a terminal to react with each other, adding an aqueous solution of a strong base such as sodium hydroxide, potassium hydroxide, and tetraalkylammonium, and performing extraction with an organic solvent such as ethyl acetate and chloroform.

As specific examples of the basic compound, those disclosed in paragraphs 0237 to 0294 of WO2015/178375A can be referred to, and the contents thereof are incorporated into the present specification. (Compound (PA) that generates a compound which has a proton acceptor functional group and is decomposed due to irradiation with actinic rays or radiation and in which proton acceptor properties decrease or disappear or proton acceptor properties change to acidity).

The actinic ray-sensitive or radiation-sensitive resin composition may further include a compound [hereinafter, also referred to as the "compound (PA)"] that generates a compound which has a proton acceptor functional group and is decomposed due to irradiation with actinic rays or radiation and in which proton acceptor properties decrease or disappear or proton acceptor properties change to acidity as the basic compound.

The proton acceptor functional group is a group that can electrostatically interact with a proton or a functional group having an electron and means, for example, a functional group having a macrocyclic structure such as cyclic polyether or a functional group having a nitrogen atom having an unshared electron pair that does not contribute to π conjugation. The nitrogen atom having an unshared electron pair that does not contribute to π conjugation is, for example, a nitrogen atom having a partial structure represented by the following formula.

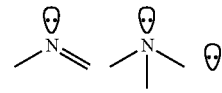

Unshared Electron Pair

Examples of preferable partial structures of the proton acceptor functional group include crown ether, azacrown ether, primary to tertiary amine, pyridine, imidazole, and pyrazine structures.

The compound (PA) is decomposed due to the irradiation with an actinic ray or radiation to generate a compound in which proton acceptor properties decrease or disappear or proton acceptor properties change to acidity. Here, the decrease or disappearance of the proton acceptor properties or the change from proton acceptor properties to acidity is a change in the proton acceptor properties due to the addition of a proton to the proton acceptor functional group, and specifically means that, in a case where a proton adduct is generated from the compound (PA) having a proton acceptor functional group and a proton, an equilibrium constant in the chemical equilibrium thereof decreases.

Specific examples of the compound (PA) include the following compounds. As specific examples of the compound (PA), for example, those disclosed in paragraphs 0421 to 0428 of JP2014-041328A and paragraphs 0108 to 0116 of JP2014-134686A can be referred to, and the content thereof is incorporated into the present specification.

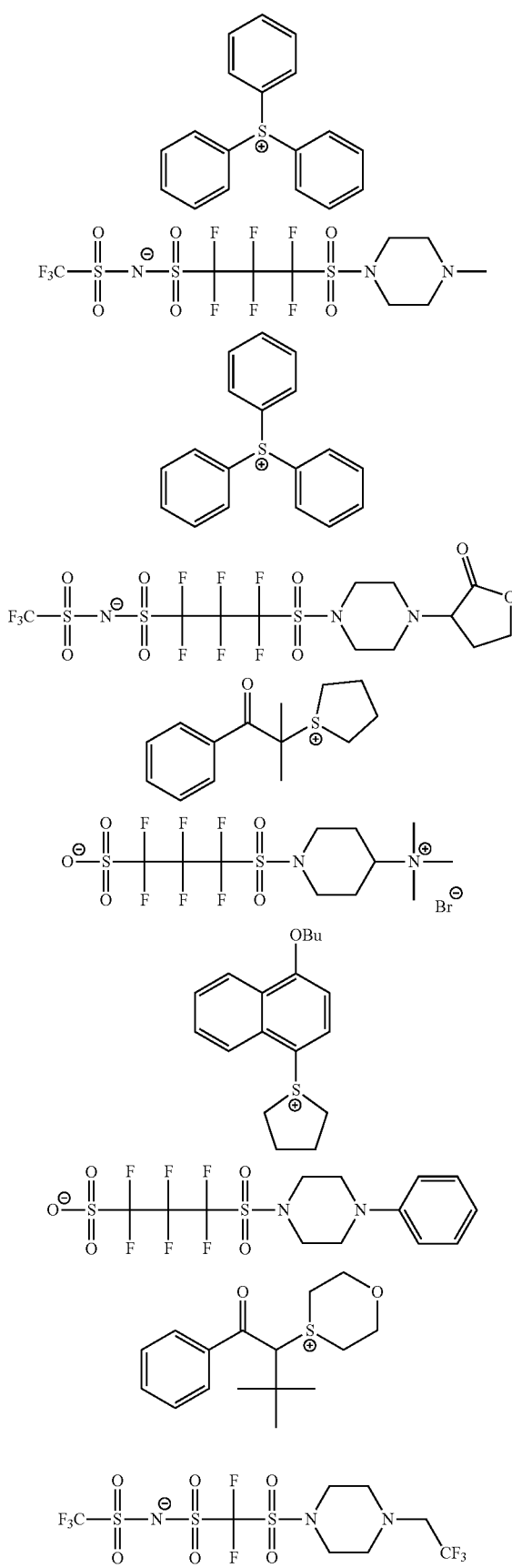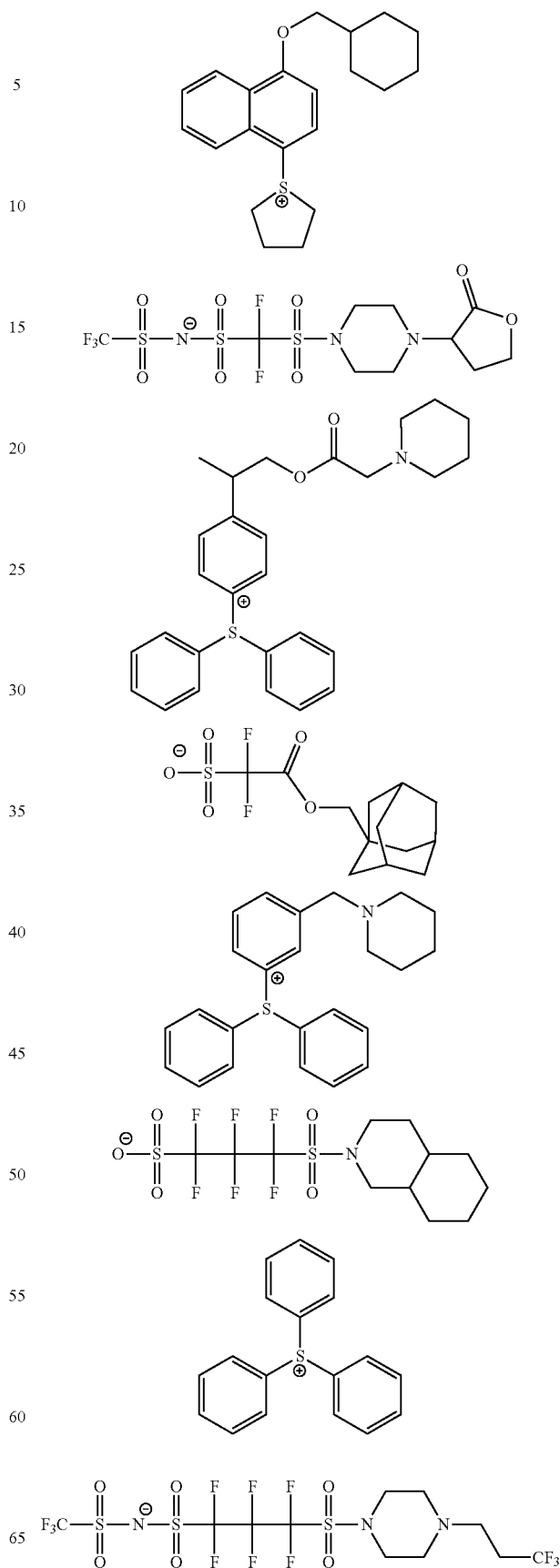
-continued

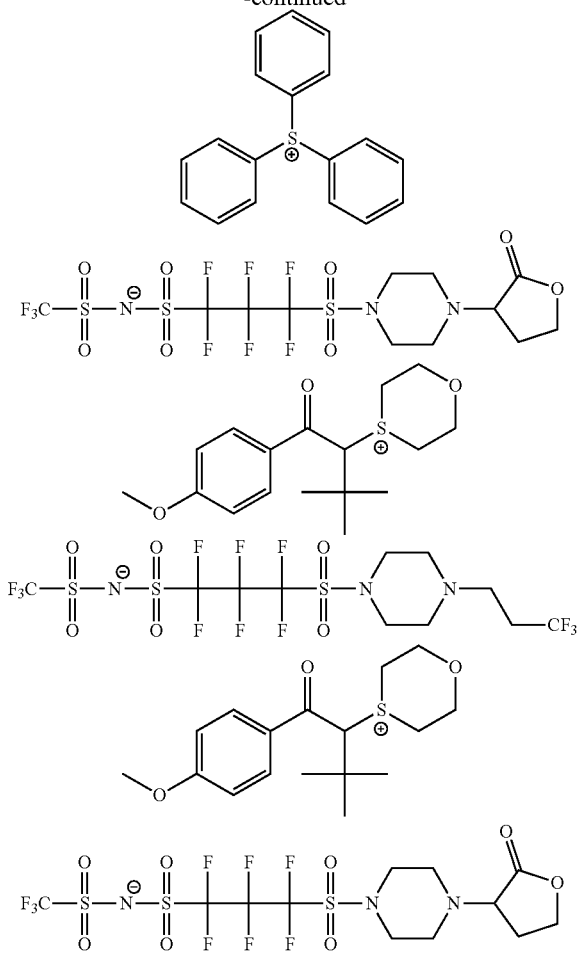

The basic compound is used singly or two or more kinds thereof are used in combination.

The use amount of the basic compound is generally 0.001 to 10 mass % and preferably 0.01 to 5 mass % based on the solid content of the actinic ray-sensitive or radiation-sensitive resin composition.

The use ratio of the acid generator and the basic compound in the composition preferably satisfies the acid generator/the basic compound (molar ratio)=2.5 to 300. That is, in view of sensitivity and resolution, the molar ratio is preferably 2.5 or more, and is preferably 300 or less in view of suppression of resolution reduction due to thickening of the resist pattern in the elapse of time after exposure to heat treatment. The acid generator/basic compound (molar ratio) is more preferably 5.0 to 200 and even more preferably 7.0 to 150.

As the basic compound, for example, compounds (amine compound, amide group-containing compound, urea compound, and nitrogen-containing heterocyclic compound) disclosed in paragraphs 0140 to 0144 of JP2013-011833A can be used.

<Hydrophobic Resin>

The resist composition according to the embodiment of the present invention may further contain a hydrophobic resin different from the resin (A).

It is preferable that the hydrophobic resin is designed to be unevenly distributed on the surface of the actinic ray-sensitive or radiation-sensitive film, but, differently from the surfactant, a hydrophilic group does not need to be included in the molecule and may not contribute to the even mixture of the polar/non-polar materials.

Examples of the effect of adding the hydrophobic resin include control a static/dynamic contact angle of an actinic ray-sensitive or radiation-sensitive film surface against water, and the suppression of outgas sing.

In view of the uneven distribution on the film surface layer, the hydrophobic resin preferably includes any one or more kinds of a "fluorine atom", a "silicon atom", or a "$CH_3$ partial structure contained in a side chain portion of the resin" and more preferably includes two or more kinds thereof. It is preferable that the hydrophobic resin contains a hydrocarbon group having 5 or more carbon atoms. These groups may be present in the main chain of the resin or may be substituted on the side chain.

In a case where the hydrophobic resin includes a fluorine atom and/or a silicon atom, the fluorine atom and/or the silicon atom in the hydrophobic resin may be included in the main chain of the resin and may be included in the side chain.

In the case where the hydrophobic resin includes a fluorine atom, the partial structure having a fluorine atom is preferably a resin having an alkyl group having a fluorine atom, a cycloalkyl group having a fluorine atom, or an aryl group having a fluorine atom.

The alkyl group (preferably having 1 to 10 carbon atoms and more preferably having 1 to 4 carbon atoms) having a fluorine atom is a linear or branched alkyl group in which at least one hydrogen atom is substituted with a fluorine atom and may further have a substituent in addition to the fluorine atom.

The cycloalkyl group having a fluorine atom is a monocyclic or polycyclic cycloalkyl group in which at least one hydrogen atom is substituted with a fluorine atom and may further have a substituent in addition to the fluorine atom.

Examples of the aryl group having a fluorine atom include an aryl group in which at least one hydrogen atom of an aryl group such as a phenyl group or a naphthyl group is substituted with a fluorine atom, and the aryl group may further have a substituent in addition to the fluorine atom.

Examples of the repeating units having a fluorine atom or a silicon atom include repeating units exemplified in paragraph 0519 of US2012/0251948A1.

As described above, it is also preferable that the hydrophobic resin includes a $CH_3$ partial structure in the side chain moiety.

Here, the $CH_3$ partial structure of the side chain moiety in the hydrophobic resin includes the $CH_3$ partial structure included in the ethyl group, the propyl group, or the like.

Meanwhile, a methyl group directly bonded to the main chain of the hydrophobic resin (for example, an α-methyl group of a repeating unit having a methacrylic acid structure) is not included in the $CH_3$ partial structure in the present invention because contribution to uneven distribution on the surface of the hydrophobic resin is small due to the influence of the main chain.

With respect to the hydrophobic resin, the description of [0348] to [0415] of JP2014-010245A can be referred to, and the contents thereof are incorporated into the present specification.

As the hydrophobic resin, those disclosed in JP2011-248019A, JP2010-175859A, and JP2012-032544A can also be preferably used.

In a case where the actinic ray-sensitive or radiation-sensitive resin composition contains a hydrophobic resin, the content ratio of the hydrophobic resin is preferably 0.01 to 20 mass %, more preferably 0.01 to 10 mass %, even more preferably 0.05 to 8 mass %, and particularly preferably 0.5 to 5 mass % with respect to the total solid content of the actinic ray-sensitive or radiation-sensitive resin composition.

<Surfactant>

The actinic ray-sensitive or radiation-sensitive resin composition according to the embodiment of the present invention may further include a surfactant. In a case where the surfactant is contained, in a case where an exposure light source having a wavelength of 250 nm or lower, particularly 220 nm or lower is used, a pattern having excellent adhesiveness and fewer development defects can be formed at favorable sensitivity and resolutions.

As the surfactant, it is particularly preferable to use a fluorine-based and/or silicon-based surfactant.

Examples of the fluorine-based and/or silicon-based surfactants include surfactants disclosed in paragraph [0276] of US2008/0248425A. EFTOP EF301 or EF303 (manufactured by Mitsubishi Materials Electronic Chemicals Co., Ltd.); FLUORAD FC430, 431, or 4430 (manufactured by Sumitomo 3M Limited); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.), SURFLON S-393 (manufactured by AGC SEIMI CHEMICAL CO., LTD.), EFTOP EF121, EF122A, EF122B, RF122C, EF125M, EF135M, EF351, EF352, EF801, EF802, or EF601 (manufactured by Mitsubishi Materials Electronic Chemicals Co., Ltd.); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS Company Limited). Polysiloxane polymer KP-341 (manufactured by Shin-Etsu Chemical Co., Ltd.) can also be used as the silicon-based surfactant.

In addition to the well-known surfactants as described above, the surfactant is synthesized with a fluoroaliphatic compound manufactured by a telomerization method (also referred to as a telomer method) or an oligomerization method (also referred to as an oligomer method). Specifically, a polymer comprising a fluoroaliphatic group derived from the fluoroaliphatic compound may be used as a surfactant. This fluoroaliphatic compound can be synthesized, for example, by the method described in JP2002-090991A.

The surfactants other than the fluorine-based and/or silicon-based surfactants disclosed in [0280] of US2008/0248425A may be used.

These surfactants may be used singly or two or more kinds thereof may be used in combination.

In a case where the actinic ray-sensitive or radiation-sensitive resin composition includes a surfactant, the content ratio thereof is preferably 0.0001 to 2 mass % and more preferably 0.0005 to 1 mass % with respect to the total solid content of the composition.

<Other additives>

The actinic ray-sensitive or radiation-sensitive resin composition according to the embodiment of the present invention In the composition of the embodiment of the present invention, if necessary, a dissolution inhibiting compound, a dye, a plasticizer, a photosensitizer, a light absorber, and/or a compound (for example, a phenol compound having a molecular weight of 1,000 or lower, alicyclic or aliphatic compound having a carboxy group) that promotes solubility in the developer.

The actinic ray-sensitive or radiation-sensitive resin composition may further include a dissolution inhibiting compound. Here, the "dissolution inhibiting compound" is a compound having a molecular weight of 3,000 or less, which is decomposed by the action of an acid to reduce solubility thereof in an organic developer.

The embodiment of the pattern forming method according to the embodiment of the present invention is described below.

[Pattern Forming Method]

The pattern forming method according to the embodiment of the present invention includes an actinic ray-sensitive or radiation-sensitive film forming step of forming an actinic ray-sensitive or radiation-sensitive film including an actinic ray-sensitive or radiation-sensitive resin composition according to the embodiment of the present invention;

an exposure step of exposing the actinic ray-sensitive or radiation-sensitive film; and a development step of developing the exposed actinic ray-sensitive or radiation-sensitive film with a developer.

<Actinic Ray-Sensitive or Radiation-Sensitive Film Forming Step>

A step of forming an actinic ray-sensitive or radiation-sensitive film is a step of forming the actinic ray-sensitive or radiation-sensitive film (resist film) with the actinic ray-sensitive or radiation-sensitive resin composition, and, for example, the step can be performed by the following method.

In order to form an actinic ray-sensitive or radiation-sensitive film on a substrate with the actinic ray-sensitive or radiation-sensitive resin composition, the respective components are dissolved in a solvent, the actinic ray-sensitive or radiation-sensitive resin composition is prepared, filter filtration is performed, if necessary, and the substrate is coated. It is preferable that the filter is a filter made of polytetrafluoroethylene, polyethylene, or nylon which has a pore diameter of 0.1 μm or lower, more preferably 0.05 μm or lower, and even more preferably 0.03 μm or lower.

The actinic ray-sensitive or radiation-sensitive resin composition is applied by a suitable coating method such as spinner onto a substrate (for example, silicon and silicon dioxide coating) as used in the manufacture of integrated circuit elements. Thereafter, the actinic ray-sensitive or radiation-sensitive resin composition is preferably dried so as to form the actinic ray-sensitive or radiation-sensitive film. If necessary, various underlying films (inorganic film, organic film, and antireflection film) may be formed on an underlayer the actinic ray-sensitive or radiation-sensitive film.

As the drying method, a method of heating and drying is generally used. The heating can be performed by means included in general exposing and developing machines and may be performed by using a hot plate or the like. The heating temperature is preferably 80° C. to 150° C., more preferably 80° C. to 140° C., and even more preferably 80° C. to 130° C. The heating time is preferably 30 to 1,000 seconds, more preferably 60 to 800 seconds, and more preferably 60 to 600 seconds.

The film thickness of the actinic ray-sensitive or radiation-sensitive film is preferably 5 nm to 80 nm. The actinic ray-sensitive or radiation-sensitive film having a film thickness in the range of 5 nm to 80 nm is preferable since the resist performance can be suitably expressed. The repeating unit (a) contained in the resin (A) used in the actinic ray-sensitive or radiation-sensitive resin composition according to the embodiment of the present invention has a large number of the phenolic hydroxyl groups which become a proton source of an acid, and thus even in a thin film having a film thickness of 5 nm which has the poor efficiency of the light absorption, an active acid can be efficiently generated. It is preferable that the film thickness is 80 nm or less, particularly in view of the pattern collapse performance, that is, the improvement of the resolution.

Here, the "film thickness" refers to a film thickness of an actinic ray-sensitive or radiation-sensitive film after the actinic ray-sensitive or radiation-sensitive resin composition is applied to a substrate and dried and is defined as a film thickness of the actinic ray-sensitive or radiation-sensitive film measured before an additional treatment such as exposure is performed.

A film thickness of the actinic ray-sensitive or radiation-sensitive film is more preferably 5 nm to 60 nm and even more preferably 15 nm to 45 nm.

In the pattern forming method according to the embodiment of the present invention, an upper layer film (topcoat) may be formed on the upper layer of the resist film. It is preferable that the topcoat is not be mixed with the resist film and can be uniformly applied to the upper layer of the resist film.

<Composition for Forming Upper Layer Film>

A composition (composition for forming topcoat) for forming an upper layer film is described.

It is preferable that the topcoat is not be mixed with the resist film and can be uniformly applied to the upper layer of the resist film. The thickness of the topcoat is preferably 10 to 200 nm, more preferably 20 to 100 nm, and particularly preferably 40 to 80 nm.

The topcoat is not particularly limited, and a topcoat well-known in the related art can be formed by the well-known method in the related art. For example, the topcoat can be formed based on the disclosure of paragraphs 0072 to 0082 of JP2014-059543A.

<Exposure Step>

The exposure step is a step of exposing the resist film and can be performed, for example, by the following method.

The resist film formed as above is irradiated with an actinic ray or radiation through a predetermined mask In electron beam irradiation, drawing (direct drawing) without a mask is common.

The actinic ray or radiation is not particularly limited, and examples thereof include a KrF excimer laser, an ArF excimer laser, extreme ultraviolet (EUV), and an electron beam (EB), extreme ultraviolet, or an electron beam is particularly preferable. The exposure may be immersion exposure.

<Baking>

In the pattern forming method according to the embodiment of the present invention, it is preferable to perform baking (Post Exposure Bake: PEB) after the exposure and before the development is performed. The reaction of the exposed portion is promoted by baking, and sensitivity or a pattern shape becomes more satisfactory.

The heating temperature is preferably from 80° C. to 150° C., more preferably 80° C. to 140° C., and even more preferably from 80° C. to 130° C.

The heating time is preferably 30 to 1,000 seconds, more preferably 60 to 800 seconds, and more preferably 60 to 600 seconds.

The heating can be performed by means included in general exposing and developing machines and may be performed by using a hot plate or the like.

<Development Step>

A development step is a step of developing the exposed resist film with a developer.

As the developing method, for example, a method of immersing a substrate in a tank filled with a developer for a predetermined period of time (dipping method), a developing method by raising the developer on the surface of a substrate by surface tension and leaving the developer to stand for a predetermined period of time (puddle method), a method of spraying a developer to the surface of a substrate (spraying method), and a method of continuously jetting a developer while scanning a developer jetting nozzle at a constant speed on a substrate spinning at a constant speed (dynamic dispensing method) can be applied.

After the step of developing, a step of stopping development may be carried out while substituting with another solvent.

The development time is not particularly limited as long as the resin in the exposed portion or the unexposed portion is sufficiently dissolved for the period of time, and the development time is usually 10 to 300 seconds and preferably 10 to 120 seconds.

The temperature of the developer is preferably 0° C. to 50° C. and more preferably 15° C. to 35° C.

(Developer)

The developer may be an alkali developer and may be a developer (organic developer) that contains an organic solvent.

—Alkali Developer—

As the alkali developer, for example, an alkali aqueous solution of inorganic alkali such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyl diethylamine, alcohol amines such as dimethylethanol amine and triethanol amine, tetraalkyl ammonium hydroxide such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyl trimethyl ammonium hydroxide, butyl trimethyl ammonium hydroxide, methyl triamyl ammonium hydroxide, and dibutyl dipentyl ammonium hydroxide, quaternary ammonium salt such as dimethylbis(2-hydroxyethyl) ammonium hydroxide, trimethylphenylammonium hydroxide, trimethylbenzylammonium hydroxide, and triethylbenzylammonium hydroxide, and cyclic amines such as pyrrole and piperidine can be used.

Alcohols and a surfactant may be added to the alkali aqueous solution in an appropriate amount for use.

The alkali concentration of the alkali developer is generally 0.1 to 20 mass %.

pH of the alkali developer is generally 10.0 to 15.0.

As the alkali developer, a 2.38 mass % aqueous solution of tetramethylammonium hydroxide is particularly desirable.

—Organic Developer—

Next, the organic solvent included in the organic developer is described.

The vapor pressure of the organic solvent (vapor pressure as a whole in a case of a mixed solvent) at 20° C. is preferably 5 kPa or less, more preferably 3 kPa or less, and particularly preferably 2 kPa or less. In a case where the vapor pressure of the organic solvent is 5 kPa or lower, the evaporation of the developer on the substrate or in a development cup is suppressed, and thus the temperature uniformity in the wafer surface increases, and as a result, the dimension uniformity in the wafer surface improves.

Various organic solvents are widely used as the organic solvent used in the organic developer, and for example, a solvent such as an ester-based solvent, a ketone-based solvent, an alcohol-based solvent, an amide-based solvent, an ether-based solvent, and a hydrocarbon-based solvent can be used.

Specific examples of these organic solvents are the same as those described above as the solvent (2) contained in the treatment liquid.

With respect to the organic solvent included in the organic developer, compared with a case where EUV light and EB is used in the exposure step, in view of suppressing the swelling of the resist film, the number of carbon atoms is 7 or more (preferably 7 to 14, more preferably 7 to 12, and even more preferably 7 to 10), and it is preferable to use an ester-based solvent having 2 or less hetero atoms.

The hetero atom of the ester-based solvent is an atom in addition to the carbon atom and the hydrogen atom, and examples thereof include an oxygen atom, a nitrogen atom, and a sulfur atom. The number of hetero atoms is preferably 2 or less.

Preferable examples of the ester-based solvent having 7 or more carbon atoms and 2 or less hetero atoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and it is particularly preferable to use isoamyl acetate.

With respect to the organic solvent included in the organic developer, in a case where EUV light and EB are used in the above exposure step, instead of an ester-based solvent having 7 or more carbon atoms and 2 or less hetero atoms, a mixed solvent of the ester-based solvent and the hydrocarbon-based solvent or a mixed solvent of the ketone-based solvent and the hydrocarbon-based solvent may be used. This case is also effective to suppress swelling of the resist film.

In a case where an ester-based solvent and a hydrocarbon-based solvent are used in combination, it is preferable to use isoamyl acetate as the ester-based solvent. As the hydrocarbon-based solvent, in view of adjusting the solubility of the resist film, it is preferable to use a saturated hydrocarbon solvent (for example, octane, nonane, decane, dodecane, undecane, or hexadecane).

In a case where a ketone-based solvent and a hydrocarbon-based solvent are used in combination, it is preferable to use 2-heptanone as a ketone-based solvent. As the hydrocarbon-based solvent, in view of adjusting the solubility of the resist film, it is preferable to use a saturated hydrocarbon solvent (for example, octane, nonane, decane, dodecane, undecane, or hexadecane).

In the case of using the above mixed solvent, the content of the hydrocarbon-based solvent is not particularly limited, since the content depends on the solvent solubility of the resist film, and the content of the hydrocarbon-based solvent is appropriately adjusted to determine the necessary amount.

The plurality of kinds of the organic solvents may be mixed or may be mixed with a solvent other than the above or water. In order to sufficiently obtain the effect of the present invention, the moisture content of the developer as a whole is preferably less than 10 mass %, and it is more preferable that substantially no moisture is contained. The concentration of the organic solvent (sum in the case of a plurality of organic solvents are mixed) in the developer is preferably 50 mass % or more, more preferably 50 to 100 mass %, even more preferably 85 to 100 mass %, still even more preferably 90 to 100 mass %, and particularly preferably 95 to 100 mass %. A case of substantially consisting only of an organic solvent is most preferable. The case of substantially consisting only of an organic solvent includes the case of containing a minute amount of a surfactant, an antioxidant, a stabilizer, and an antifoaming agent.

The developer preferably contains an antioxidant. As a result, the temporal generation of the oxidizing agent can be suppressed, and the content of the oxidizing agent can be further reduced. As the antioxidant, well-known antioxidants can be used, but in a case where an antioxidant is used for the semiconductor applications, an amine-based antioxidant and a phenol-based antioxidant are preferably used.

The content of the antioxidant is not particularly limited, but is preferably 0.0001 to 1 mass %, more preferably 0.0001 to 0.1 mass %, and still more preferably 0.0001 to 0.01 mass % with respect to the total mass of the developer. In a case where the content is 0.0001 mass % or more, a more excellent antioxidant effect can be obtained, and in a case where the content is 1 mass % or less, there is a tendency in that the development residues can be suppressed.

The developer may contain a basic compound, and specifically, examples thereof include a compound which is the same as the basic compound which may be contained in a resist composition.

The developer may contain a surfactant. In a case where the developer contains a surfactant, the wettability to the resist film is improved, and the development more effectively proceeds.

As the surfactant, the same surfactant contained in the actinic ray-sensitive or radiation-sensitive resin composition can be used.

In a case where the developer contains a surfactant, the content of the surfactant is preferably 0.001 to 5 mass %, more preferably 0.005 to 2 mass %, and more preferably 0.01 to 0.5 mass % with developer the total mass of the developer.

As the developing method, for example, a method of immersing a substrate in a tank filled with a developer for a predetermined period of time (dipping method), a developing method by raising the developer on the surface of a substrate by surface tension and leaving the developer to stand for a predetermined period of time (puddle method), a method of spraying a developer to the surface of a substrate (spraying method), and a method of continuously jetting a developer while scanning a developer jetting nozzle at a constant speed on a substrate spinning at a constant speed (dynamic dispensing method) can be applied.

After the development step, a step of stopping development may be performed while the solvent is substituted with another solvent.

The development time is not particularly limited, and is generally 10 to 300 seconds and preferably 20 to 120 seconds.

The temperature of the developer is preferably 0° C. to 50° C. and more preferably 15° C. to 35° C.

As the developer used in the development step, both of the development using a developer containing an organic solvent and the development with an alkali developer may be performed (so-called double development may be performed).

In pattern forming method according to the embodiment of the present invention, the developer may include a treatment liquid of the present invention, and in this case, the treatment liquid is preferably a developer.

<Rinsing Step>

The pattern forming method according to the embodiment of the present invention may include a rinsing step after a development step.

In the rinsing step, the wafer that has been developed is subjected to a washing treatment by using a rinsing solution.

The method of washing treatment is not particularly limited, and for example, a method of continuously jetting the rinsing solution to the substrate spinning at a constant speed (spin jetting method), a method of immersing a substrate in a tank filled with the rinsing solution for a predetermined period of time (dipping method), a method of spraying a rinsing solution to the surface of a substrate (spraying method), and the like can be applied. Among these, it is preferable that a washing treatment is performed by a spin jetting method, and after washing, the substrate is spun at a rotation speed of 2,000 rpm to 4,000 rpm, to remove the rinsing solution from the substrate.

The rinsing time is not particularly limited, but is preferably 10 seconds to 300 seconds, more preferably 10 seconds to 180 seconds, and most preferably 20 seconds to 120 seconds.

The temperature of the rinsing solution is preferably 0° C. to 50° C. and more preferably 15° C. to 35° C.

After the developing treatment or the rinsing treatment, a treatment of removing the developer or the rinsing solution deposited to the pattern by a supercritical fluid can be performed.

After the developing treatment, a rinsing treatment, or a treatment by a supercritical fluid, a heat treatment can be performed in order to remove the solvent remaining in the pattern. The heating temperature is not particularly limited as long as a good resist pattern can be obtained, and is generally 40° C. to 160° C. The heating temperature is preferably 50° C. to 150° C. and most preferably 50° C. to 110° C. The heating time is not particularly limited as long as a good resist pattern can be obtained, but it is usually 15 to 300 seconds and preferably 15 to 180 seconds.

(Rinsing Solution)

As the rinsing solution used in the rinsing treatment after the step of performing development with an alkali developer, pure water can be used, and an appropriate amount of a surfactant can be added to be used.

As the rinsing solution used in a rinsing treatment performed after the step of performing development with an organic developer, it is preferable to use a rinsing solution including an organic solvent, and as the organic solvent, at least one organic solvent selected from the group consisting of a hydrocarbon-based solvent, a ketone-based solvent, an ester-based solvent an alcohol-based solvent, an amide-based solvent, and an ether-based solvent is preferable.

The organic solvent contained in the rinsing solution is preferably at least one selected from a hydrocarbon-based solvent, an ether-based solvent, or a ketone-based solvent and more preferably is at least one selected from a hydrocarbon-based solvent or an ether-based solvent.

As the organic solvent included in the rinsing solution, an ether-based solvent can also be suitably used.

In addition to a glycol ether-based solvent containing a hydroxyl group, examples of the ether-based solvent include a glycol ether-based solvent not containing a hydroxyl group such as dipropylene glycol dimethyl ether, dipropylene glycol diethyl ether, diethylene glycol dimethyl ether, diethylene glycol diethyl ether, an aromatic ether solvent such as anisole and phenetole, a cyclic aliphatic ether-based solvent such as dioxane, tetrahydrofuran, tetrahydropyran, perfluoro-2-butyltetrahydrofuran, perfluorotetrahydrofuran, 1,4-dioxane, cyclopentyl isopropyl ether, cyclopentyl sec-butyl ether, cyclopentyl tert-butyl ether, cyclohexyl isopropyl ether, cyclohexyl sec-butyl ether, and cyclohexyl tert-butyl ether, an acyclic aliphatic ether-based solvent having a linear alkyl group such as di-n-propyl ether, di-n-butyl ether, and di-n-pentyl ether, and di-n-hexyl ether, and an acyclic aliphatic ether-based solvent having a branched alkyl group such as diisohexyl ether, methyl isopentyl ether, ethyl isopentyl ether, propyl isopentyl ether, diisopentyl ether, methyl isobutyl ether, ethyl isobutyl ether, propyl isobutyl ether, diisobutyl ether, diisopropyl ether, ethyl isopropyl ether, methyl isopropyl ether, and diisohexyl ether. Among these, in view of in-plane uniformity of a wafer, an acyclic aliphatic ether-based solvent having 8 to 12 carbon atoms is preferable, and an acyclic aliphatic ether-based solvent having 8 to 12 carbon atoms and having a branched alkyl group is more preferable. Diisobutyl ether, diisopentyl ether, or diisohexyl ether are particularly preferable.

Specific examples of these organic solvents are the same as those described above for the organic solvent contained in the developer.

The vapor pressure of the rinsing solution at 20° C. is preferably 0.05 kPa to 5 kPa, more preferably 0.1 kPa to 5 kPa, and most preferably 0.12 kPa to 3 kPa. In a case where the rinsing solution is a mixed solvent of a plurality of solvents, the vapor pressure as a whole is preferably within the above range. By setting the vapor pressure of the rinsing solution to 0.05 kPa to 5 kPa, temperature uniformity in the wafer surface is improved, swelling due to permeation of the rinsing solution is suppressed, dimensional uniformity in the wafer surface becomes satisfactory.

The organic solvent including the rinsing solution may be used singly or two or more kinds thereof may be used. In a case where two or more kinds thereof are included, examples thereof include a mixed solvent of undecane and diisobutyl ketone.

The rinsing solution may contain a surfactant. By causing the rinsing solution to contain the surfactant, there is a tendency in that the wettability to the resist film is improved, the rinse properties are improved, and the generation of a foreign matter is suppressed.

As the surfactant, the same surfactant as used in the actinic ray-sensitive or radiation-sensitive resin composition described below can be used.

In a case where the rinsing solution contains a surfactant, the content of the surfactant is preferably 0.001 to 5 mass %, more preferably 0.005 to 2 mass %, and more preferably 0.01 to 0.5 mass % with developer the total mass of the rinsing solution.

The rinsing solution may contain an antioxidant. The antioxidant that may be contained in the rinsing solution is the same as the antioxidant that may be contained in the developer.

In a case where the rinsing solution contains an antioxidant, the content of the antioxidant is not particularly limited, but is preferably 0.0001 to 1 mass %, more preferably 0.0001 to 0.1 mass %, and even more preferably 0.0001 to 0.01 mass % with respect to the total mass of the rinsing solution.

After the step of performing development with a developer including an organic solvent, a step of performing washing with a rinsing solution may be included, but in view of throughput (productivity), a step of performing washing with a rinsing solution may not be included.

As a treatment method not having a step of performing washing with a rinsing solution, for example, the description in [0014] to [0086] of JP2015-216403A can be referred to, and the content thereof is incorporated into the present specification.

As the rinsing solution, methyl isobutyl carbinol (MIBC) and a rinsing solution using the same liquid as the developer (particularly, butyl acetate) are also preferable.

<Storage Container>

As the organic solvent (also referred to as an organic treatment liquid) that can be used in the treatment liquid such as a developer and a rinsing solution, it is preferable to use an organic solvent stored in a storage container of an organic treatment liquid for patterning a chemically amplified resist film which has a storage portion. For example, this storage container is preferably a storage container of an organic treatment liquid for patterning the resist film in which an inner wall of a storage portion which is in contact with the organic treatment liquid is formed of a resin different from any of a polyethylene resin, a polypropylene resin, and a polyethylene-polypropylene resin or metal subjected to an anti-corrosion/metal elution prevention treatment. An organic solvent to be used as an organic treatment liquid for patterning the resist film is stored in the storage portion of the storage container, and in a case of patterning of the resist film, a liquid discharged from the storage portion can be used.

In the case where the storage container further has a seal portion for tightly closing the storage portion, it is preferable that the seal portion is also formed of a resin different from the one or more resins selected from the group consisting of a polyethylene resin, a polypropylene resin, and a polyethylene-polypropylene resin or metal subjected to anti-corrosion/metal elution prevention treatments.

Here, the seal portion means a member that can shield the storage portion from the outside air, and suitable examples thereof include packing and an O ring.

The resin that is different from the one or more resins selected from the group consisting of a polyethylene resin, a polypropylene resin, and a polyethylene-polypropylene resin is preferably a perfluoro resin.

Examples of the perfluoro resin include a tetrafluoroethylene resin (PTFE), an ethylene tetrafluoride/perfluoroalkyl vinyl ether copolymer (PFA), an ethylene tetrafluoride-hexafluoropropylene copolymer resin (FEP), an ethylene tetrafluoride-ethylene copolymer resin (ETFE), a trifluorochloroethylene-ethylene copolymer resin (ECTFE), a vinylidene fluoride resin (PVDF), a trifluorochloroethylene copolymer resin (PCTFE), and a fluorinated vinyl resin (PVF).

Particularly preferable examples of the perfluoro resin include a tetrafluoroethylene resin, an ethylene tetrafluoride/perfluoroalkyl vinyl ether copolymer, and an ethylene tetrafluoride-hexafluoropropylene copolymer resin.

Examples of the metals in the metal subjected to anti-corrosion/metal elution prevention treatments include carbon steel, alloy steel, nickel-chrome steel, nickel-chrome-molybdenum steel, chrome steel, chrome-molybdenum steel, and manganese steel.

It is preferable to apply a coating technique, as the anti-corrosion/metal elution prevention treatments.

The coating technique is roughly classified into three parts: metal coating (various kinds of plating), inorganic coating (various chemical conversion treatments, glass, concrete, ceramics, and the like), and organic coating (anti-corrosion oil, paint, rubber, and plastics).

As a preferable coating technique, surface treatments with anti-corrosion oil, a rust preventing agent, a corrosion inhibitor, a chelate compound, strippable plastic, and a lining agent are used.

Among them, a corrosion inhibitor such as various chromic acid salts, a nitric acid salt, a silicic acid salt, phosphoric acid salt, carboxylic acids such as oleic acid, dimer acid, and naphthenic acid, carboxylic acid metal soap, a sulfonic acid salt, an amine salt, and esters (glycerin ester and phosphoric acid ester of higher fatty acid) a chelate compound such as ethylenediamine tetraacetic acid, gluconic acid, nitrilotriacetic acid, hydroxyethyl ethylenediamine triacetic acid, and diethylenetriamine pentaacetic acid, and a fluororesin lining is preferable. A phosphoric acid salt treatment and fluororesin lining are particularly preferable.

Compared with a direct coating treatment, though corrosion is not directly prevented, it is preferable that the "pre-treatment" which is a step before the anti-corrosion treatment is performed is employed as a treatment method for extending the anti-corrosion period by a coating treatment.

As a specific example of the pre-treatment, treatments for removing various corrosion factors such as chloride or sulfate which exist on metal surfaces by washing or polishing are suitably used.

Specific examples of the storage container include the followings.

FluoroPurePFA composite drum manufactured by Entegris Inc. (liquid contact inner surface; PFA resin lining)

Steel drum manufactured by JFE CONTAINER Co., Ltd. (liquid contact inner surface; zinc phosphate film)

Examples of the storage container that can be used in the present invention include containers disclosed in [0013] to [0030] of JP1999-021393A (JP-H11-021393A) and [0012] to [0024] of JP1998-045961A (JP-H10-045961A).

A conductive compound may be added to the organic treatment liquid in order to prevent chemical liquid piping and various parts (such as filters, O-rings, or tubes) due to subsequently occurring static electricity discharge which from being broken. The conductive compound is not particularly limited, but examples thereof include methanol. The addition amount is not particularly limited, and in view of maintaining preferable development characteristics, the addition amount is preferably 10 mass % or less and more preferably 5 mass % or less. With respect to the members of the chemical liquid piping, it is possible to use stainless steel (SUS) or various kinds of piping coated with polyethylene, polypropylene, and a fluororesin (such as polytetrafluoroethylene and perfluoroalkoxy resins) which are subjected to an antistatic treatment. In the same manner, polyethylene, polypropylene, and a fluororesin (such as polytetrafluoroethylene and perfluoroalkoxy resins) subjected to an antistatic treatment can also be used for filters and O-rings.

Generally, the developer and the rinsing solution are stored in a waste liquid tank through piping after use. In this case, in a case where a hydrocarbon-based solvent is used as the rinsing solution, in order to prevent the resist dissolved in the developer from precipitating and adhering to a rear surface of a wafer, a side surface of piping, or the like, a method of causing a solvent which dissolves the resist to pass through piping may be used. Examples of the method of passing through the piping include a method of washing a rear surface of a side surface of a substrate after washing with a rinsing solution with a solvent which dissolves a resist and flowing the rinsing solution or a method of flowing a solvent which dissolves a resist through the piping without causing the solvent to come into contact with the resist.

The solvent that passes through the piping is not particularly limited, as long as the solvent can dissolve the resist, examples thereof include the organic solvents described above, and propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, and acetone can be used. Among these, preferably, PGMEA, PGME, and cyclohexanone can be used.

A semiconductor fine circuit, an imprint mold structure, a photo mask, and the like can be manufactured by using the pattern that can be obtained by the pattern forming method according to the embodiment of the present invention as a mask and appropriately performing an etching treatment, ion implantation, and the like.

The pattern formed by the method can be used in the guide pattern formation (for example, see ACS Nano Vol. 4, No. 8 Page 4815 to 4823) in Directed Self-Assembly (DSA). The pattern formed, for example, by the above method can be used as a core of a spacer process disclosed in JP1991-270227A (JP-H03-270227A) and JP2013-164509A.

A process in a case where an imprint mold is created by the pattern forming method according to the embodiment of the present invention is disclosed, for example, in JP4109085B, JP2008-162101A, and "Nanoimprint fundamentals and technology development •application development—substrate technology of nanoimprint and the latest technology development—edited by: Yoshihiko Hirai (Frontier Publishing)".

A photo mask manufactured by using the pattern forming method according to the embodiment of the present invention may be a light transmission type mask used in ArF excimer laser and the like or may be a light reflection type mask used in reflection type lithography in which EUV light is used as a light source.

The present invention also relates to a method of manufacturing an electronic device including the pattern forming method according to the embodiment of the present invention.

The electronic device manufactured by the method of manufacturing the electronic device according to the embodiment of the present invention can be suitably mounted on electric or electronic apparatuses (household electric devices, office appliance (OA)•media-related apparatuses, optical apparatuses, and telecommunication apparatuses).

EXAMPLES

Hereinafter, the present invention will be described in more detail with reference to examples, but the present invention is not limited thereto.

<Synthesis of Resin (A)>

Synthesis Example: Synthesis of Resin (P-15)

[Synthesis of Monomer D-1]

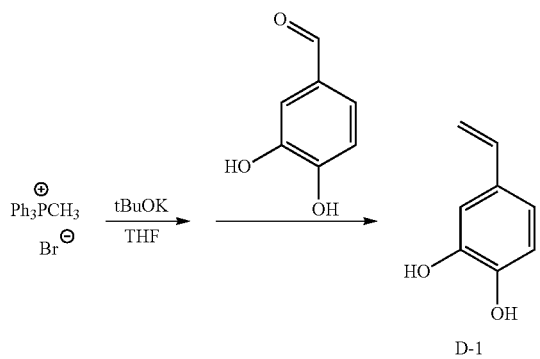

169 g (473 mmol) of methyltriphenylphosphonium bromide and 30 mg of 2,6-di-tert-butyl-p-cresol were suspended in 570 ml of tetrahydrofuran (THF), and 58.8 g (524 mmol) of potassium tert-butoxide (tBuOK) was added under cooling with ice under nitrogen gas atmosphere. After the temperature returned to room temperature, stirring was performed for one hour, cooling was performed with ice, 25 g (181 mmol) of 3,4-dihydroxybenzaldehyde was gradually added so as not to excessively generate heat, the temperature returned to room temperature, and stirring was further performed for two hours. 500 ml of an ammonium chloride saturated aqueous solution was added to the reaction solution under cooling with ice, and 500 ml of ethyl acetate was further added to perform a liquid separation operation. The organic layer was washed five times with 500 ml of distilled water, dehydrated with magnesium sulfate, and was filtrated, and the solvent of the organic layer was distilled off under reduced pressure. The residue was purified by silica gel column chromatography (eluent: ethyl acetate/n-hexane=1/3) so as to obtain 14 g of a monomer D-1 (yield 57%).

$^1$H-NMR (Acetone-d6: ppm) δ:7.84 (br, 2H), 6.97 (s, 1H), 6.79 (m, 2H), 6.58 (dd, 1H), 5.53 (d, 1H), 5.01 (d, 1H)

[Synthesis of Resin (P-15)]

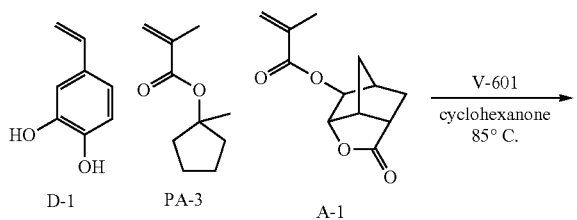

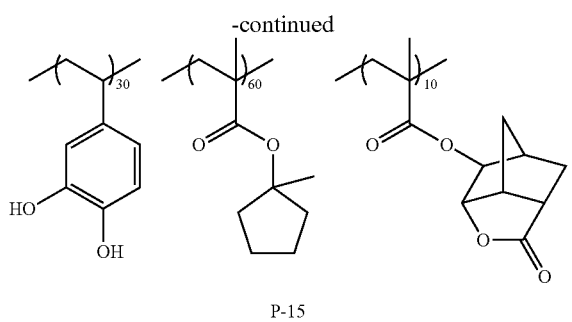

P-15

4.9 g of a monomer (D-1), 12.1 g of a monomer (PA-3), 2.7 g of a monomer (A-1), and 0.50 g of a polymerization initiator V-601 (manufactured by Wako Pure Chemical Industries, Ltd.) were dissolved in 76.1 g of cyclohexanone. 41.0 g of cyclohexanone was placed in a reaction vessel and added dropwise to a system at 85° C. in a nitrogen gas atmosphere over four hours. The reaction solution was heated and stirred for two hours and then allowed to cool to room temperature. The reaction solution was added dropwise to 1377 g of a mixed solution of n-heptane and ethyl acetate (n-heptane/ethyl acetate=9/1 (mass ratio)) to precipitate the polymer, and filtration was performed. The filtered solid was washed with 413 g of a mixed solution of n-heptane and ethyl acetate (n-heptane/ethyl acetate=9/1 (mass ratio)). Thereafter, the washed solid was vacuum-dried so as to obtain 12.4 g of a resin (P-15).

The weight-average molecular weight (Mw: in terms of polystyrene), the number-average molecular weight (Mn: in terms of polystyrene), and the dispersion degree (Mw/Mn) of the obtained resins were calculated by the measurement of GPC (carrier: tetrahydrofuran (THF)). In the GPC, TSK gel Multipore HXL-M (manufactured by Tosoh Corporation, 7.8 mm ID×30.0 cm) was used as a column by using HLC-8120 (manufactured by Tosoh Corporation). In addition, the compositional ratio (molar ratio) was calculated by $^1$H-NMR (Nuclear Magnetic Resonance) and $^{13}$C-NMR measurement. The weight-average molecular weight by GPC (Mw) was 12,300, and the molecular weight dispersion degree (Mw/Mn) was 1.51.

$^1$H-NMR (DMSO-d6: ppm) δ: 8.75-8.39, 6.83-5.95, 4.59-3.66, 3.61-2.88, 2.64-0.18 (all peaks were broad).

The same operation as the above synthesis method was performed to synthesize another resin presented in Table 1 as the resin (A).

TABLE 1

| Resin | Monomer-1 | Monomer-2 | Monomer-3 | Monomer-4 | Monomer-5 | Compositional ratio (molar ratio) from the left | Mw | Mw/Mn |
|---|---|---|---|---|---|---|---|---|
| P-1 | D-1 | PA-1 | | | | 50/50 | 11,200 | 1.45 |
| P-2 | D-2 | PA-2 | A-1 | | | 10/60/30 | 12,300 | 1.51 |
| P-3 | D-3 | PA-3 | | | | 30/70 | 9,200 | 1.68 |
| P-4 | D-4 | PA-4 | A-2 | | | 20/40/40 | 12,300 | 1.51 |
| P-5 | D-5 | PA-5 | | M-5 | | 30/55/15 | 12,500 | 1.52 |
| P-6 | D-6 | PA-6 | A-3 | M-6 | | 20/50/15/15 | 13,000 | 1.56 |
| P-7 | D-7 | PA-7 | | M-7 | | 50/40/10 | 12,500 | 1.43 |
| P-8 | D-8 | PA-8 | A-4 | M-8 | | 40/40/15/5 | 18,000 | 1.12 |
| P-9 | D-9 | PA-9 | | | | 45/55 | 11,000 | 1.56 |
| P-10 | D-10 | PA-10 | A-5 | | | 20/40/40 | 11,000 | 1.45 |
| P-11 | D-1 | PA-11 | | D-8 | M-9 | 40/40/15/5 | 12,300 | 1.51 |
| P-12 | D-2 | PA-12 | A-6 | D-8 | M-10 | 20/50/10/10/10 | 12,500 | 1.68 |
| P-13 | D-1 | PA-13 | | | | 70/30 | 13,000 | 1.51 |
| P-14 | D-1 | PA-14 | A-7 | M-11 | | 20/40/30/10 | 15,600 | 1.45 |
| P-15 | D-1 | PA-3 | A-1 | | | 30/60/10 | 12,300 | 1.51 |
| P-16 | D-1 | PA-3 | A-1 | | | 30/50/20 | 13,500 | 1.43 |
| P-17 | D-1 | PA-3 | A-2 | | | 30/60/10 | 12,100 | 1.53 |
| P-18 | D-1 | PA-3 | A-1 | M-6 | | 40/50/5/5 | 11,100 | 1.61 |
| P-19 | D-1 | PA-3 | A-1 | M-9 | | 40/45/10/5 | 11,500 | 1.49 |
| P-20 | D-1 | PA-3 | A-1 | M-7 | | 20/40/20/20 | 13,500 | 1.49 |
| P-21 | D-1 | PA-3 | PA-7 | A-1 | | 30/30/30/10 | 14,500 | 1.51 |
| P-22 | D-1 | PA-3 | PA-8 | A-1 | | 30/30/30/10 | 20,100 | 1.52 |
| P-23 | D-1 | PA-3 | PA-9 | A-1 | | 30/40/20/10 | 6,500 | 1.56 |
| P-24 | D-1 | PA-3 | PA-12 | A-1 | | 30/20/40/10 | 14,500 | 1.43 |
| P-25 | D-1 | PA-3 | PA-14 | A-1 | | 10/30/30/30 | 11,000 | 1.12 |
| P-26 | D-1 | PA-14 | M-7 | | | 45/35/20 | 11,000 | 1.12 |
| P-27 | D-1 | PA-3 | PB-1 | A-1 | | 30/40/20/10 | 12,300 | 1.56 |
| P-28 | D-1 | PA-3 | PB-2 | | | 30/50/20 | 9,200 | 1.45 |
| P-29 | D-1 | PA-3 | PB-3 | | | 30/60/10 | 12,300 | 1.56 |
| P-30 | D-1 | PA-3 | PB-4 | | | 20/50/30 | 12,500 | 1.45 |
| P-31 | D-1 | PA-3 | PB-5 | | | 40/40/20 | 13,000 | 1.51 |
| P-32 | D-1 | PA-3 | PB-6 | | | 40/50/10 | 12,500 | 1.68 |
| P-33 | D-1 | PA-3 | PB-7 | | | 20/50/30 | 13,000 | 1.51 |
| P-34 | D-1 | PA-3 | PB-8 | | | 40/40/20 | 11,000 | 1.45 |
| P-35 | D-1 | PA-3 | PB-9 | | | 40/50/10 | 11,000 | 1.45 |
| P-36 | D-1 | PA-15 | M-1 | | | 40/50/10 | 11,000 | 1.45 |
| P-37 | D-1 | PA-4 | M-2 | | | 50/40/10 | 11,000 | 1.45 |
| P-38 | D-1 | PA-4 | M-3 | | | 30/40/30 | 11,000 | 1.45 |
| P-39 | D-1 | PA-4 | M-4 | | | 50/40/10 | 11,000 | 1.45 |
| P-40 | D-1 | PA-7 | | | | 50/50 | 11,300 | 1.43 |
| P-41 | D-1 | M-1 | | | | 50/50 | 11,300 | 1.43 |
| P-42 | D-2 | M-2 | | | | 50/50 | 10,900 | 1.61 |
| P-43 | D-3 | M-3 | | | | 50/50 | 15,600 | 1.39 |
| P-44 | D-2 | M-4 | | | | 50/50 | 12,500 | 1.1 |
| P-45 | D-1 | PA-3 | A-1 | | | 4/60/36 | 13,200 | 1.35 |
| P-46 | D-1 | PA-3 | | | | 30/60/10 | 12,300 | 1.51 |

TABLE 1-continued
| Resin | Monomer-1 | Monomer-2 | Monomer-3 | Monomer-4 | Monomer-5 | Compositional ratio (molar ratio) from the left | Mw | Mw/Mn |
|---|---|---|---|---|---|---|---|---|
| P-47 | D-1 | PA-3 | A-1 | PB-4 | | 30/40/10/20 | 12,300 | 1.51 |
| P-48 | D-1 | M-1 | | | | 40/60 | 12,300 | 1.51 |
| PR-1 | M-13 | PB-2 | M-1 | A-2 | | 5/15/30/50 | 9000 | 1.55 |
| PR-2 | A-2 | M-1 | M-11 | | | 45/45/10 | 6,500 | 1.9 |
| PR-3 | M-6 | PA-14 | M-7 | | | 30/50/20 | 25,000 | 2.1 |
| PR-4 | PA-3 | A-1 | | | | 60/40 | 12,300 | 1.51 |
The monomers presented in Table 1 are as follows.
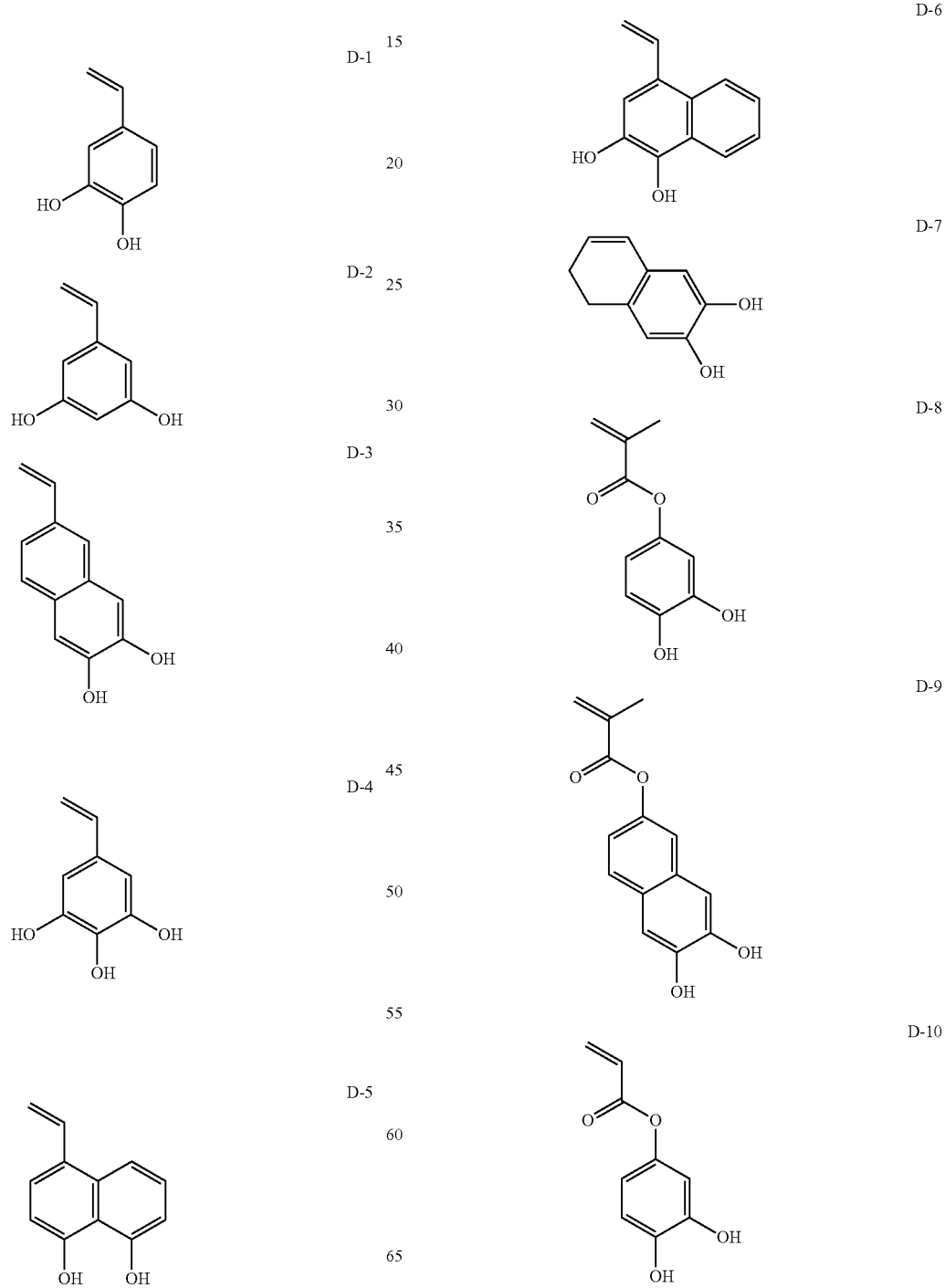

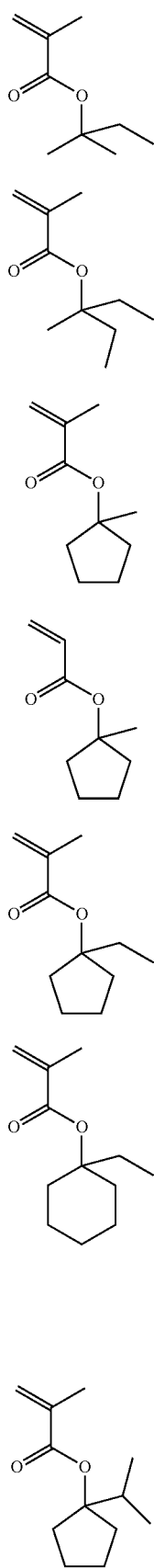
PA-1
PA-2
PA-3
PA-4
PA-5
PA-6
PA-7
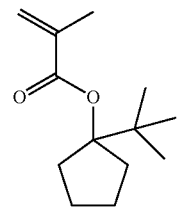
PA-8
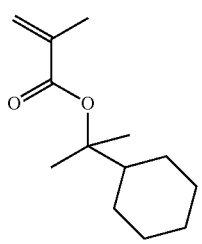
PA-9
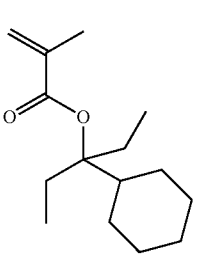
PA-10
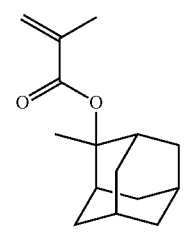
PA-11
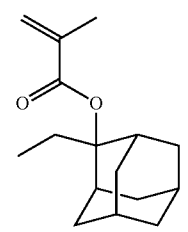
PA-12
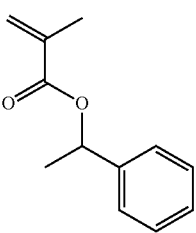
PA-13
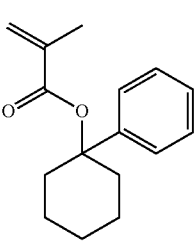
PA-14

PA-15
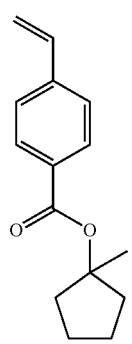
PB-1
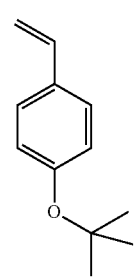
PB-2
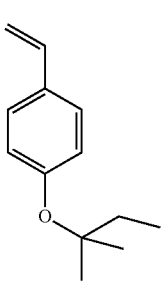
PB-3
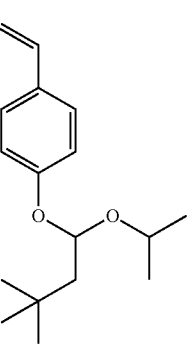
PB-4
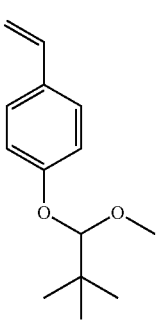
PB-5
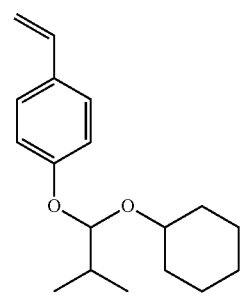
PB-6
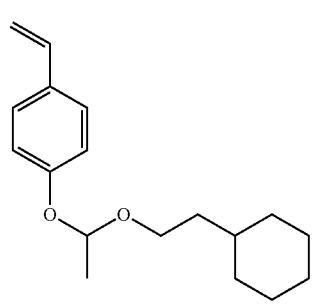
PB-7
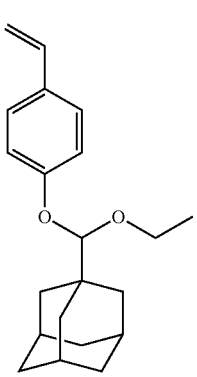
PB-8
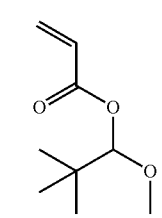
PB-9
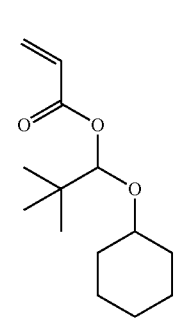

-continued
A-1
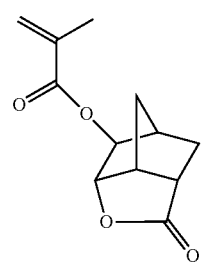
A-2
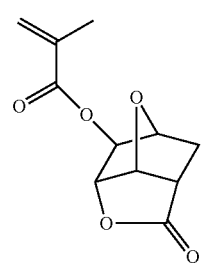
A-3
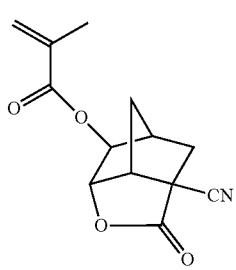
A-4
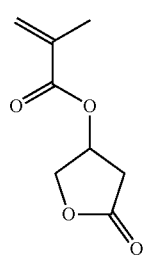
A-5
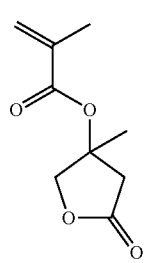
-continued
A-6
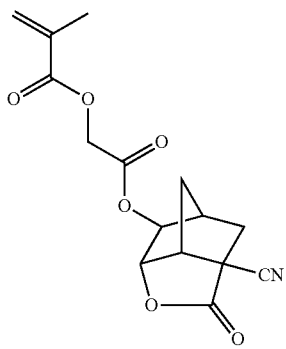
A-7
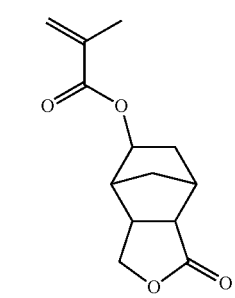
M-1
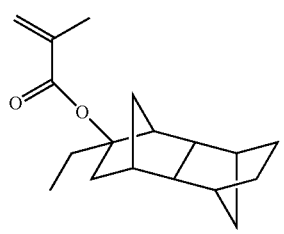
M-2
M-3
M-4
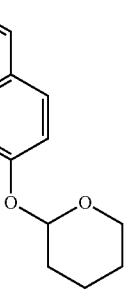

M-5
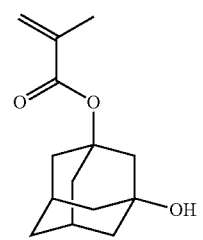
M-6
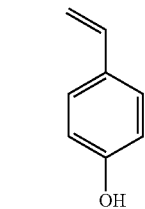
M-7
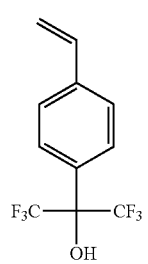
M-8
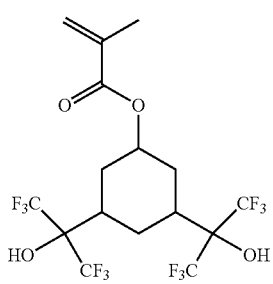
M-9
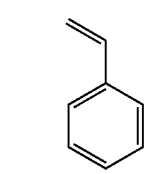
M-10
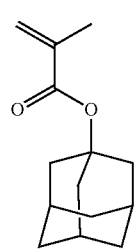
M-11
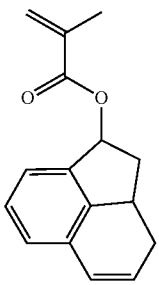
M-12
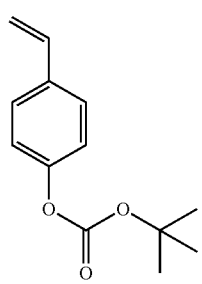
M-13
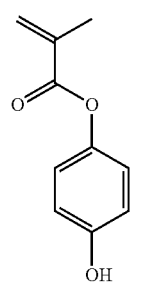
[Photoacid Generator]
As the photoacid generator, the compounds provided below were used.
B-1
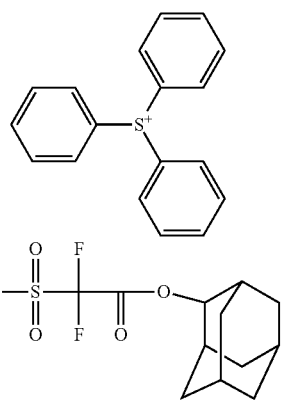
B-2
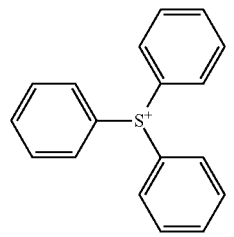

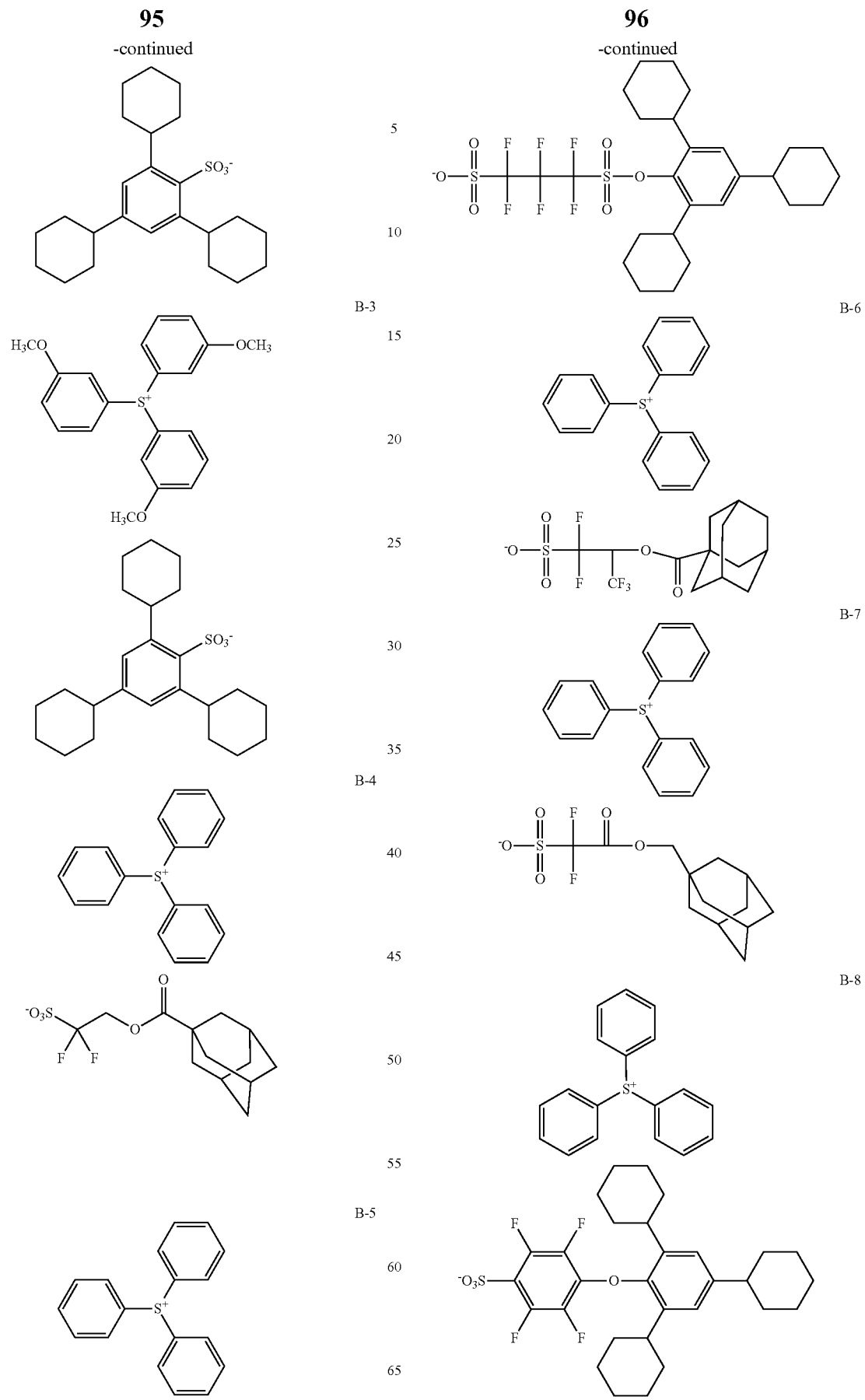

B-9
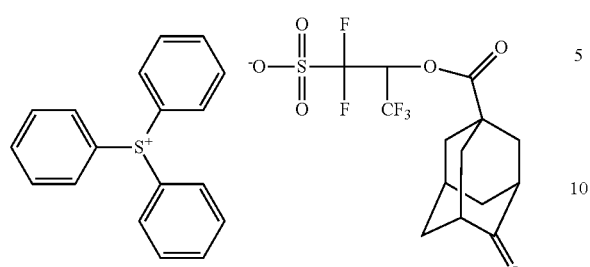
B-10
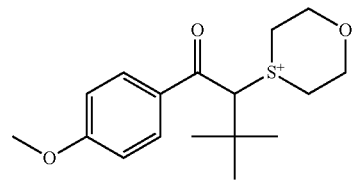
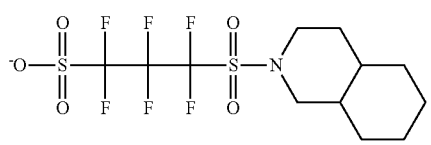
B-11
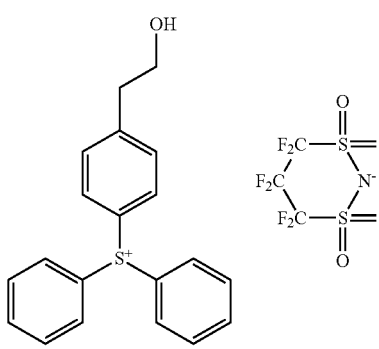
B-12
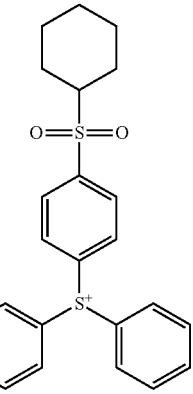
B-13
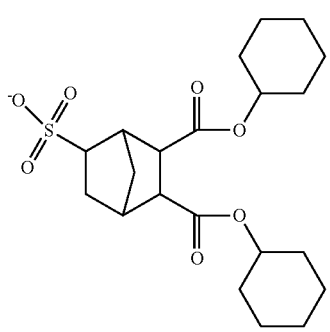
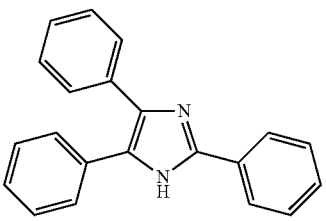
[Basic Compound]
As the basic compound, the compounds provided below were used.
E-1
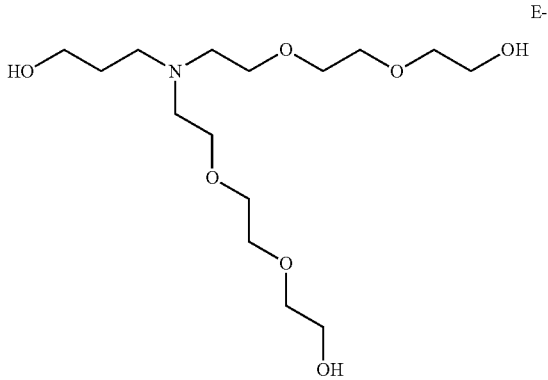
E-2

E-3
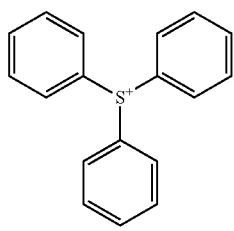
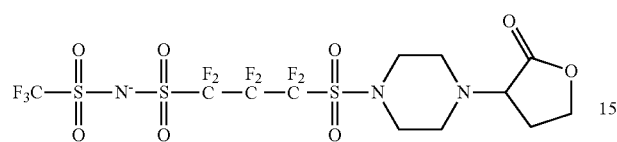
E-4
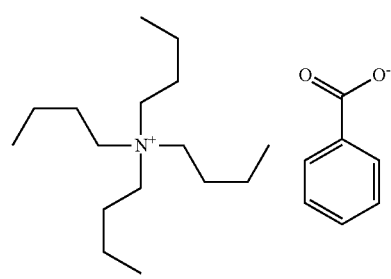
E-5
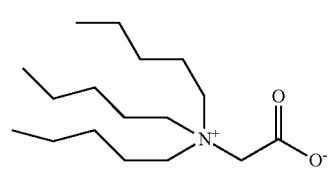
E-6
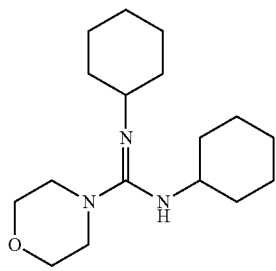
E-7
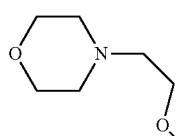
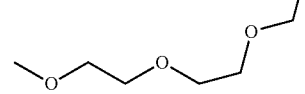
E-8
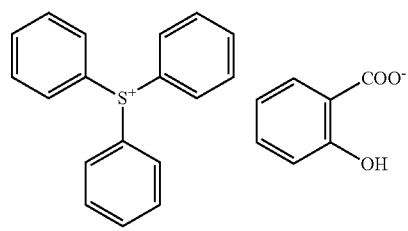
E-9
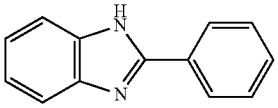
E-10
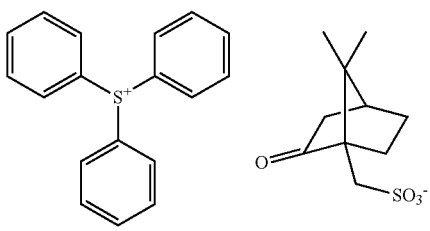
E-11
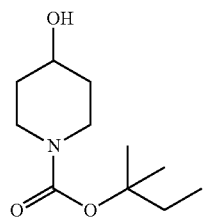
E-12
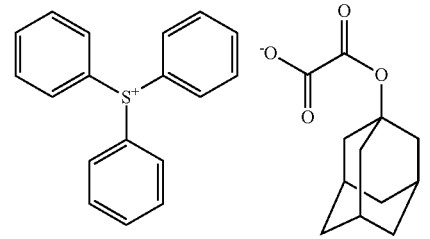
[Hydrophobic Resin]
As the hydrophobic resin, the resins provided below were used. The weight-average molecular weights (Mw), the dispersion degrees (Mw/Mn), and the compositional ratios presented in Table 2 were determined by the same method as described above for the resin (A).
(1b)
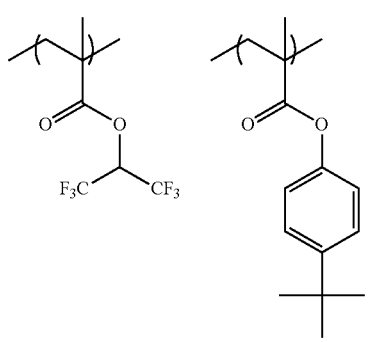

-continued

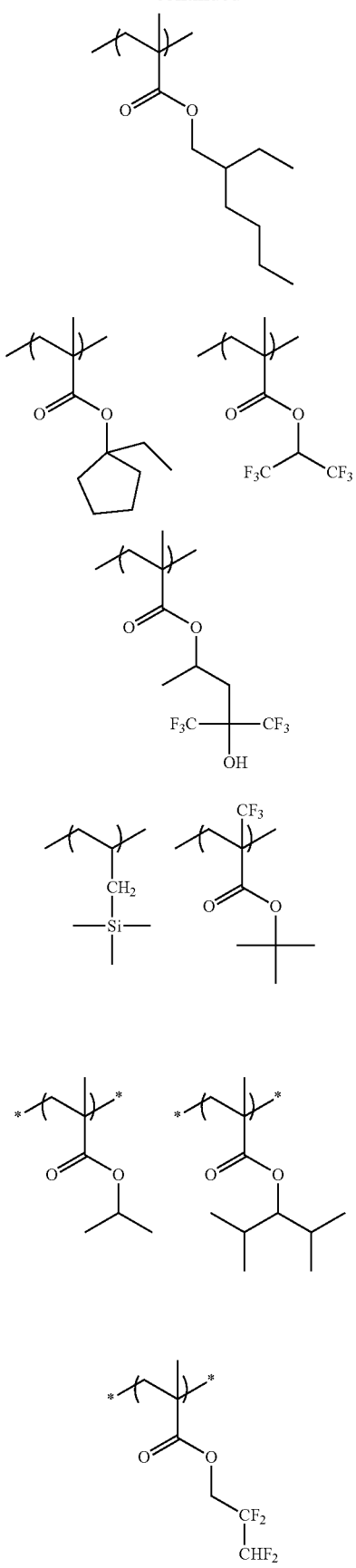

(2b)

(3b)

(4b)

-continued

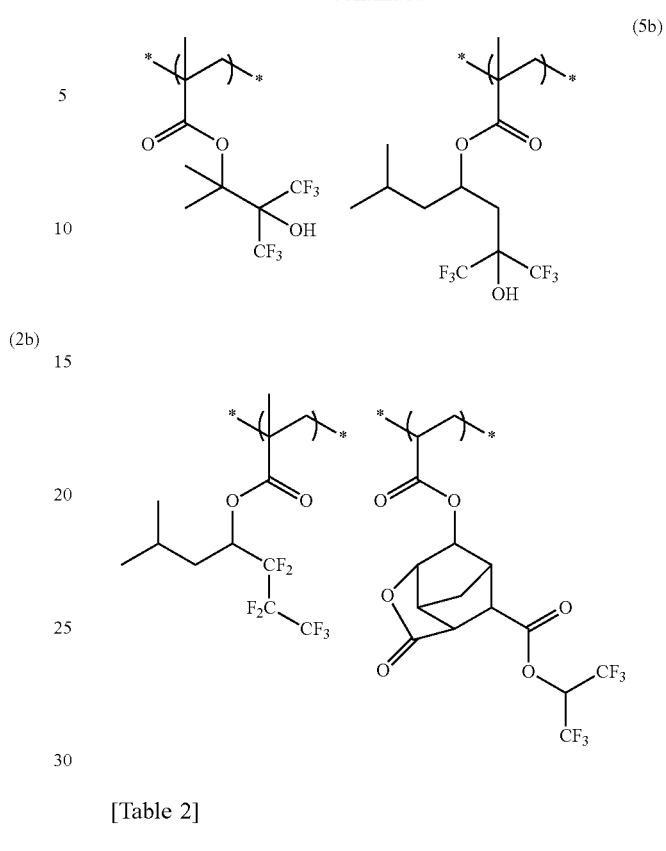

(5b)

[Table 2]

TABLE 2

| | Compositional ratio (molar ratio) | | | | Mw | Mw/Mn |
|---|---|---|---|---|---|---|
| Resin (1b) | 50 | 45 | 5 | — | 7000 | 1.30 |
| Resin (2b) | 40 | 40 | 20 | — | 18600 | 1.57 |
| Resin (3b) | 50 | 50 | — | — | 25400 | 1.63 |
| Resin (4b) | 30 | 65 | 5 | — | 28000 | 1.70 |
| Resin (5b) | 10 | 10 | 30 | 50 | 12500 | 1.65 |

[Solvent]

As solvents, solvents provided below were used.

C-1: Propylene glycol monomethyl ether acetate (PG-MEA)

C-2: Propylene glycol monomethyl ether (PGME)

C-3: Ethyl lactate

C-4: Cyclohexanone

C-5: 2-Heptanone

C-6: γ-butyrolactone

[Preparation of Resist Composition]

Each component presented in Table 3A was dissolved in a solvent in an amount presented in Table 3B to prepare a coating liquid composition having a concentration of solid contents presented in Tables 3A and 3B (hereinafter referred to as "Table 3"). The coating liquid composition was filtrated through a polyethylene filter having 0.005 μm of a pore diameter to prepare a resist composition.

TABLE 3A

| Resist composition | Concentration of solid contents (mass %) | Resin (A) (g) | Photoacid generator (B) (g) | Basic compound (E) (g) | Solvent (C) (g) | | | Hydrophobic resin (g) |
|---|---|---|---|---|---|---|---|---|
| Ex-1 | 1.8 | P-1 | B-1 | E-1 | C-1 | — | | — |
| Ex-2 | 1.3 | P-2 | B-1 | E-2 | C-1 | C-2 | | — |
| Ex-3 | 1.7 | P-3 | B-4 | E-3 | C-1 | C-3 | — | — |
| Ex-4 | 1.5 | P-4 | B-4 | E-4 | C-1 | C-4 | — | — |
| Ex-5 | 1.3 | P-5 | B-5 | E-5 | C-1 | C-5 | — | — |
| Ex-6 | 1.1 | P-6 | B-6 | E-6 | C-1 | C-6 | — | — |
| Ex-7 | 0.8 | P-7 | B-7 | E-7 | C-1 | C-2 | — | — |
| Ex-8 | 0.6 | P-8 | B-8 | E-8 | C-1 | C-3 | — | — |
| Ex-9 | 0.4 | P-9 | B-9 | E-9 | C-1 | C-4 | — | — |
| Ex-10 | 2.2 | P-10 | B-2 | E-11 | C-1 | C-5 | — | — |
| Ex-11 | 3.0 | P-11 | B-11 | E-12 | C-1 | C-5 | — | — |
| Ex-12 | 2.0 | P-12 | B-12 | E-4 | C-1 | C-5 | — | — |
| Ex-13 | 2.9 | P-13 | B-13 | E-3 | C-1 | C-4 | — | — |
| Ex-14 | 2.0 | P-14 | B-3 | E-2 | C-1 | C-3 | — | — |
| Ex-15 | 1.8 | P-15 | B-4 | E-1 | C-1 | C-2 | — | — |
| Ex-16 | 2.0 | P-16 | B-4 | E-1 | C-1 | C-3 | — | — |
| Ex-17 | 1.4 | P-17 | B-6 | E-5 | C-1 | C-4 | — | — |
| Ex-18 | 2.0 | P-18 | B-6 | E-6 | C-1 | C-5 | — | — |
| Ex-19 | 2.0 | P-19 | B-7 | E-7 | C-1 | C-2 | — | — |
| Ex-20 | 1.9 | P-20 | B-7 | E-8 | C-1 | C-2 | C-6 | — |
| Ex-21 | 2.0 | P-21 | B-9 | E-9 | C-4 | C-1 | — | — |
| Ex-22 | 2.0 | P-22 | B-9 | E-9 | C-4 | C-2 | — | — |
| Ex-23 | 2.0 | P-23 | B-11 | E-11 | C-4 | C-3 | — | — |
| Ex-24 | 2.3 | P-24 | B-11 | E-12 | C-4 | C-5 | — | — |
| Ex-25 | 1.8 | P-25 | B-13 | E-8 | C-1 | C-3 | — | — |
| Ex-26 | 2.0 | P-26 | B-13 | E-8 | C-1 | C-3 | — | — |
| Ex-27 | 2.5 | P-27 | B-1 | E-1 | C-1 | — | | — |
| Ex-28 | 2.2 | P-28 | B-1 | E-1 | C-1 | C-2 | — | — |
| Ex-29 | 2.3 | P-29 | B-4 | E-5 | C-1 | C-3 | — | — |
| Ex-30 | 2.5 | P-30 | B-4 | E-6 | C-1 | C-4 | — | — |
| Ex-31 | 2.6 | P-31 | B-5 | E-7 | C-1 | C-5 | — | — |
| Ex-32 | 2.8 | P-32 | B-6 | E-8 | C-1 | C-3 | — | — |
| Ex-33 | 3.6 | P-33 | B-7 | E-9 | C-1 | C-2 | — | — |
| Ex-34 | 2.2 | P-34 | B-8 | E-9 | C-1 | C-3 | — | — |
| Ex-35 | 2.3 | P-35 | B-9 | E-11 | C-1 | C-4 | — | — |
| Ex-36 | 2.5 | P-36 | B-1 | E-12 | C-1 | C-5 | — | — |
| Ex-37 | 2.7 | P-37 | B-1 | E-8 | C-1 | C-2 | — | 1b |
| Ex-38 | 2.8 | P-38 | B-4 | E-10 | C-1 | C-2 | — | 2b |
| Ex-39 | 3.0 | P-39 | B-4 | E-3 | C-4 | C-1 | — | 3b |
| Ex-40 | 2.3 | P-40 | B-5 | E-2 | C-4 | C-2 | — | 4b |
| Ex-41 | 3.7 | P-41 | B-6 | E-1 | C-1 | C-2 | — | 5b |
| Ex-42 | 3.4 | P-42 | B-7 | E-10 | C-1 | C-3 | — | — |
| Ex-43 | 2.9 | P-43 | B-8 | E-3 | C-1 | C-4 | — | — |
| Ex-44 | 2.6 | P-44 | B-9 | E-2 | C-1 | C-5 | — | — |
| Ex-45 | 2.8 | P-45 | B-10 | E-1 | C-1 | C-2 | — | — |
| Ex-46 | 3.8 | P-26 | B-13 | E-8 | C-1 | C-3 | — | — |
| Ex-47 | 3.3 | P-26 | B-13 | E-8 | C-1 | C-3 | — | — |
| Ex-48 | 2.8 | P-26 | B-13 | E-8 | C-1 | C-3 | — | — |
| Ex-49 | 0.7 | P-26 | B-13 | E-8 | C-1 | C-3 | — | — |
| Ex-50 | 1.5 | P-15 | B-4 | E-1 | C-1 | C-2 | — | — |
| Ex-51 | 1.5 | P-47 | B-4 | E-1 | C-1 | C-2 | — | — |
| Ex-52 | 1.5 | P-48 | B-4 | E-1 | C-1 | C-2 | — | — |
| Ex-53 | 1.5 | P-49 | B-4 | E-1 | C-1 | C-2 | — | — |
| Ex-54 | 1.5 | P-27 | B-4 | E-1 | C-1 | C-2 | — | — |
| Ex-55 | 3.8 | P-15 | B-4 | E-1 | C-1 | C-2 | — | — |
| Ex-56 | 2.6 | P-15 | B-4 | E-1 | C-1 | C-2 | — | — |
| Re-1 | 6.7 | PR-1 | B-1 | E-1 | C-1 | — | | — |
| Re-2 | 6.8 | PR-2 | B-1 | E-2 | C-1 | C-2 | — | — |
| Re-3 | 8.5 | PR-3 | B-1 | E-2 | C-1 | C-2 | — | — |
| Re-4 | 5.7 | PR-3 | B-1 | E-2 | C-1 | — | | — |
| Re-5 | 2.0 | PR-2 | B-1 | E-2 | C-2 | — | | — |
| Re-6 | 3.6 | PR-1 | B-1 | E-2 | C-1 | C-2 | C-3 | — |
| Re-7 | 1.5 | PR-4 | B-4 | E-1 | C-1 | C-2 | — | — |

TABLE 3B

| Resist composition | Concentration of solid contents (mass %) | Resin (A) (g) | Photoacid generator (B) (g) | Basic compound (E) (g) | Solvent (C) (g) | | Hydrophobic Resin (g) |
|---|---|---|---|---|---|---|---|
| Ex-1 | 1.8 | 0.77 g | 0.2 g | 0.03 g | 55 g | | |
| Ex-2 | 1.3 | 0.78 g | 0.2 g | 0.02 g | 67.5 g | 7.5 g | |
| Ex-3 | 1.7 | 0.87 g | 0.1 g | 0.03 g | 55 g | 5 g | |

TABLE 3B-continued

| Resist composition | Concentration of solid contents (mass %) | Resin (A) (g) | Photoacid generator (B) (g) | Basic compound (E) (g) | Solvent (C) (g) | | Hydrophobic Resin (g) |
|---|---|---|---|---|---|---|---|
| Ex-4 | 1.5 | 0.87 g | 0.1 g | 0.01 g | 55 g | 10 g | |
| Ex-5 | 1.3 | 0.66 g | 0.3 g | 0.04 g | 55 g | 20 g | |
| Ex-6 | 1.1 | 0.67 g | 0.3 g | 0.03 g | 55 g | 40 g | |
| Ex-7 | 0.8 | 0.76 g | 0.2 g | 0.04 g | 80 g | 50 g | |
| Ex-8 | 0.6 | 0.79 g | 0.2 g | 0.01 g | 120 g | 55 g | |
| Ex-9 | 0.4 | 0.87 g | 0.1 g | 0.02 g | 180 g | 100 g | |
| Ex-10 | 2.2 | 0.87 g | 0.1 g | 0.01 g | 30 g | 15 g | |
| Ex-11 | 3.0 | 0.66 g | 0.3 g | 0.04 g | 28 g | 5 g | |
| Ex-12 | 2.0 | 0.69 g | 0.3 g | 0.01 g | 20 g | 30 g | |
| Ex-13 | 2.9 | 0.66 g | 0.3 g | 0.04 g | 20 g | 15 g | |
| Ex-14 | 2.0 | 0.69 g | 0.3 g | 0.01 g | 20 g | 30 g | |
| Ex-15 | 1.8 | 0.68 g | 0.3 g | 0.02 g | 40 g | 15 g | |
| Ex-16 | 2.0 | 0.68 g | 0.3 g | 0.02 g | 40 g | 10 g | |
| Ex-17 | 1.4 | 0.79 g | 0.2 g | 0.01 g | 60 g | 10 g | |
| Ex-18 | 2.0 | 0.78 g | 0.2 g | 0.02 g | 40 g | 10 g | |
| Ex-19 | 2.0 | 0.87 g | 0.1 g | 0.02 g | 40 g | 10 g | |
| Ex-20 | 1.9 | 0.87 g | 0.1 g | 0.01 g | 40 g | 10 g | 2 g |
| Ex-21 | 2.0 | 0.68 g | 0.3 g | 0.02 g | 40 g | 10 g | |
| Ex-22 | 2.0 | 0.68 g | 0.3 g | 0.02 g | 40 g | 10 g | |
| Ex-23 | 2.0 | 0.79 g | 0.2 g | 0.01 g | 40 g | 10 g | |
| Ex-24 | 2.3 | 0.78 g | 0.2 g | 0.02 g | 33 g | 10 g | |
| Ex-25 | 1.8 | 0.87 g | 0.1 g | 0.005 g | 45 g | 10 g | |
| Ex-26 | 2.0 | 0.87 g | 0.1 g | 0.02 g | 40 g | 10 g | |
| Ex-27 | 2.5 | 0.69 g | 0.3 g | 0.01 g | 40 g | | |
| Ex-28 | 2.2 | 0.67 g | 0.3 g | 0.03 g | 35 g | 10 g | |
| Ex-29 | 2.3 | 0.65 g | 0.3 g | 0.05 g | 33 g | 10 g | |
| Ex-30 | 2.5 | 0.64 g | 0.3 g | 0.06 g | 30 g | 10 g | |
| Ex-31 | 2.6 | 0.62 g | 0.3 g | 0.08 g | 28 g | 10 g | |
| Ex-32 | 2.8 | 0.63 g | 0.3 g | 0.07 g | 26 g | 10 g | |
| Ex-33 | 3.6 | 0.75 g | 0.2 g | 0.05 g | 18 g | 10 g | |
| Ex-34 | 2.2 | 0.74 g | 0.2 g | 0.06 g | 35 g | 10 g | |
| Ex-35 | 2.3 | 0.87 g | 0.1 g | 0.03 g | 33 g | 10 g | |
| Ex-36 | 2.5 | 0.87 g | 0.1 g | 0.03 g | 30 g | 10 g | |
| Ex-37 | 2.7 | 0.65 g | 0.3 g | 0.05 g | 28 g | 10 g | 0.01 g |
| Ex-38 | 2.8 | 0.64 g | 0.3 g | 0.06 g | 26 g | 10 g | 0.02 g |
| Ex-39 | 3.0 | 0.72 g | 0.2 g | 0.08 g | 24 g | 10 g | 0.01 g |
| Ex-40 | 2.3 | 0.77 g | 0.2 g | 0.03 g | 30 g | 15 g | 0.02 g |
| Ex-41 | 3.7 | 0.87 g | 0.1 g | 0.04 g | 18 g | 10 g | 0.02 g |
| Ex-42 | 3.4 | 0.87 g | 0.1 g | 0.04 g | 20 g | 10 g | |
| Ex-43 | 2.9 | 0.62 g | 0.3 g | 0.08 g | 25 g | 10 g | |
| Ex-44 | 2.6 | 0.67 g | 0.3 g | 0.03 g | 28 g | 10 g | |
| Ex-45 | 2.8 | 0.67 g | 0.3 g | 0.03 g | 26 g | 10 g | |
| Ex-46 | 3.8 | 0.87 g | 0.1 g | 0.02 g | 21 g | 5 g | |
| Ex-47 | 3.3 | 0.87 g | 0.1 g | 0.02 g | 24 g | 6 g | |
| Ex-48 | 2.8 | 0.87 g | 0.1 g | 0.02 g | 28 g | 7 g | |
| Ex-49 | 0.7 | 0.87 g | 0.1 g | 0.02 g | 120 g | 30 g | |
| Ex-50 | 1.5 | 0.68 g | 0.3 g | 0.02 g | 50 g | 15 g | |
| Ex-51 | 1.5 | 0.68 g | 0.3 g | 0.02 g | 50 g | 15 g | |
| Ex-52 | 1.5 | 0.68 g | 0.3 g | 0.02 g | 50 g | 15 g | |
| Ex-53 | 1.5 | 0.68 g | 0.3 g | 0.02 g | 50 g | 15 g | |
| Ex-54 | 1.5 | 0.68 g | 0.3 g | 0.02 g | 50 g | 15 g | |
| Ex-55 | 3.8 | 0.68 g | 0.3 g | 0.02 g | 20 g | 6 g | |
| Ex-56 | 2.6 | 0.68 g | 0.3 g | 0.02 g | 29.5 g | 8.7 g | |
| Re-1 | 6.7 | 0.71 g | 0.2 g | 0.09 g | 15 g | | |
| Re-2 | 6.8 | 0.87 g | 0.1 g | 0.05 g | 10 g | 5 g | |
| Re-3 | 8.5 | 0.87 g | 0.1 g | 0.05 g | 8 g | 4 g | |
| Re-4 | 5.7 | 0.87 g | 0.1 g | 0.05 g | 18 g | | |
| Re-5 | 2.0 | 0.87 g | 0.1 g | 0.05 g | 50 g | | |
| Re-6 | 3.6 | 0.75 g | 0.2 g | 0.05 g | 18 g | 4 g | 6 g |
| Re-7 | 1.5 | 0.68 g | 0.3 g | 0.02 g | 50 g | 15 g | |

[Treatment Liquid]

As the developer and the rinsing solution used in the pattern forming described below, treatment liquids presented in Table 4 were used.

TABLE 4

| Treatment liquid | First liquid | Second liquid | Mixture ratio (mass ratio) [First/Second] |
|---|---|---|---|
| DR-1 | Butyl acetate | — | — |
| DR-2 | 3-Methylbutyl acetate | — | — |
| DR-3 | 3-Methylbutyl acetate | 2-Methylbutyl acetate | 80/20 |
| DR-4 | Butyl acetate | 3-Methylbutyl acetate | 60/40 |
| DR-5 | Butyl acetate | 3-Methylbutyl acetate | 10/90 |
| DR-6 | 2-Heptanone | — | — |
| DR-7 | Butyl acetate | 2-Heptanone | 30/70 |
| DR-8 | 3-Methylbutyl acetate | 2-Heptanone | 80/20 |
| DR-9 | Diisobutyl ketone | — | — |
| DR-10 | Diisobutyl ketone | 3-Methylbutyl acetate | 70/30 |
| DR-11 | Butyl acetate | 4-Methyl-2-pentanol | 80/20 |
| DR-12 | 4-Methyl-2-pentanol | — | — |
| DR-13 | 4-Methyl-2-pentanol | Butyl acetate | 90/10 |
| DR-14 | Decane | — | — |
| DR-15 | Undecane | — | — |
| DR-16 | Undecane | Diisobutyl ketone | 30/70 |
| DR-17 | Undecane | 4-Methyl-2-pentanol | 30/70 |
| DR-18 | Butyl acetate | PGMEA | 95/5 |
| DR-19 | Butyl acetate | Cyclohexanone | 95/5 |
| DR-20 | 2.38% tetramethylammonium hydroxide aqueous solution | — | — |
| DR-21 | Pure water | — | — |

Example 1: EUV Exposure

By using a resist composition presented in Table 3, a resist pattern was formed by the following operations.

[Forming of Trench Pattern]

A silicon wafer subjected to a hexamethyldisilazane (HMDS) treatment was coated with each of the obtained resist compositions and was baked at a prebake (PB) temperature presented in Table 5 for 60 seconds, to form a resist film having a film thickness described in the same table. The film thickness was measured by the method described later.

EUV exposure was performed on the obtained wafer with 0.3 of a numerical aperture (NA) and conventional illumination (sigma=0.51). Specifically, EUV exposure was performed by changing the exposure amount via a mask including a pattern in order to form a 30 nm trench pattern. After the exposure, the wafer was taken out from the EUV exposure device and immediately subjected to post exposure bake (PEB) at a baking condition (PEB temperature) presented in Table 5 for 60 seconds.

Subsequently, the developer presented in Table 5 was puddled for 30 seconds, and rinsing was performed with the rinsing solution described in the same table. Thereafter, the wafer was rotated at a rotation speed of 2,000 rpm (revolutions per minute) for 30 seconds and spin-dried to obtain the trench pattern presented in Table 5.

<Method of Measuring Film Thickness>

The film thickness of the resist film obtained by the method described above was measured by using a light interferometric film thickness meter (LAMBDA ACE VM-3100, manufactured by Dainippon Screen Mfg. Co., Ltd.). The film thickness is an average value of values measured at 25 points in the wafer in-plane.

<Evaluation Method>

The results evaluated by the following method are presented in Table 5.

(Sensitivity)

The obtained resist pattern was observed with a scanning electron microscope (S-9380 II manufactured by Hitachi, Ltd.). Sensitivity ($mJ/cm^2$) was defined as the irradiation energy for resolving the 50 nm trench pattern. It is exhibited that, as the value is smaller, performance becomes more satisfactory.

(Trench Resolution)

The resolution condition of the pattern was observed using a scanning electron microscope (S-9380II, manufactured by Hitachi, Ltd.), and the resolution without problems of the blocking of the trenches, bridges, and residues was set as a value of the critical resolution. It is exhibited that, as the value is smaller, performance becomes more satisfactory.

(TWR: Trench Width Roughness)

In the sensitivity, the line widths were measured for any 50 points in the longitudinal direction of 0.5 μm in a pattern having a trench width of 50 nm, and the standard deviation thereof was obtained to calculate $3\sigma$ (nm). It is exhibited that, as the value is smaller, performance becomes more satisfactory. TWR is a definition of line width roughness with respect to a trench pattern and has the meaning substantially the same as line width roughness (LWR).

(CDU)

The entire surface of the wafer was exposed with an exposure amount for forming a pattern having a trench width of 50 nm to form 200 chips having a pattern having a trench width of 50 nm in the wafer in-plane. For each chip, the CD was calculated by measuring the trench width by 100 points, and the standard deviation of 200 points in the wafer in-plane was obtained based on the CD to calculate $3\sigma$ (nm). It is exhibited that, as the value is smaller, performance becomes more satisfactory.

(In-Plane Uniformity of Film Thickness (FT Plane Average))

The film thickness of the wafer before the exposure after coating was measured at 200 points in the wafer in-plane, and the standard deviation was calculated as a ratio (%) to the coating film thickness. It is exhibited that, as the value is smaller, performance becomes more satisfactory.

TABLE 5

| | | | | | | | (EUV) | | | |
|---|---|---|---|---|---|---|---|---|---|---|
| Example | Resist composition | Film thickness (nm) | PB (60 seconds) | PEB (60 seconds) | Development | Rinse | Trench resolution (nm) | Sensitivity ($mJ/cm^2$) | CDU (nm) | FT plane average (%) | TWR (nm) |
| 1-1 | Ex-1 | 60 | 120° C. | 90° C. | DR-1 | None | 12 | 24 | 0.6 | 0.1 | 3.8 |
| 1-2 | Ex-2 | 43 | 110° C. | 110° C. | DR-2 | None | 16 | 14 | 0.8 | 0.3 | 4.4 |
| 1-3 | Ex-3 | 54 | 100° C. | 110° C. | DR-3 | DR-14 | 20 | 28 | 0.6 | 0.2 | 4.4 |

TABLE 5-continued (EUV)

| Example | Resist composition | Film thickness (nm) | PB (60 seconds) | PEB (60 seconds) | Development | Rinse | Trench resolution (nm) | Sensitivity (mJ/cm$^2$) | CDU (nm) | FT plane average (%) | TWR (nm) |
| --- | --- | --- | --- | --- | --- | --- | --- | --- | --- | --- | --- |
| 1-4 | Ex-4 | 49 | 90° C. | 85° C. | DR-4 | DR-15 | 17 | 16 | 0.8 | 0.1 | 4.2 |
| 1-5 | Ex-5 | 43 | 130° C. | 110° C. | DR-5 | DR-16 | 20 | 33 | 0.6 | 0.2 | 4.1 |
| 1-6 | Ex-6 | 33 | 120° C. | 120° C. | DR-6 | DR-17 | 13 | 15 | 0.9 | 0.2 | 3.8 |
| 1-7 | Ex-7 | 23 | 110° C. | 100° C. | DR-7 | None | 15 | 29 | 0.9 | 0.3 | 4.4 |
| 1-8 | Ex-8 | 16 | 100° C. | 110° C. | DR-8 | DR-14 | 16 | 12 | 0.9 | 0.3 | 4.2 |
| 1-9 | Ex-9 | 8 | 90° C. | 110° C. | DR-9 | DR-15 | 18 | 32 | 0.7 | 0.1 | 3.8 |
| 1-10 | Ex-10 | 72 | 130° C. | 110° C. | DR-10 | DR-13 | 19 | 6 | 0.5 | 0.2 | 3.7 |
| 1-11 | Ex-11 | 102 | 120° C. | 130° C. | DR-11 | DR-17 | 17 | 21 | 0.8 | 0.2 | 4.0 |
| 1-12 | Ex-12 | 66 | 110° C. | 110° C. | DR-2 | None | 19 | 8 | 0.8 | 0.1 | 4.0 |
| 1-13 | Ex-13 | 96 | 100° C. | 110° C. | DR-1 | DR-14 | 11 | 31 | 0.9 | 0.3 | 3.6 |
| 1-14 | Ex-14 | 66 | 120° C. | 90° C. | DR-1 | DR-15 | 14 | 14 | 0.7 | 0.1 | 3.9 |
| 1-15 | Ex-15 | 60 | 110° C. | 90° C. | DR-2 | None | 11 | 19 | 1.0 | 0.1 | 4.3 |
| 1-16 | Ex-16 | 66 | 100° C. | 90° C. | DR-1 | None | 20 | 7 | 0.6 | 0.1 | 3.7 |
| 1-17 | Ex-17 | 46 | 90° C. | 85° C. | DR-2 | DR-1 | 16 | 10 | 0.9 | 0.2 | 3.7 |
| 1-18 | Ex-18 | 66 | 130° C. | 110° C. | DR-2 | DR-18 | 11 | 14 | 0.8 | 0.2 | 4.1 |
| 1-19 | Ex-19 | 65 | 120° C. | 120° C. | DR-2 | DR-19 | 16 | 7 | 0.8 | 0.1 | 4.2 |
| 1-20 | Ex-20 | 62 | 110° C. | 100° C. | DR-2 | None | 17 | 6 | 1.0 | 0.2 | 3.8 |
| 1-21 | Ex-21 | 66 | 100° C. | 110° C. | DR-2 | None | 14 | 18 | 0.7 | 0.3 | 3.0 |
| 1-22 | Ex-22 | 66 | 90° C. | 110° C. | DR-2 | None | 10 | 15 | 0.9 | 0.2 | 3.3 |
| 1-23 | Ex-23 | 66 | 130° C. | 110° C. | DR-2 | None | 13 | 10 | 0.7 | 0.2 | 2.3 |
| 1-24 | Ex-24 | 77 | 120° C. | 110° C. | DR-2 | None | 12 | 7 | 0.7 | 0.1 | 2.6 |
| 1-25 | Ex-25 | 58 | 110° C. | 130° C. | DR-2 | DR-14 | 10 | 7 | 0.7 | 0.2 | 2.0 |
| 1-26 | Ex-26 | 65 | 100° C. | 130° C. | DR-2 | DR-15 | 18 | 26 | 0.6 | 0.2 | 3.6 |
| 1-27 | Ex-27 | 84 | 90° C. | 85° C. | DR-2 | None | 11 | 11 | 0.6 | 0.1 | 2.5 |
| 1-28 | Ex-28 | 74 | 130° C. | 90° C. | DR-3 | DR-14 | 20 | 33 | 0.8 | 0.3 | 2.1 |
| 1-29 | Ex-29 | 77 | 120° C. | 110° C. | DR-4 | DR-15 | 14 | 24 | 0.9 | 0.2 | 3.5 |
| 1-30 | Ex-30 | 84 | 110° C. | 90° C. | DR-5 | DR-16 | 16 | 31 | 0.7 | 0.3 | 3.0 |
| 1-31 | Ex-31 | 88 | 100° C. | 90° C. | DR-9 | DR-17 | 15 | 31 | 1.0 | 0.2 | 3.4 |
| 1-32 | Ex-32 | 93 | 90° C. | 90° C. | DR-10 | DR-18 | 11 | 22 | 1.0 | 0.2 | 2.7 |
| 1-33 | Ex-33 | 121 | 130° C. | 90° C. | DR-9 | DR-19 | 20 | 26 | 1.0 | 0.2 | 2.7 |
| 1-34 | Ex-34 | 74 | 120° C. | 90° C. | DR-10 | None | 13 | 30 | 0.6 | 0.1 | 2.1 |
| 1-35 | Ex-35 | 77 | 120° C. | 90° C. | DR-4 | None | 17 | 22 | 0.7 | 0.2 | 3.0 |
| 1-36 | Ex-36 | 84 | 120° C. | 90° C. | DR-5 | None | 14 | 25 | 0.7 | 0.1 | 3.2 |
| 1-37 | Ex-37 | 89 | 120° C. | 90° C. | DR-9 | None | 11 | 31 | 0.6 | 0.2 | 3.1 |
| 1-38 | Ex-38 | 95 | 120° C. | 85° C. | DR-10 | None | 12 | 25 | 0.9 | 0.1 | 2.9 |
| 1-39 | Ex-39 | 100 | 120° C. | 90° C. | DR-9 | None | 11 | 31 | 0.9 | 0.5 | 2.5 |
| 1-40 | Ex-40 | 75 | 120° C. | 110° C. | DR-1 | DR-12 | 18 | 32 | 0.7 | 0.6 | 3.5 |
| 1-41 | Ex-41 | 125 | 120° C. | 95° C. | DR-1 | None | 21 | 49 | 1.6 | 0.7 | 5.1 |
| 1-42 | Ex-42 | 114 | 120° C. | 95° C. | DR-1 | DR-14 | 21 | 49 | 1.6 | 0.5 | 5.4 |
| 1-43 | Ex-43 | 96 | 120° C. | 90° C. | DR-1 | DR-15 | 23 | 44 | 2.0 | 0.1 | 4.8 |
| 1-44 | Ex-44 | 88 | 120° C. | 90° C. | DR-1 | None | 24 | 55 | 2.0 | 0.1 | 5.9 |
| 1-45 | Ex-45 | 93 | 130° C. | 110° C. | DR-1 | None | 22 | 49 | 1.8 | 0.1 | 5.8 |
| 1-46 | Ex-46 | 129 | 100° C. | 130° C. | DR-2 | DR-15 | 33 | 26 | 0.7 | 0.6 | 3.9 |
| 1-47 | Ex-47 | 112 | 100° C. | 130° C. | DR-2 | DR-15 | 28 | 29 | 0.6 | 0.6 | 4.4 |
| 1-48 | Ex-48 | 95 | 100° C. | 130° C. | DR-2 | DR-15 | 25 | 21 | 0.6 | 0.1 | 4.4 |
| 1-49 | Ex-49 | 19 | 100° C. | 130° C. | DR-2 | DR-15 | 20 | 27 | 0.6 | 0.1 | 4.2 |
| 1-50 | Ex-26 | 229 | 100° C. | 130° C. | DR-20 | DR-21 | 22 | 35 | 0.8 | 0.2 | 3.9 |
| 1-51 | Ex-50 | 35 | 120° C. | 90° C. | DR-1 | None | 12 | 18 | 1.0 | 0.2 | 3.8 |
| 1-52 | Ex-51 | 35 | 120° C. | 90° C. | DR-1 | None | 14 | 25 | 1.2 | 0.4 | 4.2 |
| 1-53 | Ex-52 | 35 | 120° C. | 90° C. | DR-1 | None | 10 | 18 | 0.9 | 0.2 | 2.4 |
| 1-54 | Ex-53 | 35 | 120° C. | 90° C. | DR-1 | None | 22 | 50 | 1.8 | 0.7 | 5.4 |
| 1-55 | Ex-54 | 35 | 120° C. | 90° C. | DR-1 | None | 10 | 18 | 0.9 | 0.2 | 2.1 |
| 1-56 | Ex-55 | 100 | 120° C. | 90° C. | DR-1 | None | 25 | 25 | 1.6 | 0.6 | 4.8 |
| 1-57 | Ex-56 | 35 | 120° C. | 90° C. | DR-1 | None | 18 | 21 | 1.2 | 0.4 | 4.2 |
| Comparative Example 1a-1 | Re-1 | 294 | 100° C. | 110° C. | SA-8 | SA-9 | 35 | 68 | 2.6 | 1.3 | 8.2 |
| Comparative Example 1a-2 | Re-2 | 194 | 100° C. | 110° C. | SA-8 | SA-3 | 45 | 69 | 2.3 | 1.4 | 8.1 |
| Comparative Example 1a-3 | Re-3 | 175 | 100° C. | 110° C. | SA-8 | SA-4 | 38 | 72 | 2.7 | 1.4 | 6.9 |
| Comparative Example 1a-4 | Re-4 | 155 | 100° C. | 110° C. | SA-8 | SA-6 | 46 | 77 | 2.7 | 1.2 | 7.0 |
| Comparative Example 1a-5 | Re-5 | 80 | 100° C. | 110° C. | SA-1 | SA-6 | 33 | 59 | 2.6 | 1.8 | 8.4 |

TABLE 5-continued (EUV)

| Example | Resist composition | Film thickness (nm) | PB (60 seconds) | PEB (60 seconds) | Development | Rinse | Trench resolution (nm) | Sensitivity (mJ/cm$^2$) | CDU (nm) | FT plane average (%) | TWR (nm) |
|---|---|---|---|---|---|---|---|---|---|---|---|
| Comparative Example 1a-6 | Re-6 | 125 | 100° C. | 110° C. | SA-2 | SA-9 | 35 | 76 | 2.4 | 1.2 | 6.5 |
| Comparative Example 1a-7 | Re-7 | 35 | 120° C. | 90° C. | DR-1 | None | 35 | 76 | 2.8 | 1.4 | 7.9 |

Example 2: EB Exposure

A pattern was formed in the same method as in Example 1 of EUV exposure except that the points described below were changed, and the evaluation was performed by the same method.

That is, by using an electron beam irradiation device (JBX6000FS/E manufactured by JEOL Corporation, accelerating voltage: 50 keV) instead of an EUV exposure device, irradiation was performed with an electron beam having a beam diameter of 5 nm by changing the exposure amount so as to form a 30 nm trench pattern, Was changed and irradiated.

The evaluation results are provided in Table 6.

TABLE 6

(EB)

| Example | Resist composition | Film thickness (nm) | PB (60 seconds) | PEB (60 seconds) | Development | Rinse | Trench resolution (nm) | Sensitivity (uC/cm$^2$) | CDU (nm) | FT plane average (%) | TWR (nm) |
|---|---|---|---|---|---|---|---|---|---|---|---|
| 2-1 | Ex-1 | 60 | 120° C. | 90° C. | DR-1 | None | 16 | 153 | 0.8 | 0.1 | 4.4 |
| 2-2 | Ex-2 | 43 | 110° C. | 110° C. | DR-2 | None | 15 | 46 | 1.0 | 0.1 | 3.6 |
| 2-3 | Ex-3 | 54 | 100° C. | 110° C. | DR-3 | DR-14 | 18 | 156 | 1.0 | 0.2 | 4.0 |
| 2-4 | Ex-4 | 49 | 90° C. | 85° C. | DR-4 | DR-15 | 18 | 89 | 1.0 | 0.2 | 4.0 |
| 2-5 | Ex-5 | 43 | 130° C. | 110° C. | DR-5 | DR-16 | 16 | 149 | 1.0 | 0.1 | 4.3 |
| 2-6 | Ex-6 | 33 | 120° C. | 120° C. | DR-6 | DR-17 | 12 | 39 | 0.9 | 0.1 | 4.0 |
| 2-7 | Ex-7 | 23 | 110° C. | 100° C. | DR-7 | None | 18 | 136 | 0.9 | 0.2 | 3.6 |
| 2-8 | Ex-8 | 16 | 100° C. | 110° C. | DR-8 | DR-14 | 18 | 65 | 0.8 | 0.1 | 4.1 |
| 2-9 | Ex-9 | 8 | 90° C. | 110° C. | DR-9 | DR-15 | 13 | 107 | 0.9 | 0.2 | 4.1 |
| 2-10 | Ex-10 | 65 | 130° C. | 110° C. | DR-10 | DR-13 | 18 | 54 | 1.0 | 0.2 | 3.8 |
| 2-11 | Ex-11 | 65 | 120° C. | 130° C. | DR-11 | DR-17 | 11 | 136 | 1.0 | 0.3 | 4.0 |
| 2-12 | Ex-12 | 66 | 110° C. | 110° C. | DR-2 | None | 18 | 87 | 0.8 | 0.3 | 3.8 |
| 2-13 | Ex-13 | 80 | 100° C. | 110° C. | DR-1 | DR-14 | 12 | 117 | 0.6 | 0.1 | 4.0 |
| 2-14 | Ex-14 | 66 | 120° C. | 90° C. | DR-1 | DR-15 | 11 | 66 | 0.8 | 0.3 | 4.3 |
| 2-15 | Ex-15 | 43 | 110° C. | 90° C. | DR-2 | None | 17 | 29 | 1.0 | 0.1 | 3.6 |
| 2-16 | Ex-16 | 66 | 100° C. | 90° C. | DR-1 | None | 14 | 83 | 0.6 | 0.2 | 3.6 |
| 2-17 | Ex-17 | 66 | 90° C. | 85° C. | DR-2 | DR-1 | 13 | 61 | 0.8 | 0.1 | 4.4 |
| 2-18 | Ex-18 | 66 | 130° C. | 110° C. | DR-2 | DR-18 | 11 | 32 | 0.8 | 0.1 | 3.9 |
| 2-19 | Ex-19 | 65 | 120° C. | 120° C. | DR-2 | DR-19 | 15 | 81 | 0.6 | 0.1 | 4.0 |
| 2-20 | Ex-20 | 62 | 110° C. | 100° C. | DR-2 | None | 14 | 90 | 0.6 | 0.2 | 4.2 |
| 2-21 | Ex-21 | 66 | 100° C. | 110° C. | DR-2 | None | 13 | 85 | 0.6 | 0.1 | 2.3 |
| 2-22 | Ex-22 | 66 | 90° C. | 110° C. | DR-2 | None | 20 | 43 | 0.6 | 0.2 | 2.5 |
| 2-23 | Ex-23 | 66 | 130° C. | 110° C. | DR-2 | None | 18 | 90 | 0.7 | 0.1 | 2.2 |
| 2-24 | Ex-24 | 66 | 120° C. | 110° C. | DR-2 | None | 18 | 71 | 0.7 | 0.2 | 3.4 |
| 2-25 | Ex-25 | 64 | 110° C. | 130° C. | DR-2 | DR-14 | 18 | 89 | 0.6 | 0.2 | 2.0 |
| 2-26 | Ex-26 | 65 | 100° C. | 130° C. | DR-2 | DR-15 | 19 | 113 | 0.8 | 0.1 | 3.6 |
| 2-27 | Ex-27 | 80 | 90° C. | 85° C. | DR-2 | None | 18 | 36 | 0.7 | 0.1 | 2.7 |
| 2-28 | Ex-28 | 74 | 130° C. | 90° C. | DR-3 | DR-14 | 14 | 132 | 0.6 | 0.2 | 2.9 |
| 2-29 | Ex-29 | 77 | 120° C. | 110° C. | DR-4 | DR-15 | 17 | 163 | 0.9 | 0.1 | 2.2 |
| 2-30 | Ex-30 | 80 | 110° C. | 90° C. | DR-5 | DR-16 | 17 | 129 | 0.8 | 0.2 | 3.1 |
| 2-31 | Ex-31 | 80 | 100° C. | 90° C. | DR-9 | DR-17 | 15 | 116 | 0.9 | 0.2 | 2.7 |
| 2-32 | Ex-32 | 65 | 90° C. | 90° C. | DR-10 | DR-18 | 13 | 136 | 1.0 | 0.2 | 2.4 |
| 2-33 | Ex-33 | 60 | 130° C. | 90° C. | DR-9 | DR-19 | 10 | 168 | 0.8 | 0.1 | 3.1 |
| 2-34 | Ex-34 | 74 | 120° C. | 90° C. | DR-10 | None | 14 | 122 | 0.7 | 0.1 | 3.1 |
| 2-35 | Ex-35 | 77 | 120° C. | 90° C. | DR-4 | None | 15 | 139 | 0.7 | 0.1 | 3.2 |
| 2-36 | Ex-36 | 75 | 120° C. | 90° C. | DR-5 | None | 13 | 119 | 0.9 | 0.1 | 3.2 |
| 2-37 | Ex-37 | 80 | 120° C. | 90° C. | DR-9 | None | 15 | 111 | 0.6 | 0.2 | 2.9 |
| 2-38 | Ex-38 | 74 | 120° C. | 85° C. | DR-10 | None | 15 | 166 | 0.9 | 0.2 | 3.4 |
| 2-39 | Ex-39 | 100 | 120° C. | 90° C. | DR-9 | None | 15 | 148 | 0.5 | 0.7 | 2.1 |
| 2-40 | Ex-40 | 100 | 120° C. | 110° C. | DR-1 | DR-12 | 11 | 133 | 0.8 | 0.7 | 4.5 |
| 2-41 | Ex-41 | 100 | 120° C. | 95° C. | DR-1 | None | 25 | 243 | 1.9 | 0.5 | 5.6 |
| 2-42 | Ex-42 | 90 | 120° C. | 95° C. | DR-1 | DR-14 | 24 | 239 | 1.6 | 0.6 | 5.5 |
| 2-43 | Ex-43 | 85 | 120° C. | 90° C. | DR-1 | DR-15 | 25 | 205 | 1.8 | 0.2 | 5.1 |
| 2-44 | Ex-44 | 75 | 120° C. | 90° C. | DR-1 | None | 21 | 220 | 1.7 | 0.1 | 4.6 |
| 2-45 | Ex-45 | 80 | 130° C. | 110° C. | DR-1 | None | 21 | 234 | 1.8 | 0.1 | 5.0 |
| 2-46 | Ex-46 | 100 | 100° C. | 130° C. | DR-2 | DR-15 | 35 | 120 | 0.6 | 0.5 | 4.1 |

TABLE 6-continued (EB)

| Example | Resist composition | Film thickness (nm) | PB (60 seconds) | PEB (60 seconds) | Development | Rinse | Trench resolution (nm) | Sensitivity (uC/cm$^2$) | CDU (nm) | FT plane average (%) | TWR (nm) |
|---|---|---|---|---|---|---|---|---|---|---|---|
| 2-47 | Ex-47 | 95 | 100° C. | 130° C. | DR-2 | DR-15 | 30 | 139 | 0.6 | 0.6 | 4.4 |
| 2-48 | Ex-48 | 80 | 100° C. | 130° C. | DR-2 | DR-15 | 26 | 150 | 0.7 | 0.1 | 3.8 |
| 2-49 | Ex-49 | 19 | 100° C. | 130° C. | DR-2 | DR-15 | 23 | 136 | 0.6 | 0.1 | 3.9 |
| 2-50 | Ex-26 | 55 | 100° C. | 130° C. | DR-20 | DR-21 | 24 | 170 | 1.0 | 0.1 | 4.3 |
| 2-51 | Ex-50 | 35 | 120° C. | 90° C. | DR-1 | None | 13 | 76 | 1.2 | 0.1 | 4.0 |
| 2-52 | Ex-51 | 35 | 120° C. | 90° C. | DR-1 | None | 15 | 105 | 1.5 | 0.2 | 4.3 |
| 2-53 | Ex-52 | 35 | 120° C. | 90° C. | DR-1 | None | 11 | 76 | 1.0 | 0.1 | 2.4 |
| 2-54 | Ex-53 | 35 | 120° C. | 90° C. | DR-1 | None | 21 | 210 | 1.8 | 0.6 | 5.4 |
| 2-55 | Ex-54 | 35 | 120° C. | 90° C. | DR-1 | None | 11 | 76 | 0.9 | 0.1 | 2.2 |
| 2-56 | Ex-55 | 100 | 120° C. | 90° C. | DR-1 | None | 22 | 100 | 1.5 | 0.5 | 4.6 |
| 2-57 | Ex-56 | 35 | 120° C. | 90° C. | DR-1 | None | 17 | 88 | 1.3 | 0.3 | 4.3 |
| Comparative Example 2a-1 | Re-1 | 229 | 100° C. | 110° C. | SA-8 | SA-9 | 48 | 334 | 2.7 | 1.0 | 7.6 |
| Comparative Example 2a-2 | Re-2 | 234 | 100° C. | 110° C. | SA-8 | SA-3 | 40 | 391 | 3.0 | 1.3 | 7.0 |
| Comparative Example 2a-3 | Re-3 | 294 | 100° C. | 110° C. | SA-8 | SA-4 | 39 | 330 | 2.1 | 1.1 | 8.1 |
| Comparative Example 2a-4 | Re-4 | 194 | 100° C. | 110° C. | SA-8 | SA-6 | 42 | 368 | 2.8 | 1.3 | 8.4 |
| Comparative Example 2a-5 | Re-5 | 80 | 100° C. | 110° C. | SA-1 | SA-6 | 35 | 337 | 2.1 | 1.6 | 8.3 |
| Comparative Example 2a-6 | Re-6 | 125 | 100° C. | 110° C. | SA-2 | SA-9 | 37 | 364 | 2.3 | 1.2 | 7.9 |
| Comparative Example 2a-7 | Re-7 | 35 | 120° C. | 90° C. | DR-1 | None | 34 | 320 | 2.6 | 1.3 | 8.2 |

Example 3: ArF Exposure

A pattern was formed in the same method as in Example 1 of EUV exposure except that the points described below were changed, and the evaluation was performed by the same method.

That is, a silicon wafer was coated with an organic antireflection film ARC29SR (manufactured by Brewer Science, Inc.) and baked at 205° C. for 60 seconds to form an antireflection film having a film thickness of 86 nm, a resist film was formed thereon, and exposure was performed.

Exposure was performed by using an ArF excimer laser immersion scanner (manufactured by ASML Netherlands B.V.; XT1700i, NA1.20, Annular, outer sigma 0.67, inner sigma 0.34) instead of the EUV exposure device. ArF exposure was performed by changing the exposure amount via a mask including a pattern for forming a 50 nm trench pattern. As the immersion liquid, ultrapure water was used.

The evaluation results are provided in Table 7.

What is claimed is:

1. An actinic ray-sensitive or radiation-sensitive resin composition comprising:

(A) a resin including a repeating unit (a) represented by Formula (1), a repeating unit (b) represented by Formula (A1-1) below having an acid-decomposable group in which a protective group leaves due to an action of an acid to generate a polar group, and any one of a repeating unit (c) represented by Formula (A2) below or a repeating unit (d) represented by Formula (A3) below;

(B) a compound that generates an acid by irradiation with actinic rays or radiation; and (C) an organic solvent, wherein the concentration of solid contents of the composition is 4 mass % or less,

TABLE 7

(ArF)

| | Resist composition | Film thickness (nm) | PB (60 seconds) | PEB (60 seconds) | Development | Rinse | Trench resolution (nm) | Sensitivity (mJ/cm$^2$) | CDU (nm) | FT plane average (%) | TWR (nm) |
|---|---|---|---|---|---|---|---|---|---|---|---|
| Example 3-1 | Ex-40 | 75 | 120° C. | 110° C. | DR-1 | DR-12 | 40 | 20 | 0.8 | 0.6 | 4.5 |
| Comparative Example 3a-1 | Re-1 | 294 | 100° C. | 110° C. | SA-8 | SA-9 | 70 | 40 | 2.9 | 1.1 | 8.2 |

Formula (1) is as follows;

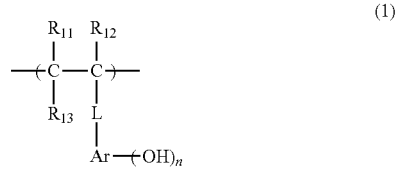

in Formula (1), $R_{11}$ and $R_{12}$ each independently represents a hydrogen atom, a halogen atom, or a monovalent organic group, $R_{13}$ represents a hydrogen atom, a halogen atom, or a monovalent organic group or is a single bond or an alkylene group, and is bonded to L or Ar in the formula to form a ring, L represents a single bond or a divalent linking group, Ar represents an aromatic ring group, and n represents an integer of 2 or more, Formula (A1-1) is as follows:

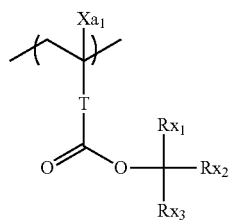

in Formula (A1-1), $Xa_1$ represents a hydrogen atom or an alkyl group,

T represents a single bond or a divalent linking group, two of $Rx_1$, $Rx_2$ and $Rx_3$ are bonded to each other to form a cycloalkyl group, and a remaining group represents an alkyl group, a cycloalkyl group, or a phenyl group, and $Rx_1$, $Rx_2$, and $Rx_3$ each only includes carbon atoms and hydrogen atoms, and the total number of carbon atoms included in $Rx_1$, $Rx_2$, and $Rx_3$ is 4 to 11, and Formulas (A2) and (A3) are as follows:

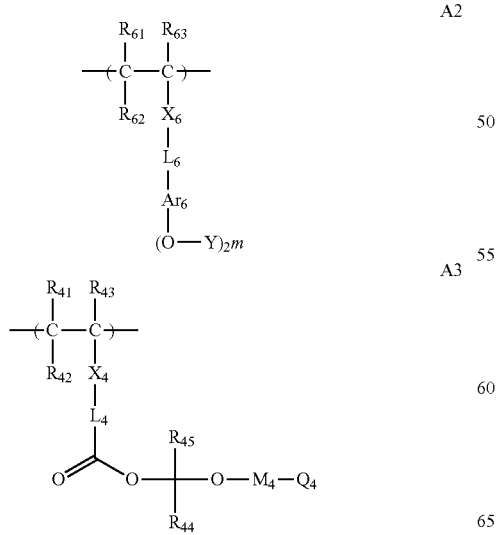

in Formula (A2), $R_{61}$, $R_{62}$, and $R_{63}$ each independently represents a hydrogen atom, an alkyl group, a cycloalkyl group, a halogen atom, a cyano group, or an alkoxycarbonyl group, here, $R_{62}$ may be bonded to $Ar_6$ or $L_6$ to form a ring, and $R_{62}$ in this case represents a single bond or an alkylene group, $X_6$ represents a single bond, —COO—, or —$CONR_{64}$—, and $R_{64}$ represents a hydrogen atom or an alkyl group, $L_6$ represents a single bond or a divalent linking group, and in a case of forming a ring with $R_{62}$, $L_6$ represents a trivalent linking group, $Ar_6$ represents a (m+1)-valent aromatic ring group, and in a case where $Ar_6$ is bonded to $R_{62}$ to form a ring, $Ar_6$ represents a (m+2)-valent aromatic ring group, $Y_2$ represents a hydrogen atom or a group that leaves by an action of an acid, and in a case where m≥2, a plurality of $Y_2$'s may be identical to or different from each other, here, at least one of $Y_2$'s represents a group that leaves due to an action of an acid, and m represents an integer of 1 to 4, in Formula (A3), $R_{41}$, $R_{42}$, and $R_{43}$ each independently represents a hydrogen atom, an alkyl group, a cycloalkyl group, a halogen atom, a cyano group, or an alkoxycarbonyl group, $R_{42}$ may be bonded to $L_4$ to form a ring, and $R_{42}$ in this case represents an alkylene group, $X_4$ represents a single bond, —COO—, or —$CONR_{44}$—, and $R_{44}$ represents a hydrogen atom or an alkyl group, $L_4$ represents a single bond or a divalent linking group, and in a case of forming a ring with $R_{42}$, $L_4$ represents a trivalent linking group, $R_{44}$ and $R_{45}$ represent a hydrogen atom, an alkyl group, a cycloalkyl group, an aryl group, an aralkyl group, an alkoxy group, an acyl group, or a heterocyclic group, $M_4$ represents a single bond or a divalent linking group, $Q_4$ represents an alkyl group, a cycloalkyl group, an aryl group, or a heterocyclic group, and at least two of $Q_4$, $M_4$, or $R_{44}$ may be bonded to each other to form a ring.

2. The actinic ray-sensitive or radiation-sensitive resin composition according to claim 1, wherein the resin (A) further contains a repeating unit (e) having a lactone structure.

3. The actinic ray-sensitive or radiation-sensitive resin composition according to claim 2, wherein a repeating unit having a lactone structure represented by Formula (AII) is contained as the repeating unit (e),

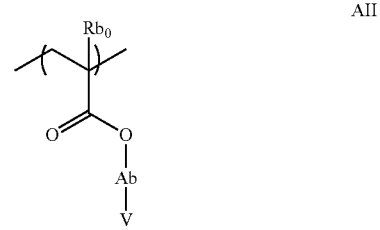

in Formula (AII), $Rb_0$ represents a hydrogen atom, a halogen atom, or an alkyl group having 1 to 4 carbon atoms, Ab represents a single bond, an alkylene group, a divalent linking group having a monocyclic or polycyclic alicyclic hydrocarbon structure, an ether bond, an ester bond, a carbonyl group, a carboxyl group, or a divalent group obtained by combining these, and
V represents a group represented by any one of Formulae (LC1-1) to (LC1-17),
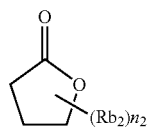
LC1-1
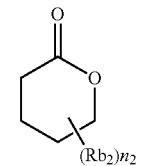
LC1-2
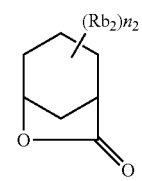
LC1-3
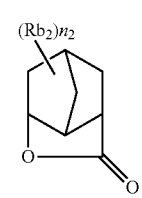
LC1-4
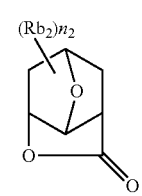
LC1-5
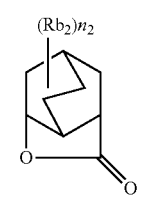
LC1-6
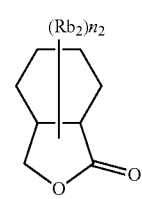
LC1-7
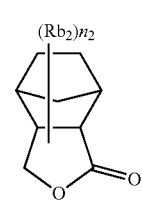
LC1-8
-continued
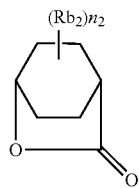
LC1-9
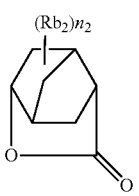
LC1-10
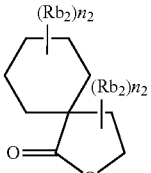
LC1-11
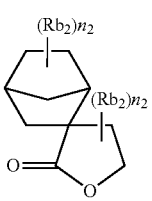
LC1-12
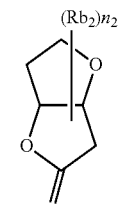
LC1-13
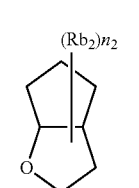
LC1-14
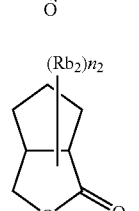
LC1-15
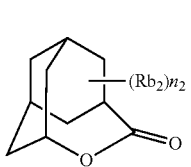
LC1-16

-continued

LC1-17

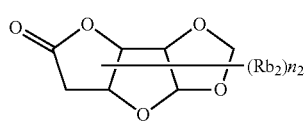

in Formulae (LC1-1) to (LC1-17), $Rb_2$ represents an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, or an acid-decomposable group, $n_2$ represents an integer of 0 to 4, and in a case where $n_2$ is 2 or more, a plurality of $Rb_2$'s may be identical to or different from each other, and the plurality of $Rb_2$'s which are present may be bonded to each other to form a ring.

4. The actinic ray-sensitive or radiation-sensitive resin composition according to claim 1,
wherein the concentration of solid contents is from 0.3 mass % to 4 mass %.

5. A pattern forming method comprising:
forming actinic ray-sensitive or radiation-sensitive film including the actinic ray-sensitive or radiation-sensitive resin composition according to claim 1;
exposing the actinic ray-sensitive or radiation-sensitive film; and
developing the actinic ray-sensitive or radiation-sensitive film after exposure.

6. The pattern forming method according to claim 5,
wherein a film thickness of the actinic ray-sensitive or radiation-sensitive film before exposure is 5 to 80 nm.

7. A method of manufacturing an electronic device comprising:
the pattern forming method according to claim 5.

8. The actinic ray-sensitive or radiation-sensitive resin composition according to claim 1,
wherein T in Formula (A1-1) is a single bond.

9. The actinic ray-sensitive or radiation-sensitive resin composition according to claim 1,
wherein T in Formula (A1-1) is an arylene group.

10. The actinic ray-sensitive or radiation-sensitive resin composition according to claim 1,
wherein the compound (B) is represented by Formula (ZI),

(ZI)

in Formula (ZI),
$R_{201}$, $R_{202}$, and $R_{203}$ each independently represents an organic group, provided that two of $R_{201}$ to $R_{203}$ may be bonded to each other to form a ring structure and may contain an oxygen atom, a sulfur atom, an ester bond, an amide bond, or a carbonyl group in the ring, and $Z^-$ represents a non-nucleophilic anion represented by Formula (AN1),

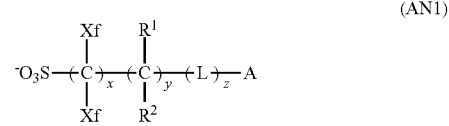

(AN1)

in Formula (AN1),
each Xf independently represents a fluorine atom or an alkyl group substituted with at least one fluorine atom, $R^1$ and $R^2$ each independently represents a hydrogen atom, a fluorine atom, or an alkyl group, $R^1$'s and $R^2$'s in a case where a plurality thereof are present may be identical to or different from each other, respectively, L represents a divalent linking group, and L's in a case where a plurality thereof are present may be identical to or different from each other, A represents a cyclic organic group, x represents an integer of 1 to 20, y represents an integer of 0 to 10, and z represents an integer of 0 to 10.

11. The actinic ray-sensitive or radiation-sensitive resin composition according to claim 1,
wherein the concentration of solid contents of the composition is 2.5 mass % or less.

* * * * *